(12) United States Patent
Park et al.

(10) Patent No.: US 12,490,466 B2
(45) Date of Patent: Dec. 2, 2025

(54) SEMICONDUCTOR DEVICE

(71) Applicant: SAMSUNG ELECTRONICS CO., LTD., Suwon-si (KR)

(72) Inventors: Junmo Park, Seoul (KR); Yeonho Park, Seoul (KR); WookHyun Kwon, Yongin-si (KR); Kern Rim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 446 days.

(21) Appl. No.: 17/966,375

(22) Filed: Oct. 14, 2022

(65) Prior Publication Data

US 2023/0238441 A1 Jul. 27, 2023

(30) Foreign Application Priority Data

Jan. 27, 2022 (KR) ........................ 10-2022-0012711

(51) Int. Cl.
| | |
|---|---|
| *H10D 30/67* | (2025.01) |
| *H01L 23/522* | (2006.01) |
| *H01L 23/528* | (2006.01) |
| *H10D 30/43* | (2025.01) |

(Continued)

(52) U.S. Cl.
CPC ..... *H10D 30/6735* (2025.01); *H01L 23/5226* (2013.01); *H01L 23/5283* (2013.01);
(Continued)

(58) Field of Classification Search
CPC .......... H10D 30/6735; H10D 30/6739; H10D 84/85; H10D 30/43; H10D 30/6757; H10D 62/121; H10D 30/797; H10D 30/014; H10D 64/017; H10D 62/822; H10D 64/62; H10D 62/151; H10D 64/256; H10D 84/038; H10D 84/0177; H10D 84/0165; H10D 84/0172; H10D 64/519; H10D 84/0167;
(Continued)

(56) References Cited

U.S. PATENT DOCUMENTS

| | | |
|---|---|---|
| 9,997,519 B1 | 6/2018 | Bao et al. |
| 10,103,065 B1 | 10/2018 | Mochizuki et al. |

(Continued)

FOREIGN PATENT DOCUMENTS

| | | |
|---|---|---|
| KR | 10-2021-0077064 A | 6/2021 |
| KR | 10-2023-0033120 A | 3/2023 |

*Primary Examiner* — Mohammad A Rahman
(74) *Attorney, Agent, or Firm* — Sughrue Mion, PLLC

(57) ABSTRACT

A semiconductor device may include a substrate including first and second active regions, which are adjacent to each other, first and second active patterns provided on the first and second active regions, respectively, and a gate electrode extended to cross the first and second active patterns. The gate electrode may include first and second electrode portions provided on the first and second active regions, respectively. The second electrode portion may include a first metal pattern, an etch barrier pattern, a second metal pattern, and a third metal pattern sequentially covering the second active pattern. The first electrode portion may include a second metal pattern covering the first active pattern. The etch barrier pattern may be in contact with the first metal pattern and the second metal pattern, and the etch barrier pattern may be thinner than the first metal pattern and thinner than the second metal pattern.

20 Claims, 80 Drawing Sheets

(51) Int. Cl.
*H10D 62/10* (2025.01)
*H10D 84/85* (2025.01)

(52) U.S. Cl.
CPC ......... *H10D 30/6739* (2025.01); *H10D 84/85* (2025.01); *H10D 30/43* (2025.01); *H10D 30/6757* (2025.01); *H10D 62/121* (2025.01)

(58) Field of Classification Search
CPC ............ H10D 84/0188; H01L 23/5226; H01L 23/5283; B82Y 10/00
See application file for complete search history.

(56) References Cited

U.S. PATENT DOCUMENTS

| | | |
|---|---|---|
| 10,177,041 B2 | 1/2019 | Xie et al. |
| 10,410,933 B2 | 9/2019 | Xie et al. |
| 10,566,245 B2 | 2/2020 | Kwon et al. |
| 10,573,521 B2 | 2/2020 | Wang et al. |
| 10,727,067 B2 | 7/2020 | Zang et al. |
| 10,741,454 B2 | 8/2020 | Guo et al. |
| 11,069,580 B2 | 7/2021 | Mun et al. |
| 11,121,131 B2 | 9/2021 | Lee et al. |
| 2018/0308767 A1 | 10/2018 | Mochizuki et al. |
| 2020/0312844 A1 | 10/2020 | Jeon et al. |
| 2020/0411387 A1 | 12/2020 | Chiang et al. |
| 2021/0134794 A1 | 5/2021 | Huang et al. |
| 2021/0134950 A1 | 5/2021 | Hsu et al. |
| 2021/0336033 A1 | 10/2021 | Huang et al. |
| 2022/0020691 A1* | 1/2022 | You .................... H10D 84/0193 |
| 2023/0029827 A1 | 2/2023 | Park et al. |
| 2023/0066341 A1 | 3/2023 | Park et al. |

\* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2022-0012711, filed on Jan. 27, 2022, in the Korean Intellectual Property Office, the entire contents of which are hereby incorporated by reference.

BACKGROUND

The present disclosure relates to a semiconductor device, and in particular, to a semiconductor device including a field effect transistor.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high-performance semiconductor devices.

SUMMARY

It is an aspect to provide a semiconductor device with improved electric characteristics.

According to an aspect of one or more embodiments, a semiconductor device may include a substrate including a first active region and a second active region, which are adjacent to each other; a first active pattern and a second active pattern provided on the first active region and the second active region, respectively; and a gate electrode extended to cross the first active pattern and the second active pattern. The gate electrode may include a first electrode portion on the first active region and a second electrode portion on the second active region. The second electrode portion may include a first metal pattern, an etch barrier pattern, a second metal pattern, and a third metal pattern sequentially covering the second active pattern. The first electrode portion may include a second metal pattern covering the first active pattern. The etch barrier pattern may be in contact with the first metal pattern and the second metal pattern, and the etch barrier pattern may be thinner than the first metal pattern and thinner than the second metal pattern.

According to another aspect of one or more embodiments, a semiconductor device may include a substrate including a first active region and a second active region, which are adjacent to each other; a first active pattern and a second active pattern provided on the first active region and the second active region, respectively; a gate electrode extended to cross the first active pattern and the second active pattern; and a gate insulating layer provided between the gate electrode and the first active region and between the gate electrode and the second active region. The gate electrode may include a first electrode portion on the first active region and a second electrode portion on the second active region. The second electrode portion may include a first metal pattern, an etch barrier pattern, and a second metal pattern sequentially covering the second active pattern. The first electrode portion may include a second metal pattern covering the first active pattern. The etch barrier pattern may be in contact with the first metal pattern and the second metal pattern. The etch barrier pattern may be in contact with the gate insulating layer.

According to yet another aspect of one or more embodiments, a semiconductor device may include a substrate including a first active region and a second active region, which are adjacent to each other in a first direction; a device isolation layer filling a trench, which is formed to define the first active region and the second active region; a first active pattern and a second active pattern provided on the first active region and the second active region, respectively; a first source/drain pattern and a second source/drain pattern provided on the first active pattern and the second active pattern, respectively; a first channel pattern and a second channel pattern, which are connected to the first source/drain pattern and the second source/drain pattern, respectively, each of the first channel pattern and the second channel pattern comprising a first semiconductor pattern, a second semiconductor pattern, and a third semiconductor pattern stacked to be spaced apart from each other; a gate electrode extended in the first direction to cross the first channel pattern and the second channel pattern; a gate insulating layer interposed between the gate electrode and the first channel pattern and between the gate electrode and the second channel pattern; a gate spacer provided on side surfaces of the gate electrode; a gate capping pattern provided on a top surface of the gate electrode; a first interlayer insulating layer on the gate capping pattern; active contacts, which penetrate the first interlayer insulating layer and are coupled to the first source/drain pattern and the second source/drain pattern, respectively; a gate contact, which penetrates the first interlayer insulating layer and is coupled to the gate electrode; a second interlayer insulating layer on the first interlayer insulating layer; a first metal layer provided in the second interlayer insulating layer, the first metal layer comprising lower interconnection lines, which are electrically connected to the active contacts and the gate contact, respectively; a third interlayer insulating layer on the second interlayer insulating layer; and a second metal layer provided in the third interlayer insulating layer. The second metal layer may include upper interconnection lines, which are electrically and respectively connected to the lower interconnection lines. The gate electrode may include a first electrode portion on the first active region and a second electrode portion on the second active region. The second electrode portion may include a first metal pattern, an etch barrier pattern, and a second metal pattern sequentially covering the second active pattern. The first electrode portion may include a second metal pattern covering the first active pattern. The etch barrier pattern may be in contact with the first metal pattern and the second metal pattern of the second electrode portion. The etch barrier pattern may be thinner than the first metal pattern and thinner than the second metal pattern of the second electrode portion.

BRIEF DESCRIPTION OF THE DRAWINGS

FIGS. 3A to 14C are sectional views illustrating a method of fabricating a semiconductor device, according to an embodiment.

FIGS. 3A, 4A, 5A, 6A, 7A, 8A, 9A, 10A, 11A, 12A, 13A, and 14A are sectional views taken along the line A-A' of FIG. 1.

FIGS. 5B, 6B, 7B, 8B, 9B, 10B, 111B, 12B, 13B, and 14B are sectional views taken along the line B-B' of FIG. 1.

FIGS. 3B, 4B, 5D, 6D, 7D, 8D, 9C, 10C, 11C, 12C, 13C, and 14C are sectional views taken along the line D-D' of FIG. 1.

FIGS. 16A to 21C are sectional views illustrating a method of fabricating a semiconductor device, according to an embodiment.

FIGS. 16A, 17A, 18A, 19A, 20A, and 21A are sectional views taken along the line A-A' of FIG. 1.

FIGS. 16C, 17C, 18C, 19C, 20C, and 21C are sectional views taken along the line D-D' of FIG. 1.

FIGS. 22A to 29C are sectional views illustrating a method of fabricating a semiconductor device, according to an embodiment.

FIGS. 22A, 23A, 24A, 25A, 26A, 27A, 28A, and 29A are sectional views taken along the line A-A' of FIG. 1.

FIGS. 22C, 23C, 24C, 25C, 26C, 27C, 28C, and 29C are sectional views taken along the line D-D' of FIG. 1.

DETAILED DESCRIPTION

Various example embodiments will now be described more fully with reference to the accompanying drawings, in which example embodiments are shown.

Figure 1:
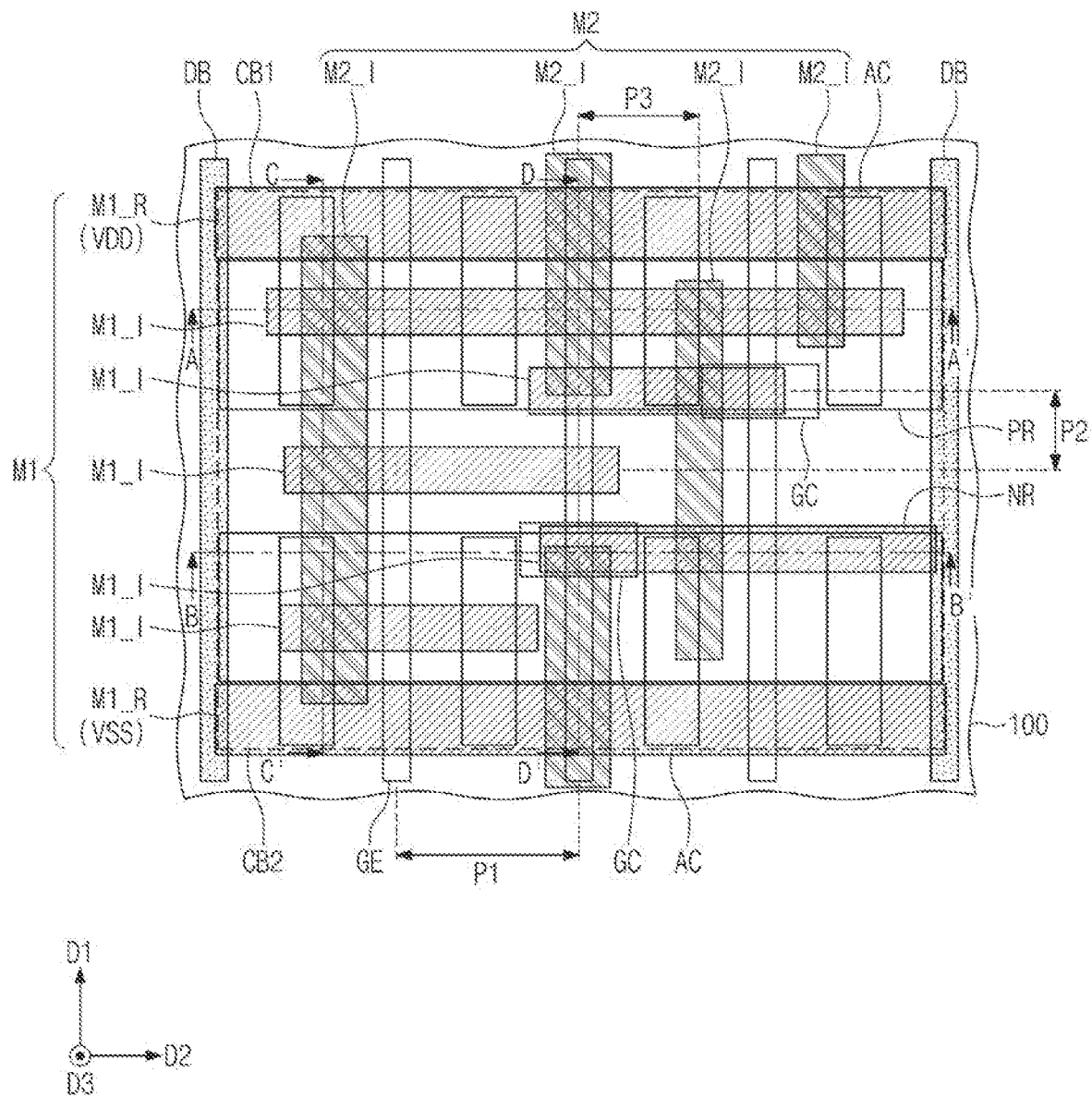
FIG. 1 is a plan view illustrating a semiconductor device according to an embodiment.
Figure 2A:
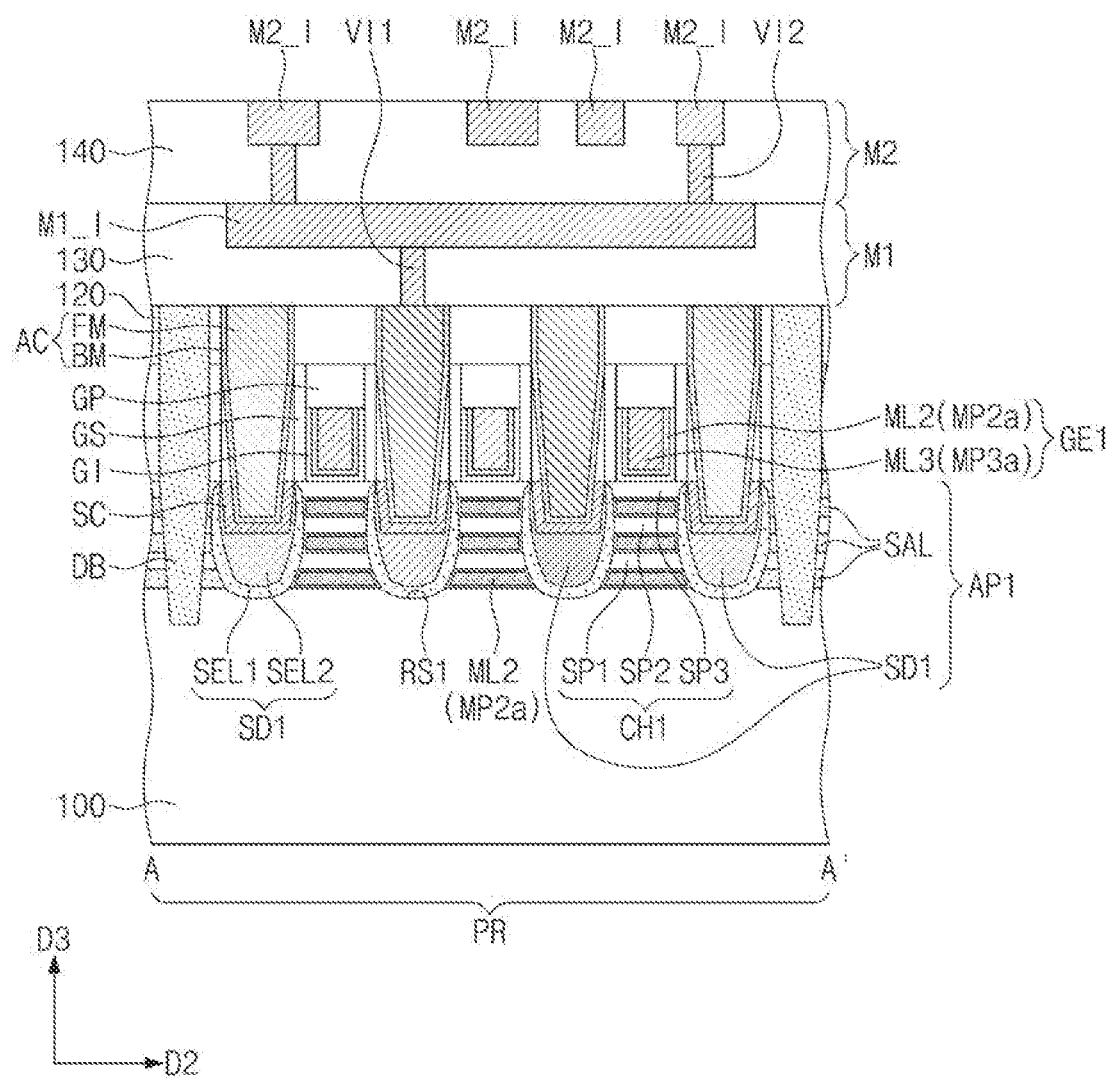
FIGS. 2A to 2D are sectional views taken along lines A-A', B-B', C-C', and D-D', respectively, of FIG. 1.
Figure 2B:
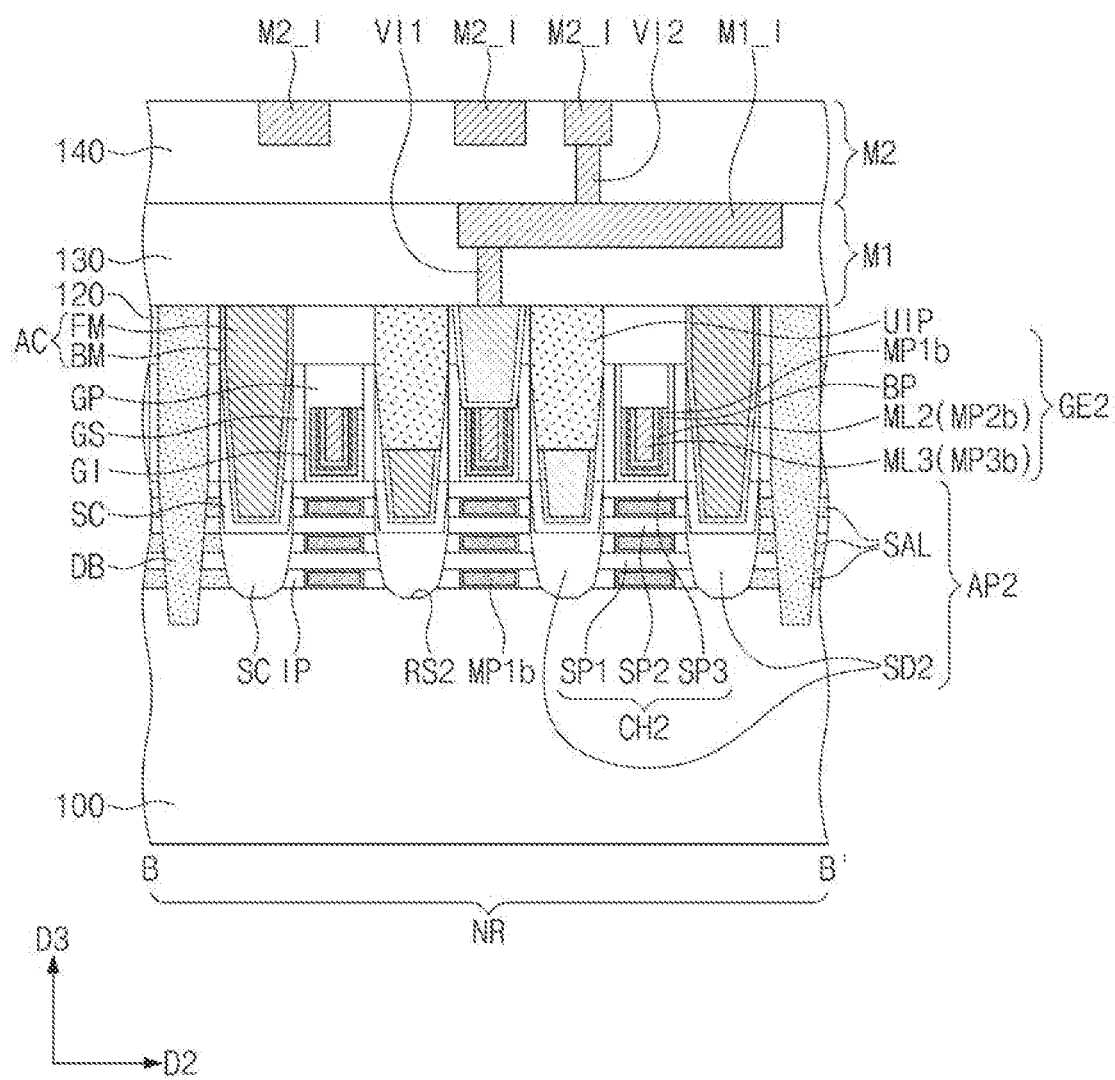

FIG. 1 is a plan view illustrating a semiconductor device, according to an embodiment. FIGS. 2A to 2D are sectional views taken along lines A-A', B-B', C-C', and D-D', respectively, of FIG. 1. FIG. 2E is an enlarged sectional view of a portion Q of FIG. 2D. FIG. 2F is an enlarged sectional view of a portion R of FIG. 2E.

Referring to FIGS. 1 and 2A to 2F, a logic cell may be provided on a substrate 100. In the present specification, the logic cell may mean a logic device (e.g., an inverter, a flip-flop, and so forth), which is configured to execute a specific function. For example, the logic cell may include transistors constituting the logic device and interconnection lines connecting the transistors to each other.

The substrate 100 may include a first active region PR and a second active region NR. In an embodiment, the first active region PR may be a PMOSFET region, and the second active region NR may be an NMOSFET region. The substrate 100 may be a semiconductor substrate that is formed of or includes silicon, germanium, silicon germanium, a compound semiconductor material, or the like. In an embodiment, the substrate 100 may be a silicon wafer.

Figure 2C:
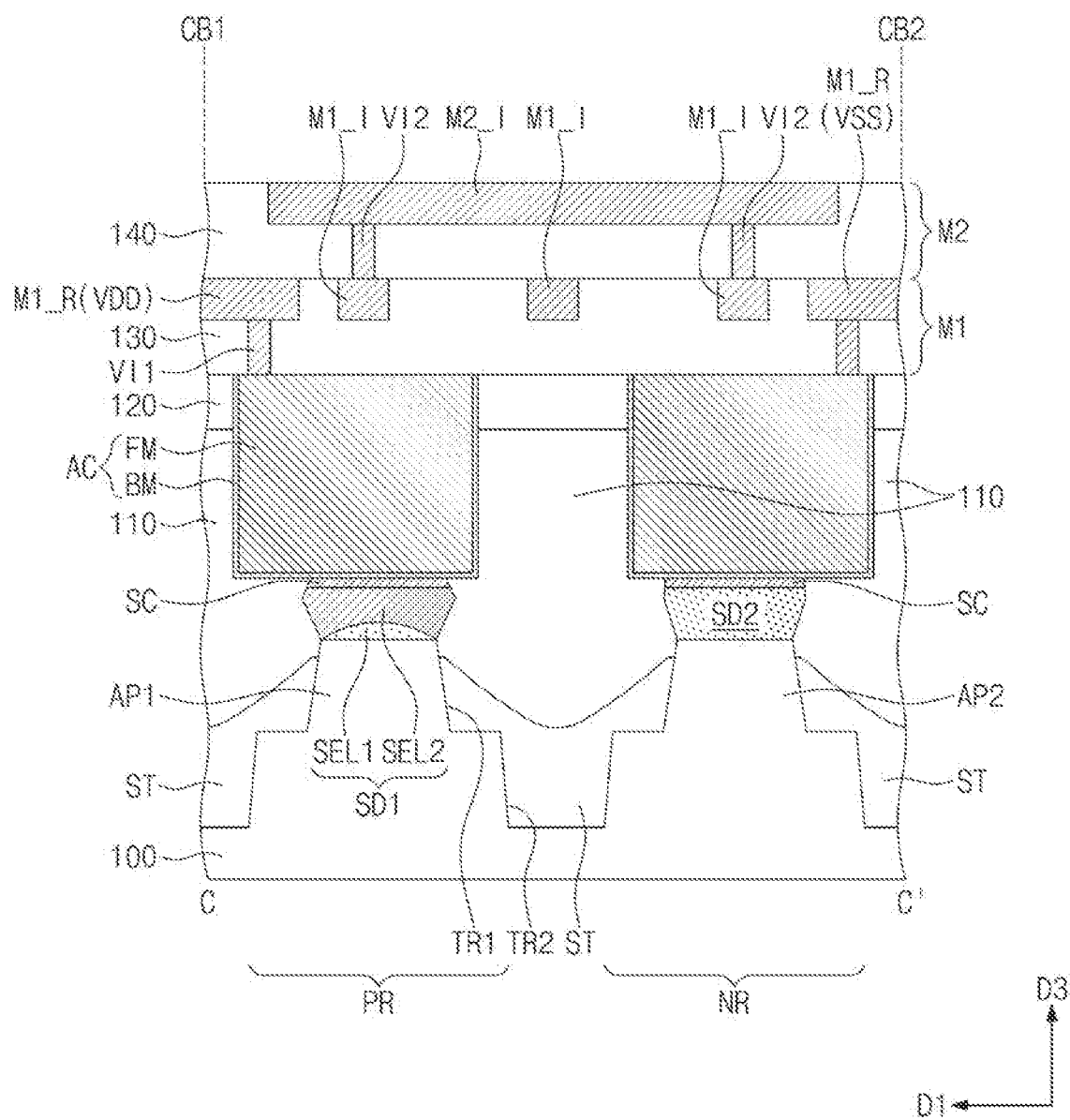

The first and second active regions PR and NR may be defined by a second trench TR2, which is formed in an upper portion of the substrate 100 (best seen in FIG. 2C). The second trench TR2 may be located between the first and second active regions PR and NR. The first and second active regions PR and NR may be spaced apart from each other, in a first direction D1, with the second trench TR2 interposed therebetween. Each of the first and second active regions PR and NR may be extended in a second direction D2 that is different from the first direction D1 (best seen in FIG. 1).

A first active pattern AP1 and a second active pattern AP2 may be defined by a first trench TR1, which is formed in an upper portion of the substrate 100 (best seen in FIG. 2C). The first and second active patterns AP1 and AP2 may be provided on the first and second active regions PR and NR, respectively. In some embodiments, the first trench TR1 may be shallower than the second trench TR2. The first and second active patterns AP1 and AP2 may be extended in a second direction D2. The first and second active patterns AP1 and AP2 may be vertically-protruding portions of the substrate 100.

A device isolation layer ST may be provided to fill the first and second trenches TR1 and TR2. The device isolation layer ST may include a silicon oxide layer. Upper portions of the first and second active patterns AP1 and AP2 may protrude vertically above the device isolation layer ST (e.g., see FIG. 2D). The device isolation layer ST may not cover the upper portions of the first and second active patterns AP1 and AP2. The device isolation layer ST may cover lower side surfaces of the first and second active patterns AP1 and AP2.

The first active pattern AP1 may include an upper portion serving as a first channel pattern CH1 (best seen in FIG. 2A). The second active pattern AP2 may include an upper portion serving as a second channel pattern CH2 (best seen in FIG. 2B). Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include silicon (Si), germanium (Ge), or silicon germanium (SiGe). In an embodiment, each of the first to third semiconductor patterns SP1, SP2, and SP3 may be formed of or include crystalline silicon.

A plurality of first recesses RS1 may be formed in an upper portion of the first active pattern AP1 (best seen in FIG. 2A). First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second recesses RS2 may be formed in the upper portion of the second active pattern AP2 (best seen in FIG. 2B). Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. As an example, each of the first and second source/drain patterns SD1 and SD2 may have a top surface that is located at substantially the same level as a top surface of the third semiconductor pattern SP3. However, in an embodiment, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween.

In an embodiment, the second source/drain patterns SD2 may be formed of or include the same semiconductor material (e.g., Si) as the substrate 100. In another embodiment, the second source/drain patterns SD2 may be formed of or include a material containing both of silicon (Si) and carbon (C). For example, the second source/drain patterns SD2 may be formed of or include silicon carbide (SiC). In the case where the second source/drain pattern SD2 is formed of silicon carbide (SiC), a carbon content in the second source/drain pattern SD2 may range from 10 at % to 30 at %. The pair of the second source/drain patterns SD2 containing the silicon carbide (SiC) may exert a tensile stress on the second channel pattern CH2 therebetween.

Each of the first source/drain patterns SD1 may include a first semiconductor layer SEL1 and a second semiconductor layer SEL2, which are sequentially stacked. A sectional shape of the first source/drain pattern SD1 taken parallel to the second direction D2 will be described with reference to FIG. 2A. The first semiconductor layer SEL1 may have a 'U'-shaped section. The first semiconductor layer SEL1 may have a decreasing thickness in an upward direction. In other words, a thickness of the first semiconductor layer SEL1 may decrease as a distance from the substrate 100 increases. The second semiconductor layer SEL2 may be provided on the first semiconductor layer SELL. A volume of the second semiconductor layer SEL2 may be larger than a volume of the first semiconductor layer SELL. In other words, a ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of or include silicon germanium (SiGe). In some embodiments, the first semiconductor layer SEL1 may be provided to have a relatively low germanium concentration. In another embodiment, the first semiconductor layer SEL1 may be provided to contain only silicon (Si) and not germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. In some embodiments, the germanium concentration of the second semiconductor layer SEL2 may increase in the third direction D3. For example, the germanium concentration of the second semiconductor layer SEL2 may be about 40 at % near the first semiconductor layer SEL1 but may be about 60 at % at its top level (i.e., farthest from the substrate 100).

The first and second semiconductor layers SEL1 and SEL2 may include impurities (e.g., boron), allowing the first source/drain pattern SD1 to have the p-type conductivity. In an embodiment, a concentration of impurities in the second semiconductor layer SEL2 (in at %) may be greater than that in the first semiconductor layer SEL1.

The first semiconductor layer SEL1 may prevent a stacking fault from occurring between the substrate 100 and the second semiconductor layer SEL2 and between the first to third semiconductor patterns SP1, SP2, and SP3 and the second semiconductor layer SEL2. The stacking fault may lead to an increase in channel resistance, but due to the first semiconductor layer SEL1, it may be possible to prevent the stacking fault and thereby improve electric characteristics of the semiconductor device.

The first semiconductor layer SEL1 may protect the second semiconductor layer SEL2, in a process of replacing sacrificial layers SAL with a gate electrode GE, which will be described below. For example, the first semiconductor layer SEL1 may prevent the second semiconductor layer SEL2 from being undesirably damaged by an etching material, which is used to remove the sacrificial layers SAL.

The gate electrodes GE may be provided to cross the first and second active patterns AP1 and AP2 and to extend in the first direction D1. The gate electrodes GE may be arranged with a first pitch P1 in the second direction D2. Each of the gate electrodes GE may be overlapped with the first and second channel patterns CH1 and CH2, when viewed in a plan view.

The gate electrode GE may include a first electrode portion GE1 on the first active region PR and a second electrode portion GE2 on the second active region NR. Each of the first and second electrode portions GE1 and GE2 of the gate electrode GE may include a first portion interposed between the substrate 100 and the first semiconductor pattern SP1, a second portion interposed between the first semiconductor pattern SP1 and the second semiconductor pattern SP2, a third portion interposed between the second semiconductor pattern SP2 and the third semiconductor pattern SP3, and a fourth portion on the third semiconductor pattern SP3.

Referring back to FIG. 2A, the first to third portions of the first electrode portion GE1 may have different widths (e.g., in the second direction D2) from each other. Referring back to FIG. 2D, the gate electrode GE may be provided on a top surface, a bottom surface, and opposite side surfaces of each of the first to third semiconductor patterns SP1, SP2, and SP3. In other words, the logic transistor according to the present embodiment may be a three-dimensional field-effect transistor (e.g., a multi-bridge channel field-effect transistor (MBCFET)), in which the gate electrode GE is provided to three-dimensionally surround the channel pattern.

Referring back to FIGS. 1 and 2A to 2D, a pair of gate spacers GS may be respectively disposed on opposite side surfaces of the fourth portion of the gate electrode GE. That is, a gate spacer GS may be disposed on each of opposite side surfaces of the fourth portion of the gate electrode GE. The gate spacers GS may be extended along the gate electrode GE in the third direction D3 and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may have a multi-layered structure including at least two layers, each of which is made of SiCN, SiCON, or SiN.

A gate capping pattern GP may be provided on the gate electrode GE. The gate capping pattern GP may be extended along the gate electrode GE and in the first direction D1. The gate capping pattern GP may be formed of or include a material having an etch selectivity with respect to first and second interlayer insulating layers 110 and 120, which will be described below. For example, the gate capping patterns GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover the top surface of the device isolation layer ST below the gate electrode GE (e.g., see FIG. 2D).

In an embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. As an example, the high-k dielectric materials may be formed of or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

In another embodiment, the semiconductor device may include a negative capacitance (NC) FET using a negative capacitor. For example, the gate insulating layer GI may include a ferroelectric layer exhibiting a ferroelectric material property and a paraelectric layer exhibiting a paraelectric material property.

The ferroelectric layer may have a negative capacitance. The paraelectric layer may have a positive capacitance. In the case where two or more capacitors are connected in series and each capacitor has a positive capacitance, a total capacitance may be less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS) less than 60 mV/decade, at the room temperature.

The ferroelectric layer may have a ferroelectric material property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have a paraelectric material property. The paraelectric layer may be formed of or include at least one of, for example, silicon oxide and/or high-k metal oxides. The metal oxides, which may be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or include the same material. The ferroelectric layer may have the ferroelectric material property, but the paraelectric layer may not have the ferroelectric material property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric material property, only when it is in a specific range of thickness. In an embodiment, the ferroelectric layer may have a thickness ranging from 0.5 to 10 nm, but embodiments are not limited to this example. Since a critical thickness associated with the occurrence of the ferroelectric material property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The second electrode portion GE2 of the gate electrode GE may include a first metal pattern MP1$b$, an etch barrier pattern BP, a second metal pattern MP2$b$, and a third metal pattern MP3$b$. The first electrode portion GE1 of the gate electrode GE may include a second metal pattern MP2$a$ and a third metal pattern MP3$a$.

The first metal pattern MP1b may cover the second active pattern AP2. For example, the first metal pattern MP1b may be provided on the gate insulating layer GI to be adjacent to the first to third semiconductor patterns SP1, SP2, and SP3. The first metal pattern MP1b may include a work-function metal, which may be used to adjust a threshold voltage of a transistor. By adjusting a thickness and composition of the first metal pattern MP1b, it may be possible to realize a transistor with a desired threshold voltage. The first metal pattern MP1b may be provided to fill spaces between the first to third semiconductor patterns SP1, SP2, and SP3 of the second channel pattern CH2. In an embodiment, the first metal pattern MP1b may be extended to face side surfaces of the first to third semiconductor patterns SP1, SP2, and SP3 and a top surface of the third semiconductor pattern SP3. The first metal pattern MP1b may include an end portion EG1, which is disposed on the device isolation layer ST between the first and second active regions PR and NR (best seen in FIGS. 2E and 2F).

The second metal patterns MP2a and MP2b of the first and second electrode portions GE1 and GE2 may be portions of a second metal layer ML2. The second metal patterns MP2a and MP2b of the first and second electrode portions GE1 and GE2 may be portions of a layer that is formed of the same material using the same process. The second metal patterns MP2a and MP2b of the first and second electrode portions GE1 and GE2 may be connected to each other on the device isolation layer ST between the first and second active regions PR and NR but in some embodiments, the second metal patterns MP2a and MP2b of the first and second electrode portions GE1 and GE2 may be cut by an insulating layer on the device isolation layer ST between the first and second active regions PR and NR.

The first metal pattern MP1b may include a metal nitride layer. For example, the first metal pattern MP1b may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern MP1b may further include carbon (C). The first metal pattern MP1b may include a plurality of work function metal layers, which are sequentially stacked.

The second metal layer ML2 may include a metal nitride layer. For example, the first metal pattern MP1b may include at least one of titanium (Ti), tantalum (Ta), aluminum (Al), tungsten (W), and molybdenum (Mo), and nitrogen (N). In an embodiment, the second metal layer ML2 may further include carbon (C). The second metal layer ML2 may include a plurality of work function metal layers, which are sequentially stacked.

The etch barrier pattern BP, which is provided between the first and second metal patterns MP1b and MP2b of the second electrode portion GE2, may separate the first metal pattern MP1b from the second metal pattern MP2b. In an embodiment, the etch barrier pattern BP may not be extended into the spaced between the first to third semiconductor patterns SP1, SP2, and SP3 of the second channel pattern CH2. The first electrode portion GE1 may not include the etch barrier pattern BP. In an embodiment, an end portion EG2 of the etch barrier pattern BP may be disposed on the device isolation layer ST between the first and second active regions PR and NR.

The etch barrier pattern BP may be formed of or include a material different from the first metal pattern MP1b. The etch barrier pattern BP may be formed of or include a material that is chosen to have an etch selectivity with respect to the first metal pattern MP1b in a fabrication process to be described below. In an embodiment, the etch barrier pattern BP may be formed of or include a material that includes at least one of titanium (Ti), tantalum (Ta), aluminum (Al), tungsten (W), or molybdenum (Mo) and nitrogen (N) but is different from that of the first metal pattern MP1b. In an embodiment, the etch barrier pattern BP may be formed of or include a material that includes at least one TiAlN, TaAlC, TiN, or TaN but is different from that of the first metal pattern MP1b. In the case where the etch barrier pattern BP includes TiAlN, an aluminum concentration thereof may range from about 10 to 19 at %.

Referring to FIGS. 2E and 2F, the end portion EG2 of the etch barrier pattern BP may cover the end portion EG1 of the first metal pattern MP1b. In detail, the end portion EG1 of the first metal pattern MP1b may include a side surface SF, and the end portion EG2 of the etch barrier pattern BP may include a first portion Y1 covering a top surface of the first metal pattern MP1b, a second portion Y2 covering the side surface SF of the first metal pattern MP1b, and a third portion Y3 in contact with the gate insulating layer GI. Thus, the end portion EG2 of the etch barrier pattern BP may have a stepwise structure. The second metal layer ML2 may have a stepwise structure STP near the end portions EG1 and EG2 of the first metal pattern MP1b and the etch barrier pattern BP. That is, the second metal layer ML2 may have a stepwise structure STP starting from a portion of the second metal layer ML2 over the first portion Y1 to a portion of the second metal layer ML2 that is in contact with the gate insulating layer GI.

The etch barrier pattern BP may be thinner (e.g., in the first direction D1) than the first metal pattern MP1b and thinner than the second metal pattern MP2b. The thickness of the etch barrier pattern BP may be about 20% to about 70% of the thickness of the first metal pattern MP1b. The thickness of the etch barrier pattern BP may be about 20% to about 70% of the thickness of the second metal pattern MP2b. In an embodiment, the thickness of the etch barrier pattern BP may range from about 10 Å to about 20 Å.

The third metal pattern MP3b of the second electrode portion GE2 and the third metal pattern MP3a of the first electrode portion GE1 may be portions of a third metal layer ML3. The third metal patterns MP3a and MP3b may be formed of or include a metallic material whose resistance is lower than that of the first metal pattern MP1b. For example, the third metal patterns MP3a and MP3b may be formed of or include at least one of tungsten (W), aluminum (Al), titanium (Ti), or tantalum (Ta). The third metal pattern MP3b of the second electrode portion GE2 and the third metal pattern MP3a of the first electrode portion GE1 may be formed of or include the same material but in an embodiment, the third metal pattern MP3b of the second electrode portion GE2 and the third metal pattern MP3a of the first electrode portion GE1 may be formed of or include different materials from each other. For example, in the case of different materials, the boundary between the third metal pattern MP3b of the second electrode portion GE2 and the third metal pattern MP3a of the first electrode portion GE1 may be located at the boundary between the first and second active regions PR and NR.

A first interlayer insulating layer 110 may be provided on the substrate 100 (best seen in FIG. 2C). The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be disposed on the first interlayer insulating layer 110 to cover the gate capping pattern GP. In an embodiment, at least one of the first and second interlayer insulating layers 110 and 120 may include a silicon oxide layer.

A pair of division structures DB, which are opposite to each other in the second direction D2, may be provided at both sides of the logic cell. The division structure DB may be extended in the first direction D1 to be parallel to the gate electrodes GE. A pitch between the division structure DB and the gate electrode GE adjacent to each other may be equal to the first pitch P1 between adjacent gate electrodes GE described earlier.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may separate the first and second active regions PR and NR of the logic cell from the active regions of a neighboring logic cell.

The upper portion of each of the first and second active patterns AP1 and AP2 may further include the sacrificial layers SAL which are provided adjacent to the division structure DB (see, e.g., FIG. 2A). The sacrificial layers SAL may be stacked to be spaced apart from each other. Each of the sacrificial layers SAL may be located at the same level as a corresponding one of the first to third portions PO1, PO2, and PO3 of the gate electrode GE. The division structure DB may be provided to penetrate the sacrificial layers SAL. Inner spacers IP may be interposed between the sacrificial layers SAL and the second source/drain pattern SD2 (see, e.g., FIG. 2B). As an example, the inner spacers IP may be formed of or include silicon nitride.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. That is, an active contact may be provided on each side of the gate electrode GE. When viewed in a plan view, the active contact AC may be a bar-shaped pattern extending in the first direction D1. The active contact AC may be a self-aligned contact. For example, the active contact AC may be formed by a self-alignment process using the gate capping pattern GP and the gate spacer GS. In an embodiment, the active contact AC may cover at least a portion of the side surface of the gate spacer GS. Although not shown, the active contact AC may be provided to cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, or cobalt silicide).

A gate contact GC may be provided to penetrate the second interlayer insulating layer 120 and the gate capping pattern GP and may be electrically connected to the gate electrode GE. Referring to FIG. 2B, an upper region of each of the active contacts AC adjacent to the gate contact GC may be filled with an upper insulating pattern UIP. Accordingly, it may be possible to prevent a process failure (e.g., a short circuit), which may occur when the gate contact GC is in contact with the active contact AC adjacent thereto.

Figure 2D:
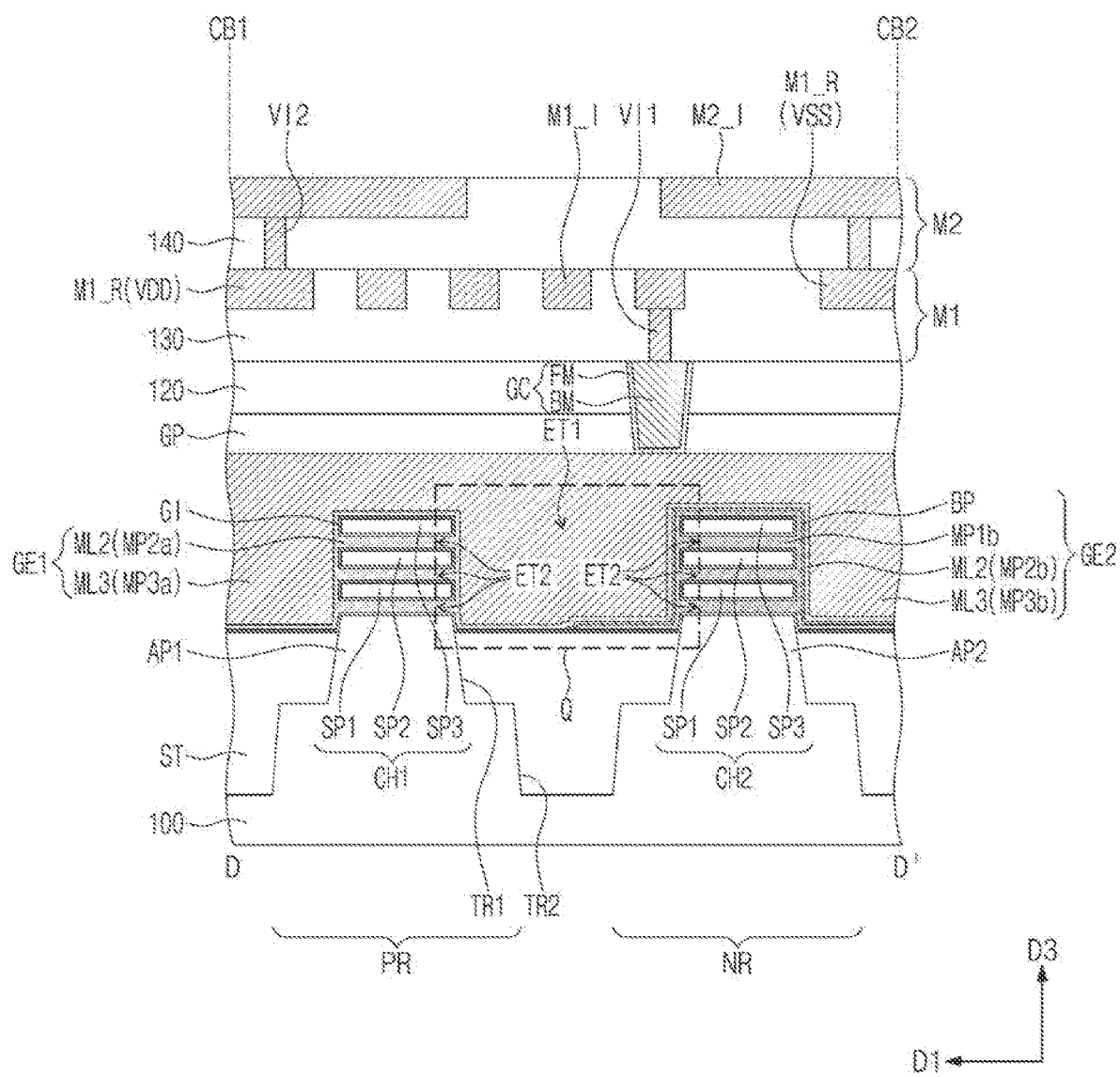
Figure 2E:
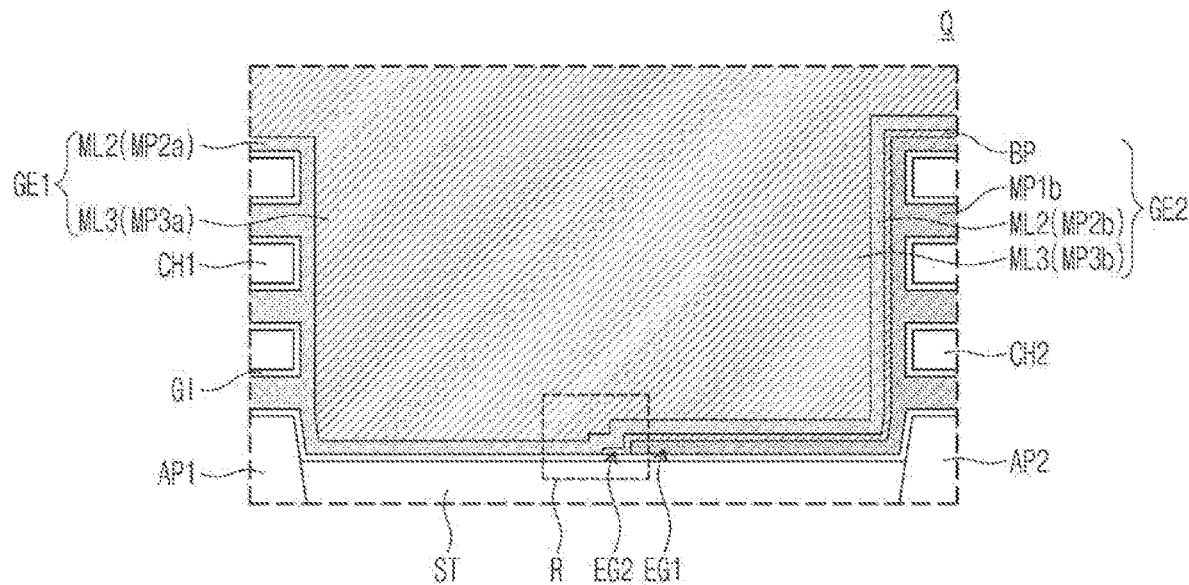
FIG. 2E is an enlarged sectional view of a portion Q of FIG. 2D.
Figure 2F:
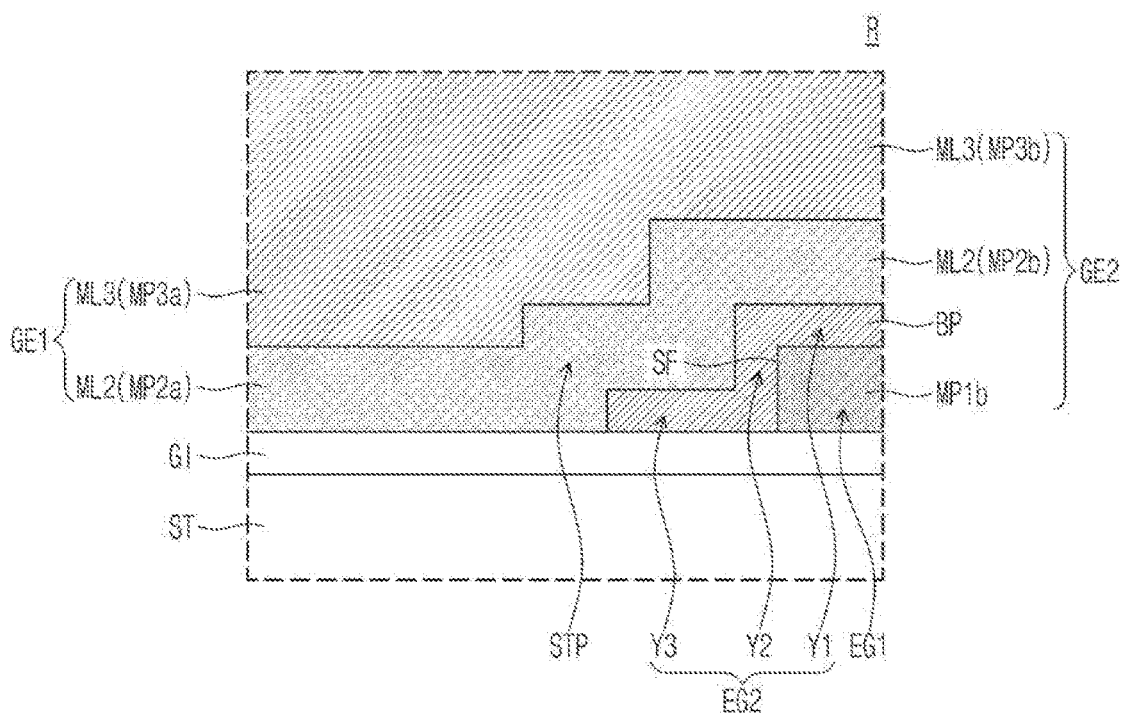
FIG. 2F is an enlarged sectional view of a portion R of FIG. 2E.

Each of the active and gate contacts AC and GC may include a conductive pattern FM and a barrier pattern BM enclosing the conductive pattern FM (best seen in FIGS. 2C and 2D). For example, the conductive pattern FM may be formed of or include at least one of metallic materials (e.g., aluminum, copper, tungsten, molybdenum, or cobalt). The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. The first metal layer M1 may include first lower interconnection lines M1_R, second lower interconnection lines M1_I, and lower vias VI1. The lower vias VI1 may be provided below the first and second lower interconnection lines M1_R and M1_I.

Each of the first lower interconnection lines M1_R may be extended in the second direction D2 to cross the logic cell. Each of the first lower interconnection lines M1_R may be a power line. For example, a drain voltage VDD or a source voltage VSS may be applied to the first lower interconnection line M1_R.

Referring to FIG. 1, a first cell boundary CB1 extending in the second direction D2 may be defined in a region of the logic cell. A second cell boundary CB2 extending in the second direction D2 may be defined in a region of the logic cell opposite to the first cell boundary CB1. The first lower interconnection line M1_R, to which the drain voltage VDD (i.e., a power voltage) is applied, may be disposed on the first cell boundary CB1. The first lower interconnection line M1_R, to which the drain voltage VDD is applied, may be extended along the first cell boundary CB1 and in the second direction D2. The first lower interconnection line M1_R, to which the source voltage VSS (i.e., a ground voltage) is applied, may be disposed on the second cell boundary CB2. The first lower interconnection line M1_R, to which the source voltage VSS is applied, may be extended along the second cell boundary CB2 and in the second direction D2.

The second lower interconnection lines M1_I may be disposed between the first lower interconnection lines M1_R, to which the drain voltage VDD and the source voltage VSS are respectively applied, in the first direction D1. Each of the second lower interconnection lines M1_I may be a line-shaped pattern or a bar-shaped pattern extending in the second direction D2. The second lower interconnection lines M1_I may be arranged with a second pitch P2 in the first direction D1. The second pitch P2 may be smaller than the first pitch P1.

The lower vias VI1 may be provided below the first and second lower interconnection lines M1_R and M1_I of the first metal layer M1. The lower vias VI1 may be respectively interposed between the active contacts AC and the first and second lower interconnection lines M1_R and M1_I. The lower vias VI1 may be respectively interposed between the gate contacts GC and the second lower interconnection lines M1_I.

The lower interconnection line M1_R or M1_I of the first metal layer M1 and the lower via VI1 thereunder may be formed by separate processes. For example, each of the lower interconnection line M1_R or M1_I and the lower via VI1 may be formed by a single damascene process. The semiconductor device according to the present embodiment may be fabricated using a sub-20 nm process.

A second metal layer M2 may be provided in a fourth interlayer insulating layer 140. The second metal layer M2 may include upper interconnection lines M2_I. Each of the upper interconnection lines M2_I may be a line-shaped pattern or a bar-shaped pattern extending in the first direction D1. In other words, the upper interconnection lines M2_I may be extended in the first direction D1 to be parallel to each other. When viewed in a plan view, the upper interconnection lines M2_I may be parallel to the gate electrodes GE. The upper interconnection lines M2_I may be arranged with a third pitch P3 in the second direction D2. The third pitch P3 may be smaller than the first pitch P1. The third pitch P3 may be larger than the second pitch P2.

The second metal layer M2 may further include upper vias VI2. The upper vias VI2 may be provided below the upper interconnection lines M2_I. The upper vias VI2 may be respectively interposed between the lower interconnection lines M1_R and M1_I and the upper interconnection lines M2_I.

The upper interconnection line M2_I of the second metal layer M2 and the upper via VI thereunder may be formed by the same process and may form a single object. In other words, the upper interconnection line M2_I of the second metal layer M2 and the upper via VI2 may be formed together by a dual damascene process.

The lower interconnection lines M1_R and M1_I of the first metal layer M1 and the upper interconnection lines M2_I of the second metal layer M2 may be formed of or include the same material or different conductive materials. For example, the lower interconnection lines M1_R and M1_I and the upper interconnection lines M2_I may be formed of or include at least one of metallic materials (e.g., aluminum, copper, tungsten, molybdenum, or cobalt).

In an embodiment, although not shown, additional metal layers (e.g., M3, M4, M5, and so forth) may be further stacked on the fourth interlayer insulating layer 140. Each of the stacked metal layers may include routing lines.

In the semiconductor device according to an embodiment, the gate electrode GE, which is disposed to cross both regions (e.g., PR and NR) having different properties, may include the metal patterns MP1 to MP4 which are formed to have materials and structures suitable for characteristics of each region (e.g., PR or NR), thus, it may be possible to optimize performance of the semiconductor device. Accordingly, it may be possible to improve electric characteristics of the semiconductor device.

FIGS. 3A to 14C are sectional views illustrating a method of fabricating a semiconductor device, according to an embodiment. FIGS. 3A, 4A, 5A, 6A, 7A, 8A, 9A, 10A, 11A, 12A, 13A, and 14A are sectional views taken along the line A-A' of FIG. 1. FIGS. 5B, 6B, 7B, 8B, 9B, 10B, 11B, 12B, 13B, and 14B are sectional views taken along the line B-B' of FIG. 1. FIGS. 5C, 6C, 7C, and 8C are sectional views taken along the line C-C' of FIG. 1. FIGS. 3B, 4B, 5D, 6D, 7D, 8D, 9C, 10C, 11C, 12C, 13C, and 14C are sectional views taken along the line D-D' of FIG. 1.

Figure 3A:
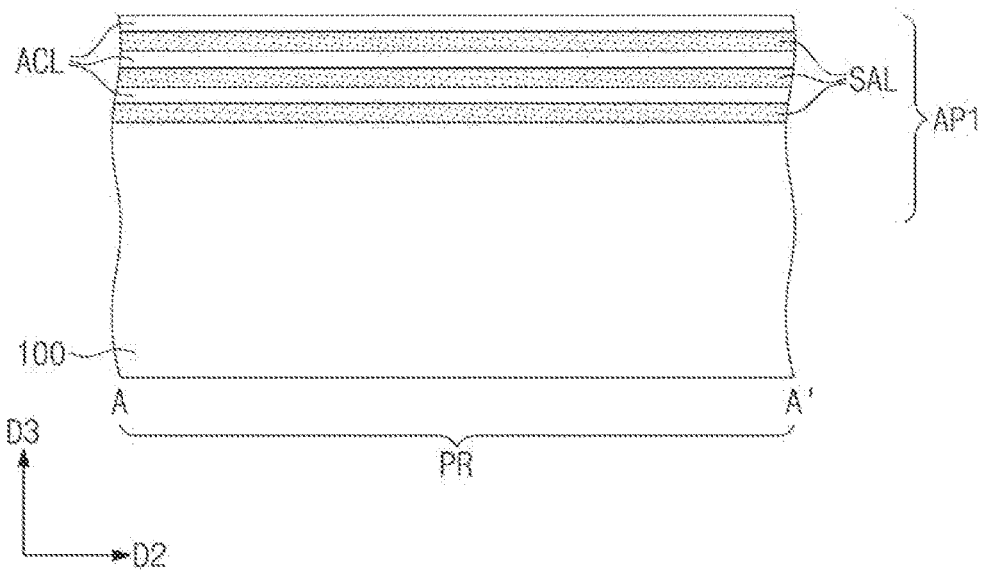
Figure 3B:
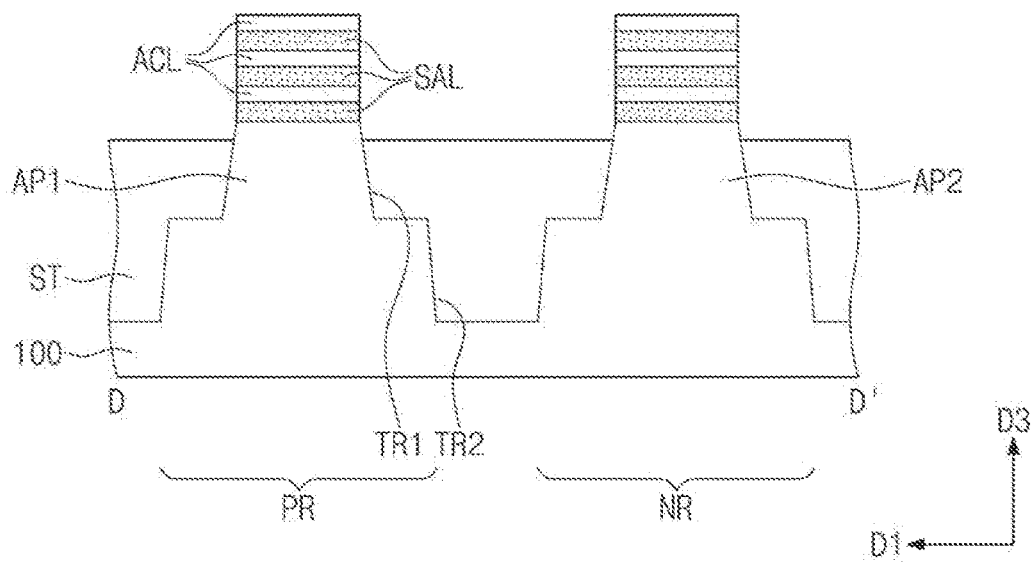

Referring to FIGS. 3A and 3B, the substrate 100 including the first and second active regions PR and NR may be provided. The sacrificial layers SAL and active layers ACL may be alternately stacked on the substrate 100. The sacrificial and active layers SAL and ACL may be formed of or include at least one of silicon (Si), germanium (Ge), or silicon germanium (SiGe), but the material of the active layers ACL may be different from that of the sacrificial layers SAL.

For example, the sacrificial layers SAL may be formed of or include silicon germanium (SiGe), and the active layers ACL may be formed of or include silicon (Si).

Mask patterns may be respectively formed on the first and second active regions PR and NR of the substrate 100. The mask pattern may be a line-shaped pattern or a bar-shaped pattern extending in the second direction D2.

A first patterning process, in which the mask patterns are used as an etch mask, may be performed to form the first trench TR1 defining the first and second active patterns AP1 and AP2. The first and second active patterns AP1 and AP2 may be formed on the first and second active regions PR and NR, respectively. Each of the first and second active patterns AP1 and AP2 may include the sacrificial layers SAL and the active layers ACL, which are alternately stacked in an upper portion thereof.

A second patterning process may be performed on the substrate 100 to form the second trench TR2 defining the first and second active regions PR and NR. The second trench TR2 may be formed to have a depth that is larger than that of the first trench TR1.

The device isolation layer ST may be formed on the substrate 100 to fill the first and second trenches TR1 and TR2. For example, an insulating layer may be formed on the substrate 100 to cover the first and second active patterns AP1 and AP2. The device isolation layer ST may be formed by recessing the insulating layer until the sacrificial layers SAL are exposed.

The device isolation layer ST may be formed of or include at least one of insulating materials (e.g., silicon oxide). Each of the first and second active patterns AP1 and AP2 may include an upper portion protruding above the device isolation layer ST. In other words, the upper portion of each of the first and second active patterns AP1 and AP2 may be a protruding pattern, which is vertically extended above the device isolation layer ST.

Figure 4A:
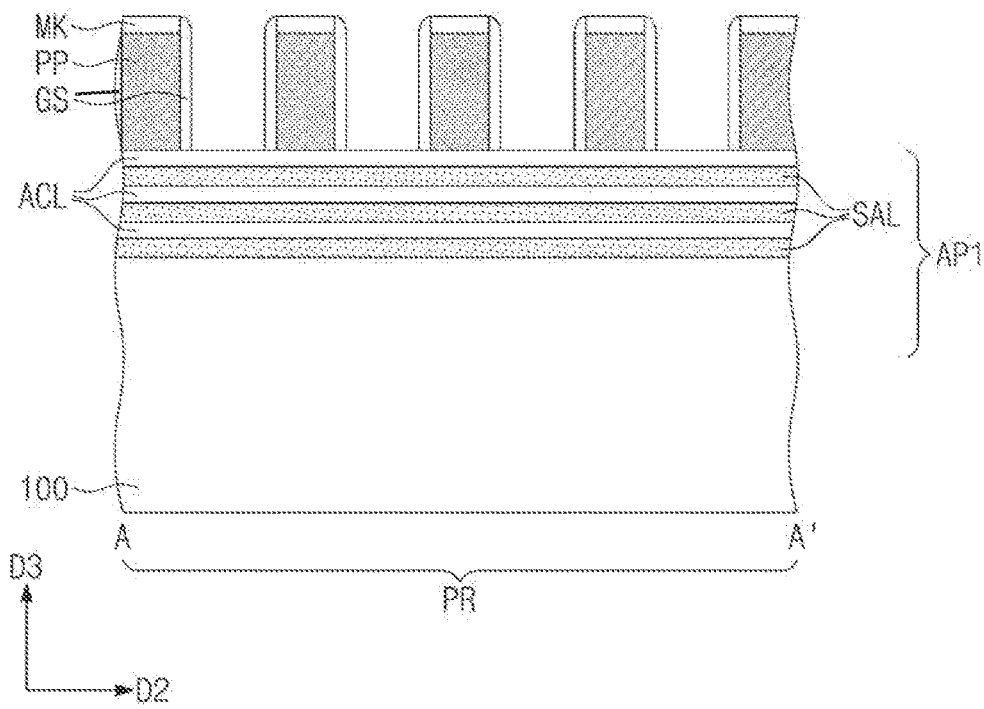
Figure 4B:
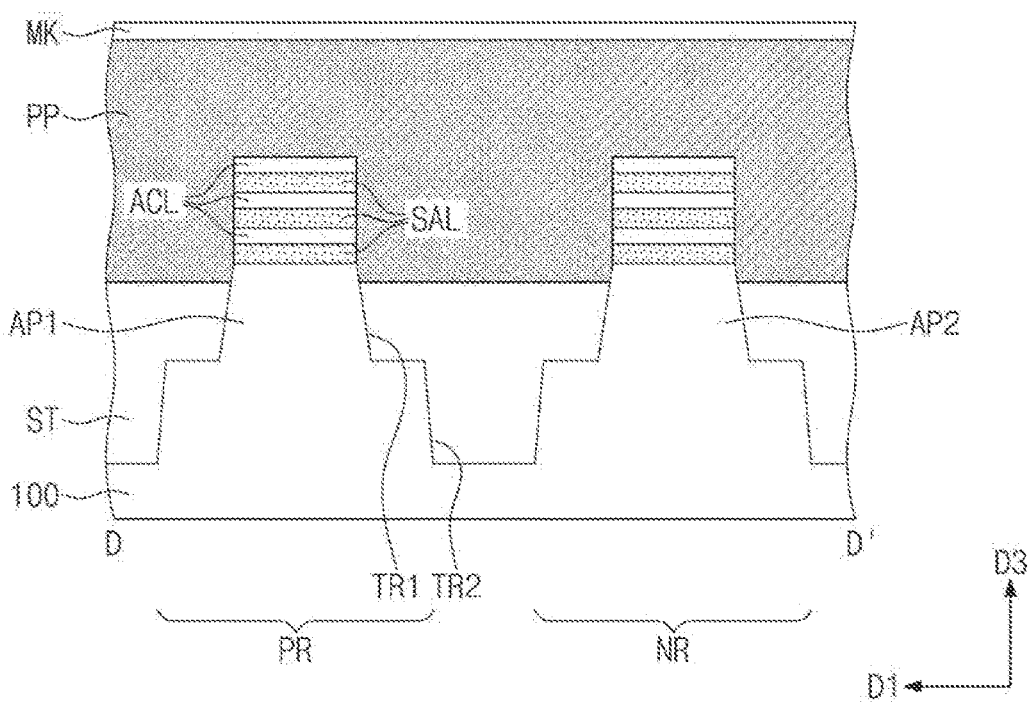
Figure 5A:
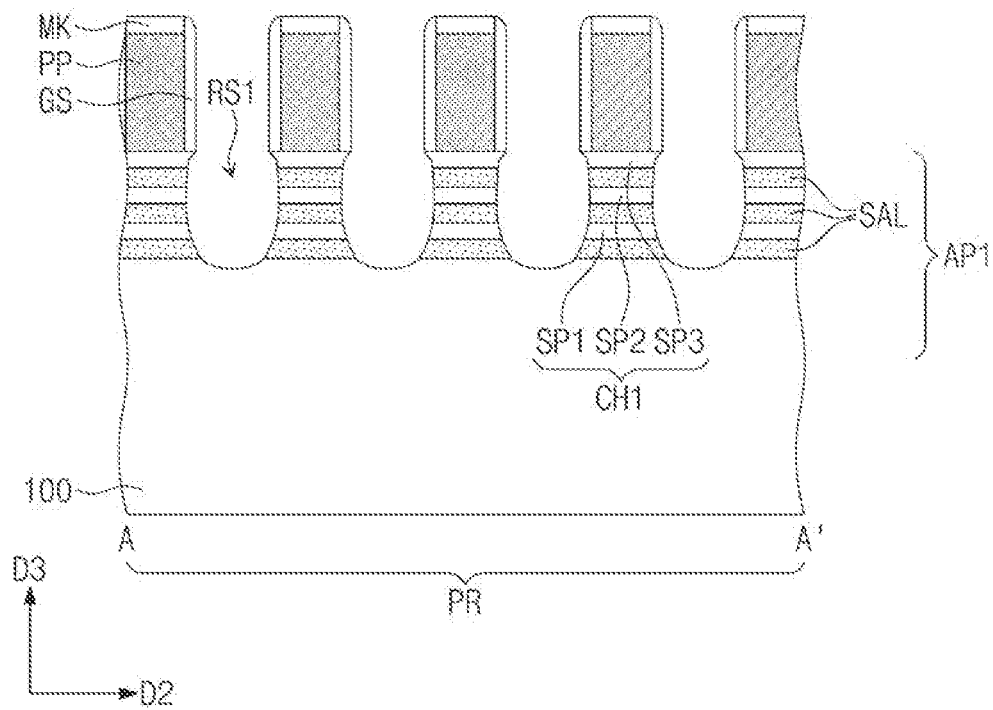
Figure 5B:
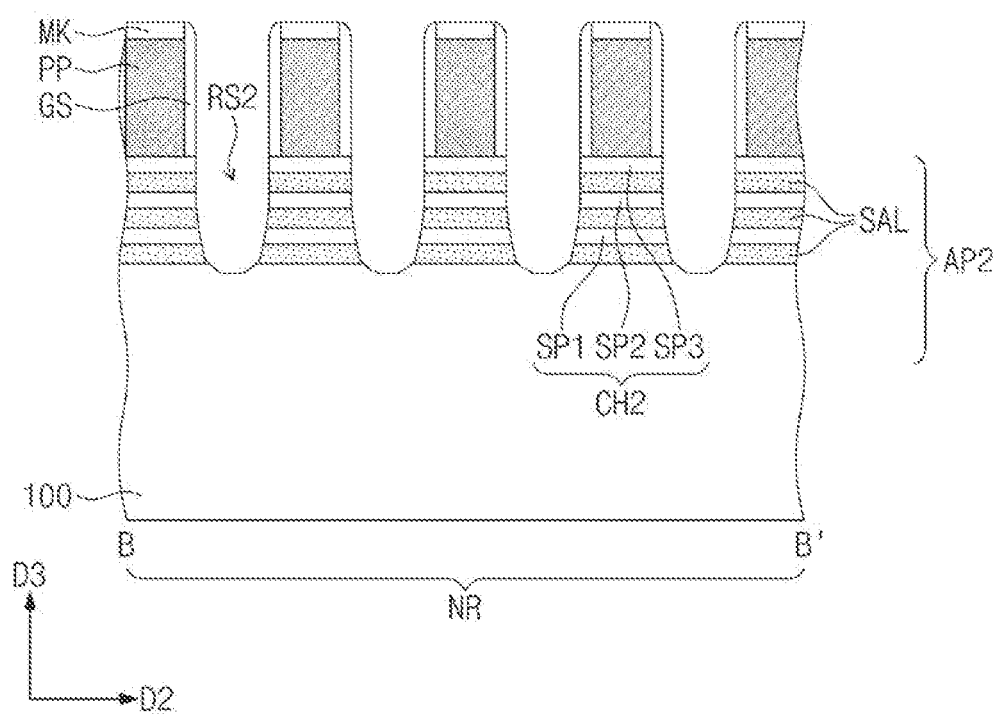
Figure 5C:
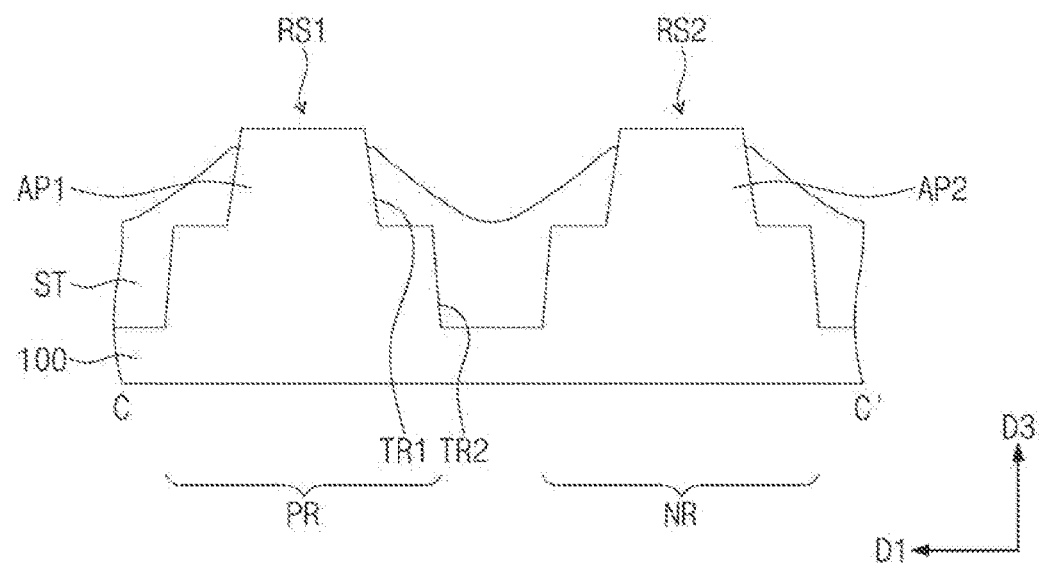
FIGS. 5C, 6C, 7C, and 8C are sectional views taken along the line C-C' of FIG. 1.
Figure 5D:
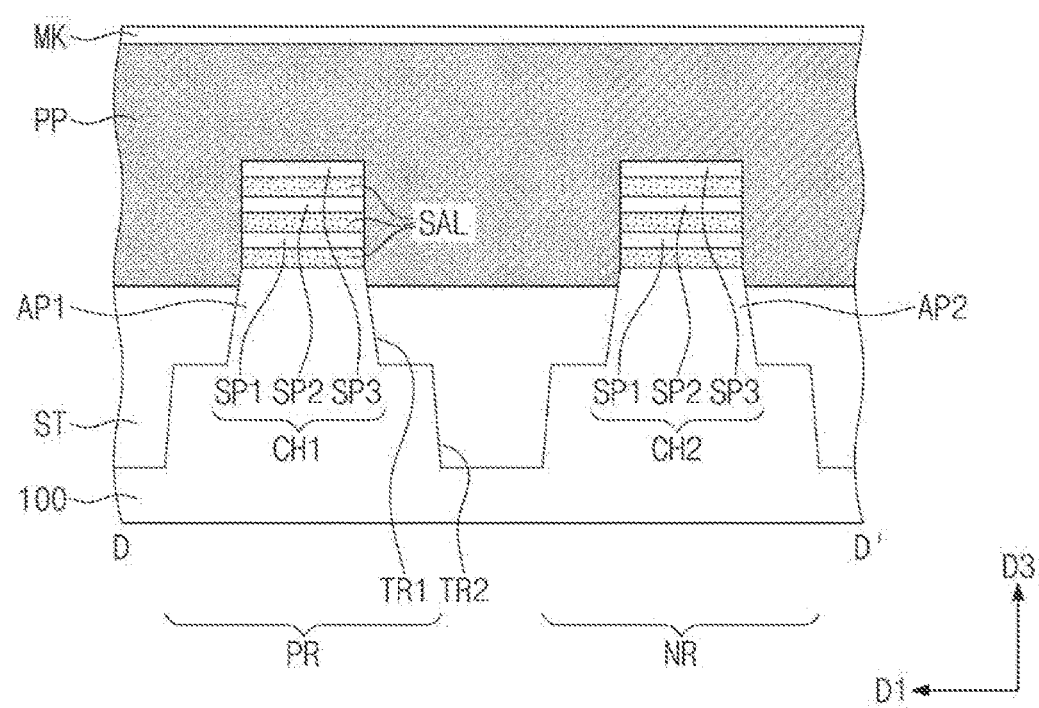
Figure 6A:
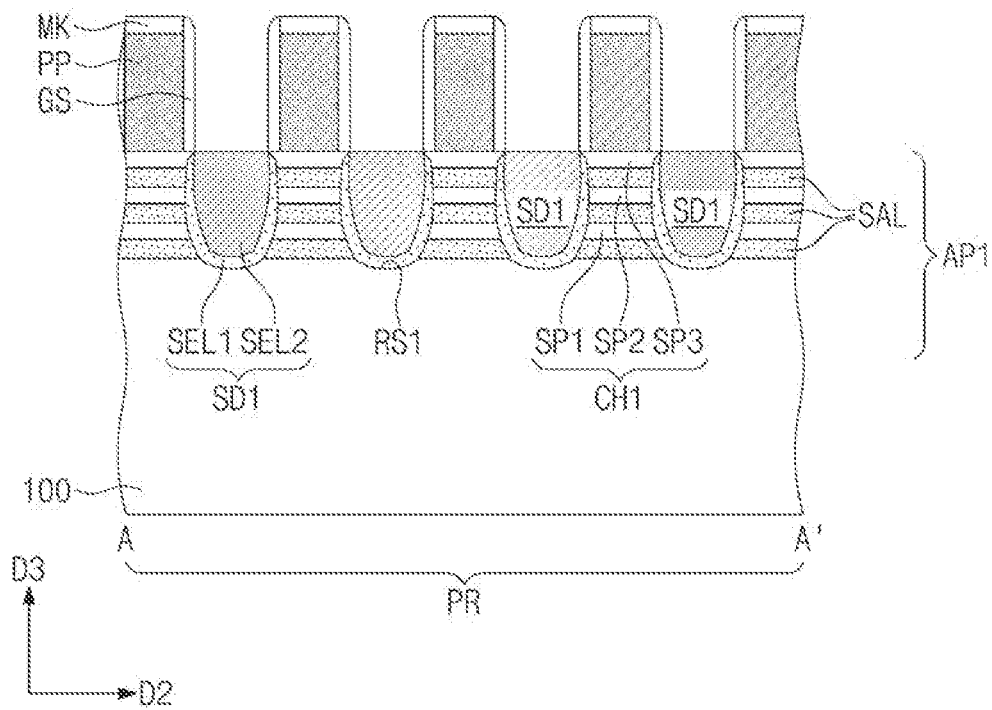
Figure 6B:
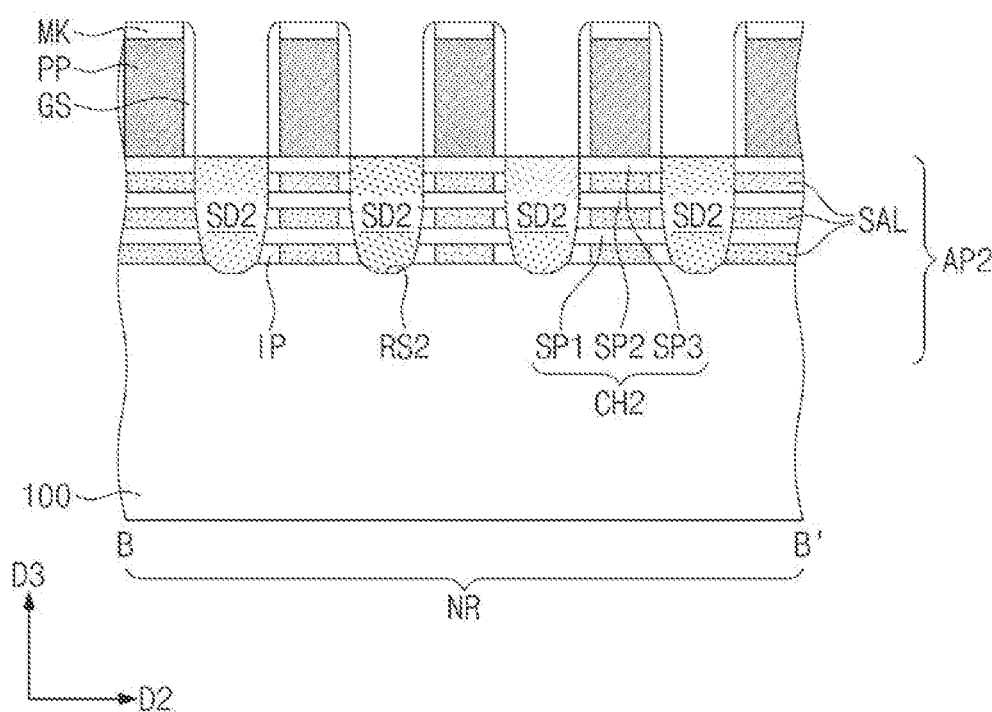
Figure 6C:
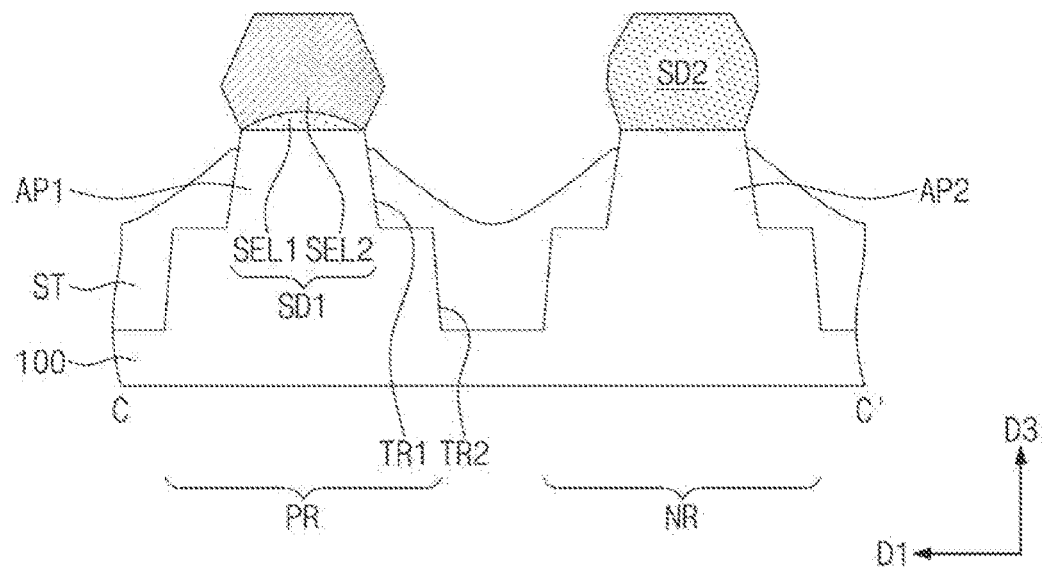
Figure 6D:
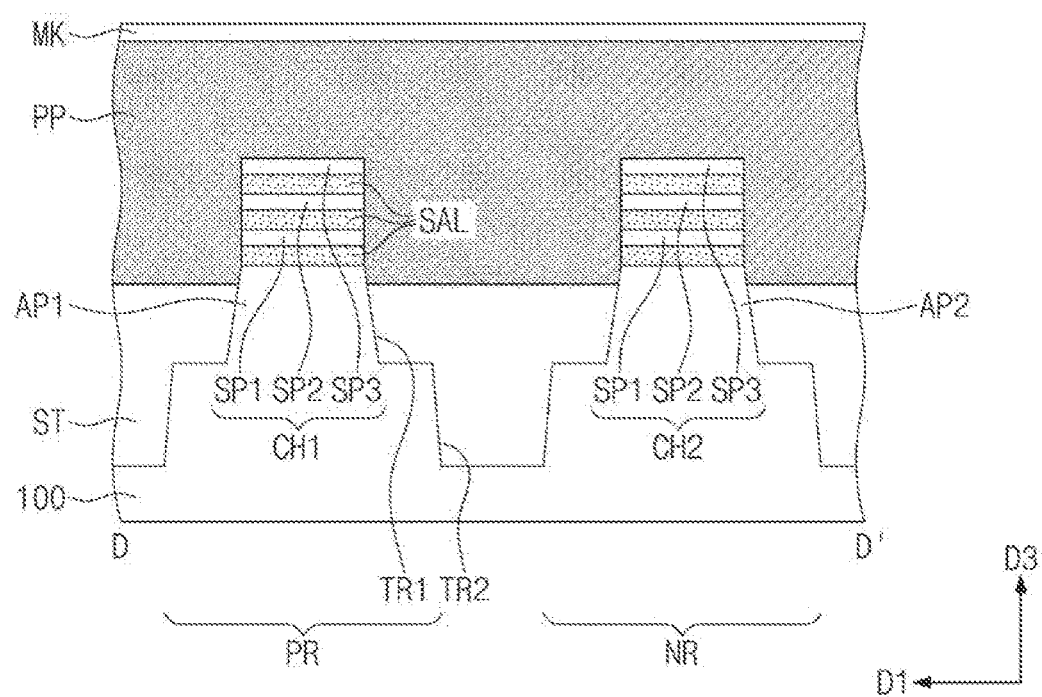
Figure 7A:
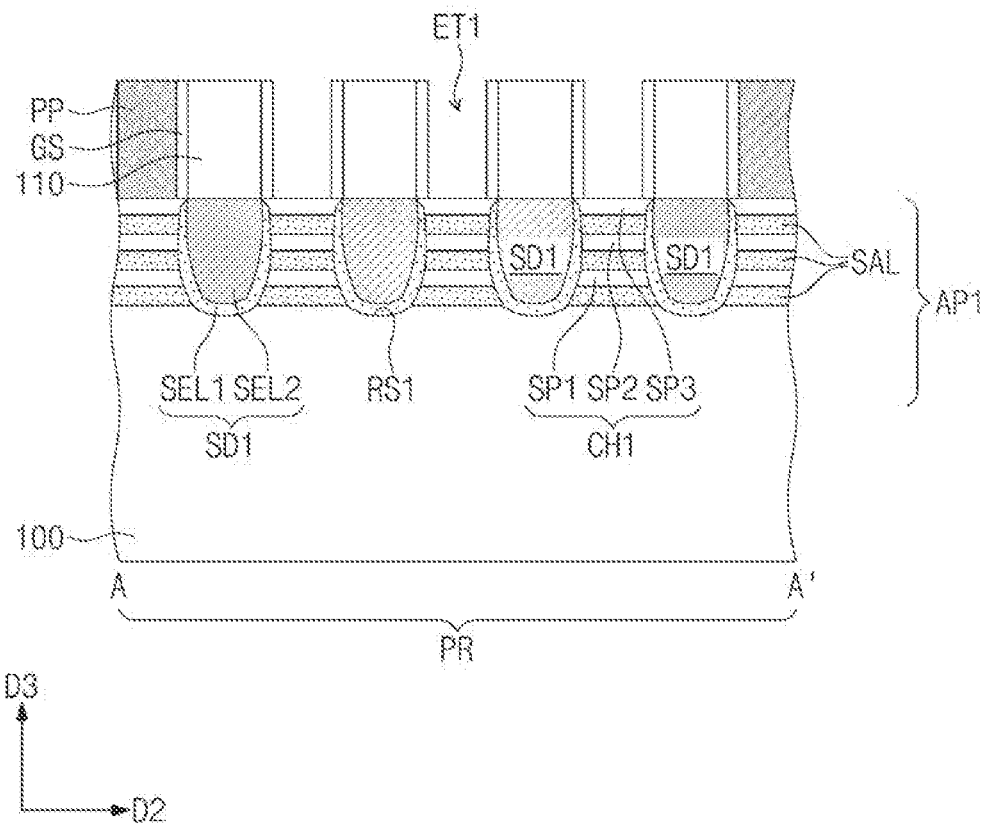
Figure 7B:
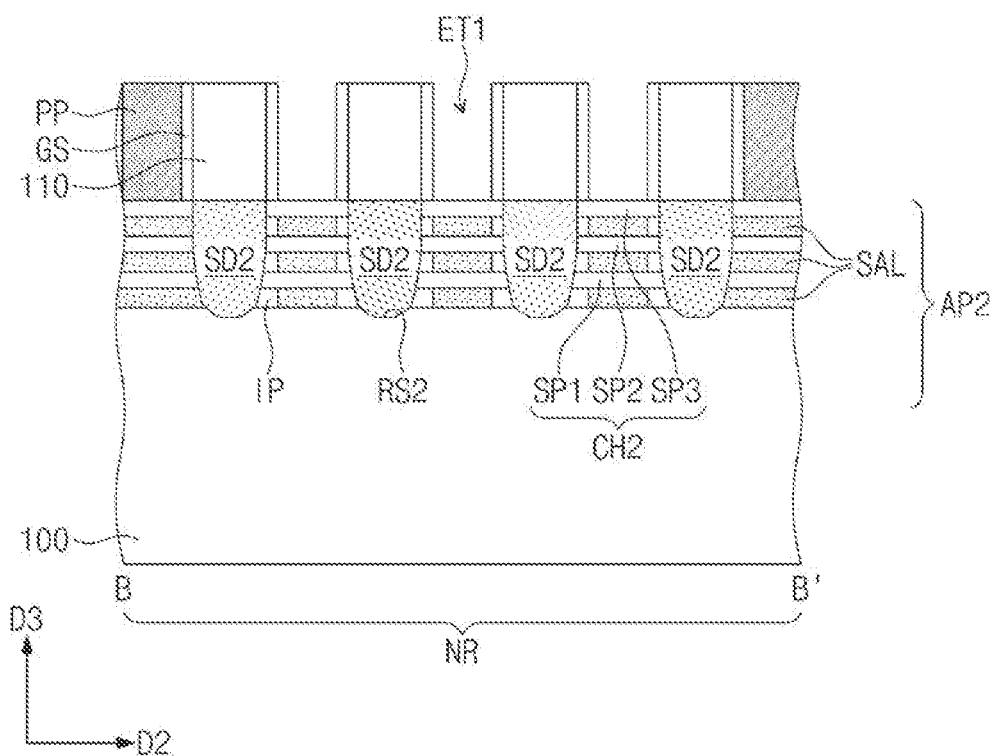
Figure 7C:
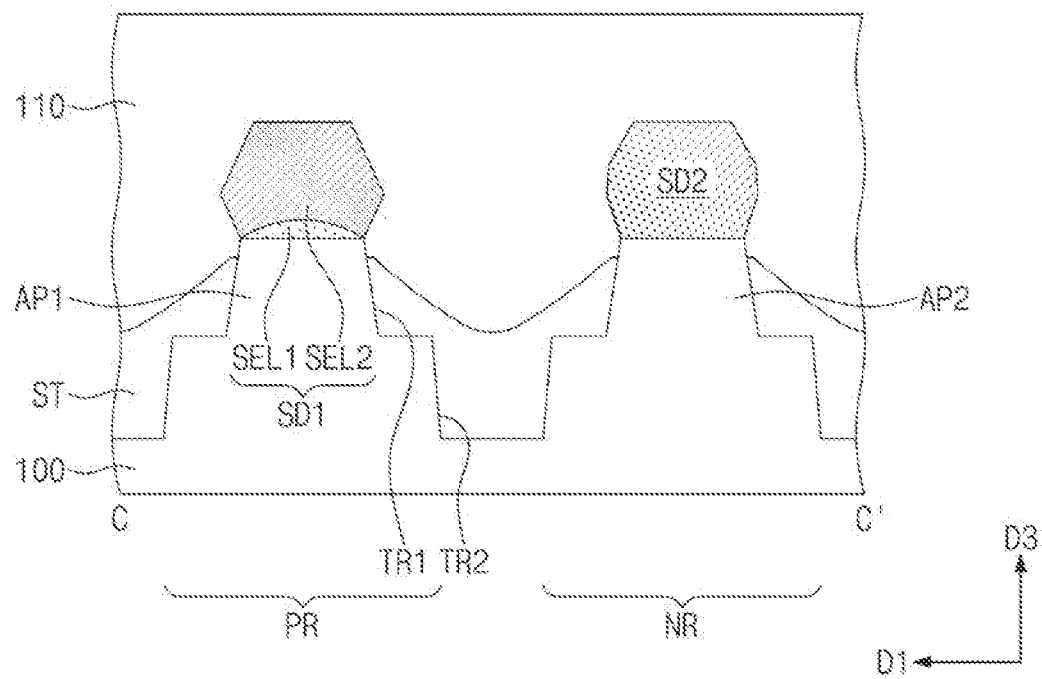
Figure 7D:
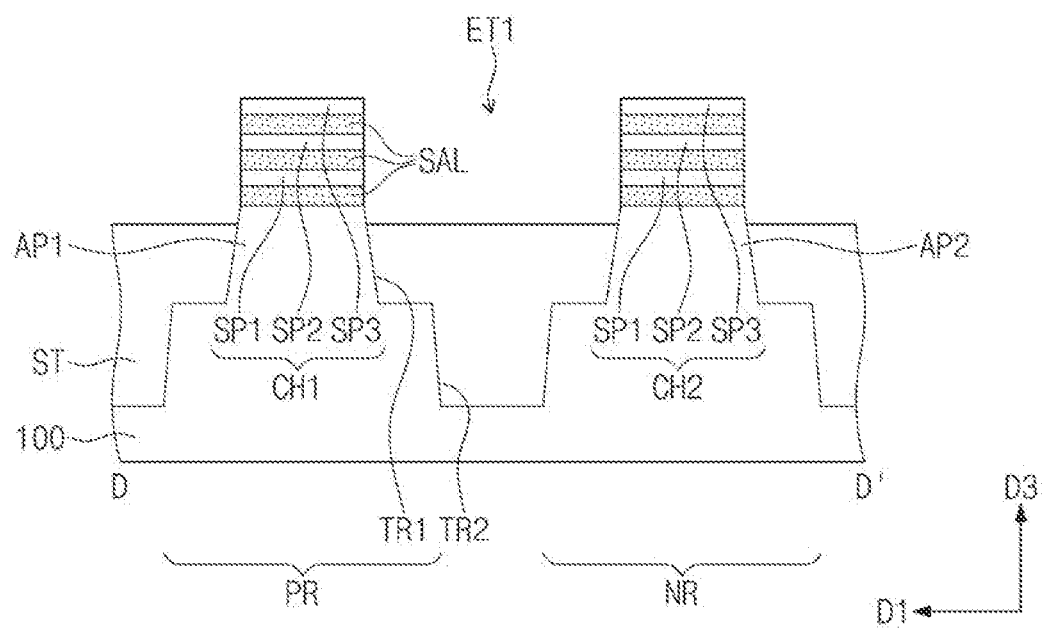

Referring to FIGS. 4A and 4B, sacrificial patterns PP may be formed on the substrate 100 to cross the first and second active patterns AP1 and AP2. Each of the sacrificial patterns PP may be a line-shaped pattern or a bar-shaped pattern extending in the first direction D1. The sacrificial patterns PP may be arranged, with a specific pitch, in the second direction D2.

In detail, the formation of the sacrificial patterns PP may include forming a sacrificial layer on the substrate 100, forming hard mask patterns MK on the sacrificial layer, and the patterning the sacrificial layer using the hard mask patterns MK as an etch mask. The sacrificial layer may be formed of or include poly silicon.

A pair of the gate spacers GS may be formed on opposite side surfaces of each of the sacrificial patterns PP. That is, a gate spacer GS may be formed on each side surface of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. Alternatively, the gate spacer layer may include at least two layers, each of which is formed of at least one of SiCN, SiCON, or SiN; that is, the gate spacer layer may have a multi-layered structure.

Referring to FIGS. 5A to 5D, the first recesses RS1 may be formed in an upper portion of the first active pattern AP1. The second recesses RS2 may be formed in upper portions of the second active pattern AP2. During the formation of the first and second recesses RS1 and RS2, the device isolation layer ST may be recessed at both sides of each of the first and second active patterns AP1 and AP2 (e.g., see FIG. 5C).

In detail, the first recesses RS1 may be formed by etching the upper portion of the first active pattern AP1 using the hard mask patterns MK and the gate spacers GS as an etch mask. Each of the first recesses RS1 may be formed between each pair of the sacrificial patterns PP. The second recesses RS2 in the upper portion of the second active pattern AP2 may be formed by the same method as that for the first recesses RS1, and thus a repeated description is omitted for conciseness. The first semiconductor pattern SP1, the second semiconductor pattern SP2, and the third semiconductor pattern SP3 may be formed by the first and second recesses RS1 and RS2.

Referring to FIGS. 6A to 6D, a first SEG process, in which an inner side surface of the first recess RS1 is used as a seed layer, may be performed to form the first semiconductor layer SEL1. The first semiconductor layer SEL1 may be grown using the first to third semiconductor patterns SP1, SP2, and SP3 and the substrate 100, which are exposed through the first recesses RS1, as a seed. As an example, the first SEG process may include a chemical vapor deposition (CVD) process or a molecular beam epitaxy (MBE) process.

The first semiconductor layer SEL1 may be formed of or include a semiconductor material (e.g., SiGe) having a lattice constant greater than that of the substrate 100. In some embodiments, the first semiconductor layer SEL1 may be formed to have a relatively low germanium concentration. In another embodiment, the first semiconductor layer SEL1 may contain only silicon (Si) and not germanium (Ge). The germanium concentration of the first semiconductor layer SEL1 may range from 0 at % to 10 at %.

The second semiconductor layer SEL2 may be formed by performing a second SEG process on the first semiconductor layer SELL. The second semiconductor layer SEL2 may be formed to completely fill the first recess RS1. The second semiconductor layer SEL2 may be formed to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. The first and second semiconductor layers SEL1 and SEL2 may be doped with impurities in situ during the first and second SEG processes. Alternatively, the first source/drain pattern SD1 may be doped with impurities, after the formation of the first source/drain pattern SD1. The first source/drain pattern SD1 may be doped to have the first conductivity type (e.g., a p-type).

The second source/drain patterns SD2 may be formed in an upper portion of the second active pattern AP2. In detail, a selective epitaxial growth process, in which an inner side surface of the second recess RS2 is used as a seed layer, may be performed to form the second source/drain pattern SD2. The second source/drain patterns SD2 may be formed of or include the same semiconductor material (e.g., Si) as the substrate 100. The second source/drain patterns SD2 may be doped to have the second conductivity type (e.g., an n-type).

The sacrificial layers SAL, which are exposed through the second recess RS2, may be partially removed before the formation of the second source/drain pattern SD2. The inner spacer IP may be formed by filling a region, which is formed by partially removing the sacrificial layers SAL, with an insulating material.

Referring to FIGS. 7A to 7D, the first interlayer insulating layer 110 may be formed to cover the first and second source/drain patterns SD1 and SD2, the hard mask patterns MK, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayered insulating layer 110 may be performed using an etch-back or chemical mechanical polishing (CMP) process. All of the hard mask patterns MK may be removed during the planarization process. Accordingly, the first interlayer insulating layer 110 may have a top surface that is coplanar with the top surfaces of the sacrificial patterns PP and the top surfaces of the gate spacers GS.

In an embodiment, the exposed sacrificial patterns PP may be selectively removed. As a result of the removal of the sacrificial patterns PP, first empty spaces ET1 may be formed to expose the first and second active patterns AP1 and AP2 (e.g., see FIG. 7D).

In an embodiment, some of the sacrificial patterns PP may not be removed. For example, the sacrificial pattern PP located on a cell boundary may not be removed. In detail, by forming a mask layer on the sacrificial patterns PP that should not be removed, it may be possible to prevent the unintended ones of the sacrificial patterns PP from being removed. As a result of the removal of the sacrificial pattern PP, the first and second active patterns AP1 and AP2 may be exposed through the first empty space ET1. The sacrificial layers SAL of each of the first and second active patterns AP1 and AP2 may be exposed through the first empty space ET1.

Referring to FIGS. 8A to 8D, the sacrificial layers SAL exposed through the first empty space ET1 may be selectively removed. In detail, an etching process of selectively etching only the sacrificial layers SAL may be performed to remove only the sacrificial layers SAL and to leave the first to third semiconductor patterns SP1, SP2, and SP3. Due to the inner spacers IP, it may be possible to prevent a defect from occurring in the second source/drain pattern SD2 during this process.

Second empty spaces ET2 may be formed as a result of the removal of the sacrificial layers SAL. The second empty spaces ET2 may be defined between the first to third semiconductor patterns SP1, SP2, and SP3.

Figure 9A:
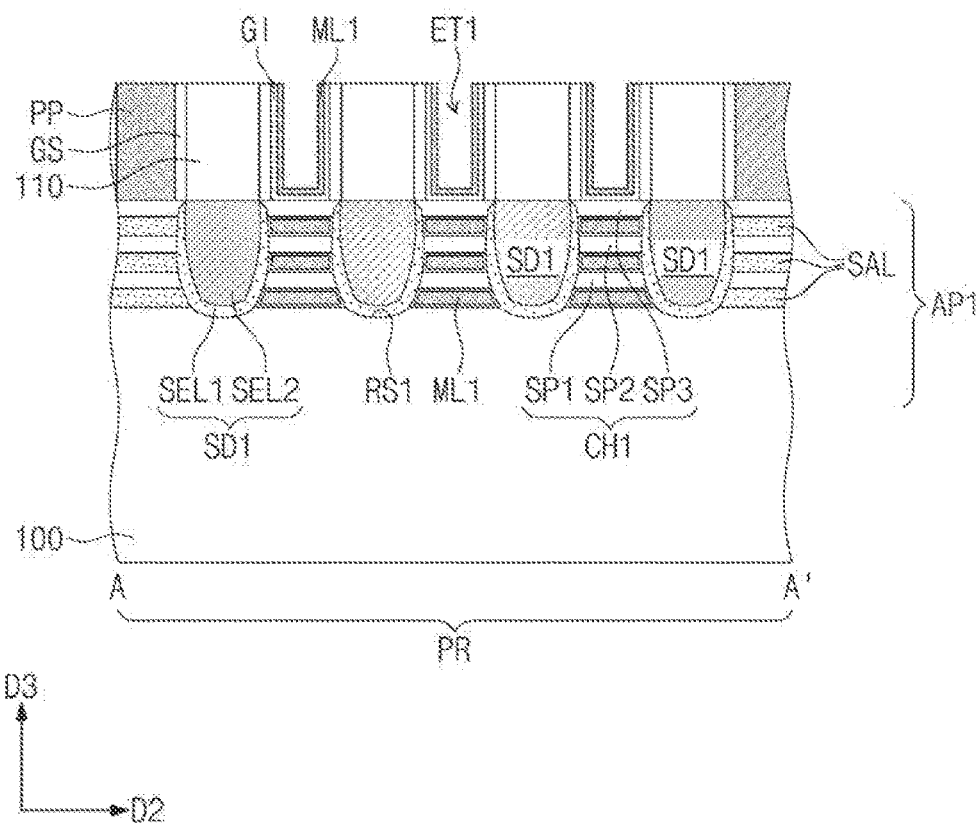
Figure 9B:
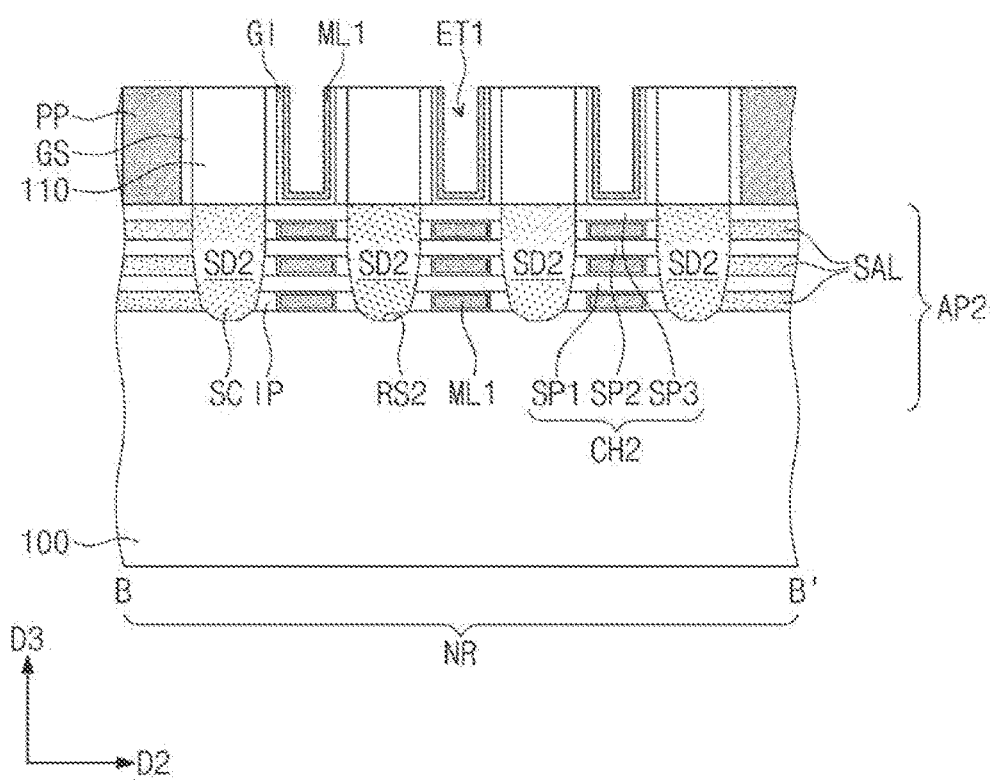
Figure 9C:
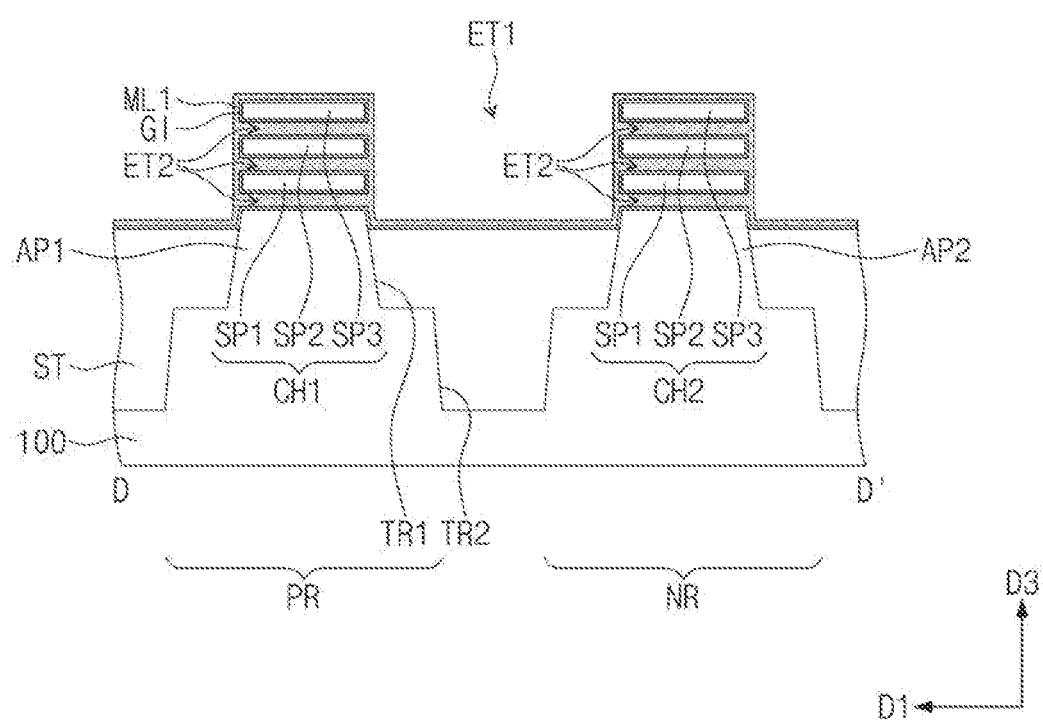

Referring to FIGS. 9A to 9C, the gate insulating layer GI may be conformally formed in the first and second empty spaces ET1 and ET2. The gate insulating layer GI may cover the first to third semiconductor patterns SP1, SP2, and SP3. The gate insulating layer GI may be extended to cover an inner side surface of the gate spacer GS.

A first metal layer ML1 may be formed on the gate insulating layer GI. The first metal layer ML1 may be conformally formed on the gate insulating layer GI. The first metal layer ML1 may fully fill the second empty spaces ET2. The first metal layer ML1 may partially fill the first empty space ET1. The first metal layer ML1 may include a metal nitride layer. For example, the first metal layer ML1 may include at least one metal, which is selected from the group consisting of titanium (Ti), tantalum (Ta), aluminum (Al), tungsten (W) and molybdenum (Mo), and nitrogen (N). In an embodiment, the first metal layer ML1 may further include carbon (C). The first metal layer ML1 may include a plurality of work function metal layers, which are sequentially stacked.

Figure 10A:
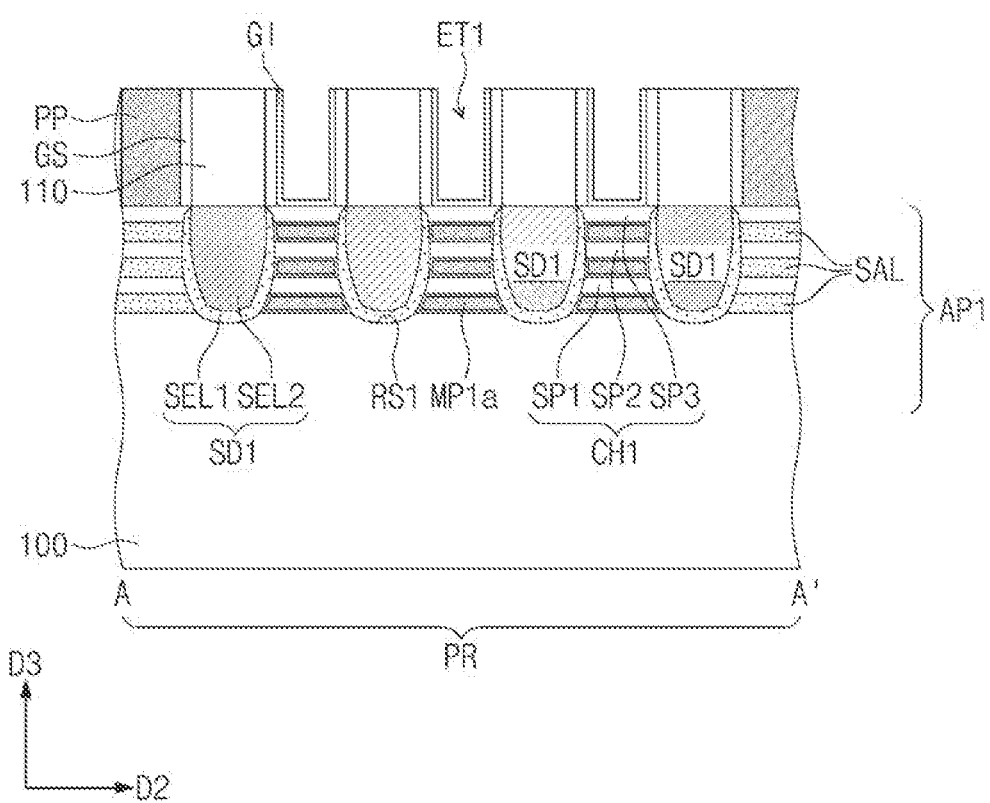
Figure 10B:
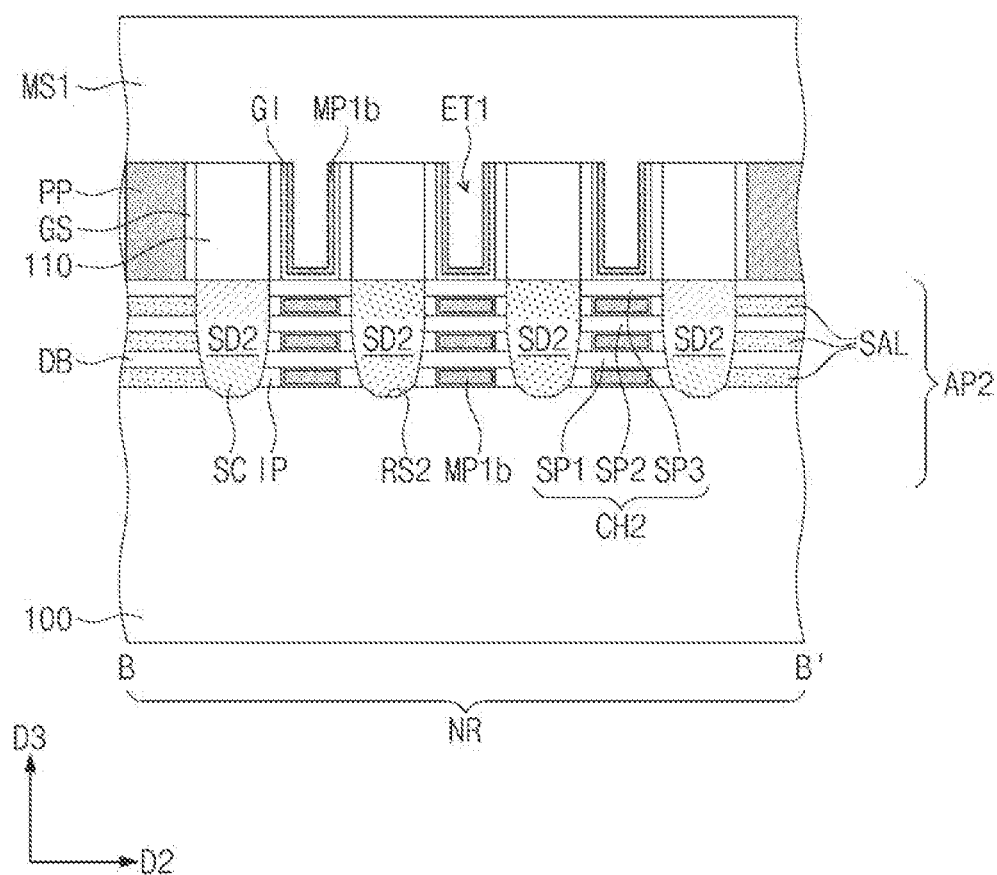
Figure 10C:
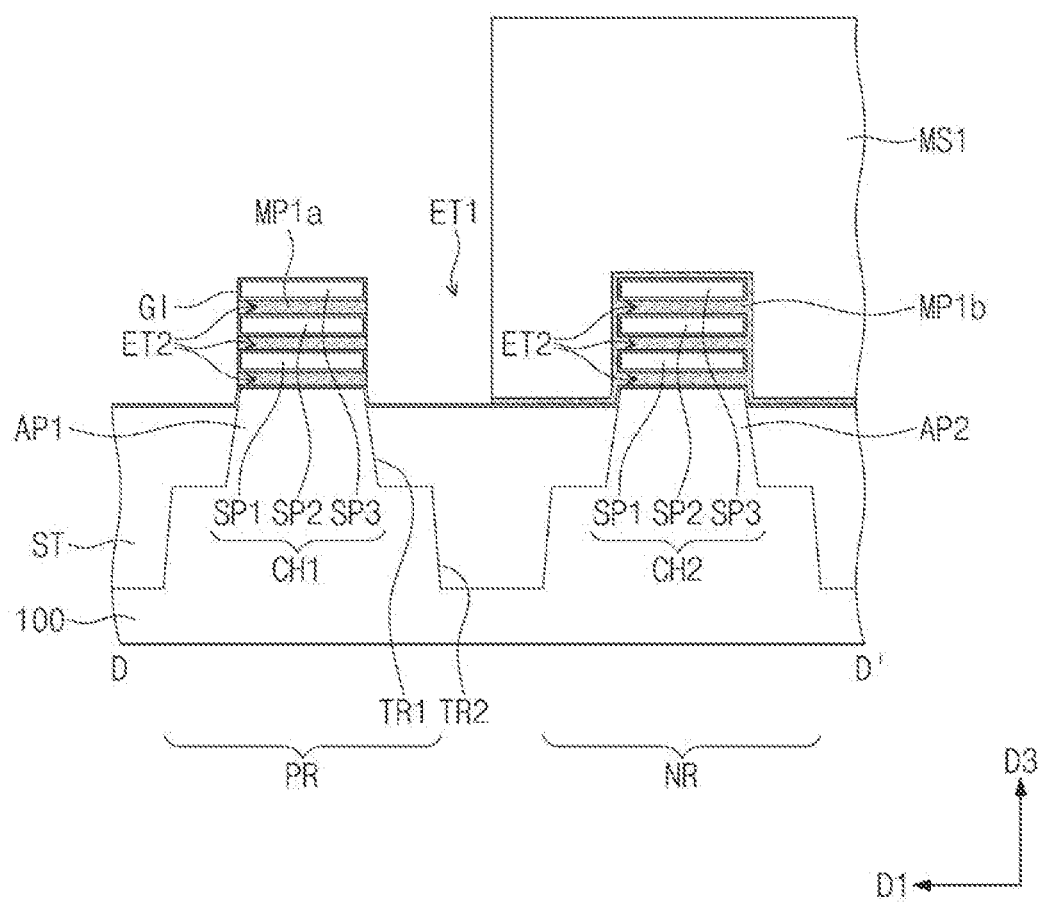

Referring to FIGS. 10A to 10C, the first metal layer ML1 may be partially removed by an etching process. As a result of the etching process, a first metal pattern MP1a and the first metal pattern MP1b may be formed on the first active region PR and the second active region NR, respectively. The etching process may be performed using a first mask pattern MS1 covering the second active region NR. In an embodiment, the first mask pattern MS1 may include a silicon oxide layer and/or a photoresist layer. The first metal pattern MP1a on the first active region PR may be locally left within the second empty spaces ET2 and may be removed from the first empty spaces ET1. The first metal layer ML1 on the second active region NR may be protected by the first mask pattern MS1. The etching process may be a wet etching process.

Figure 11A:
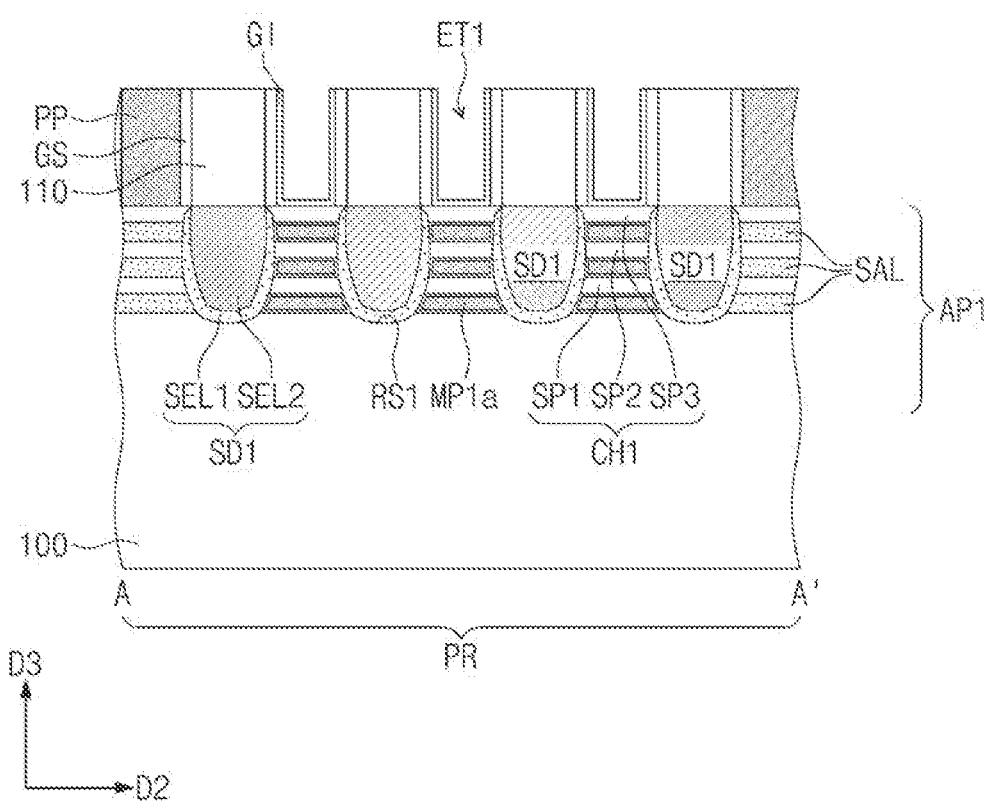
Figure 11B:
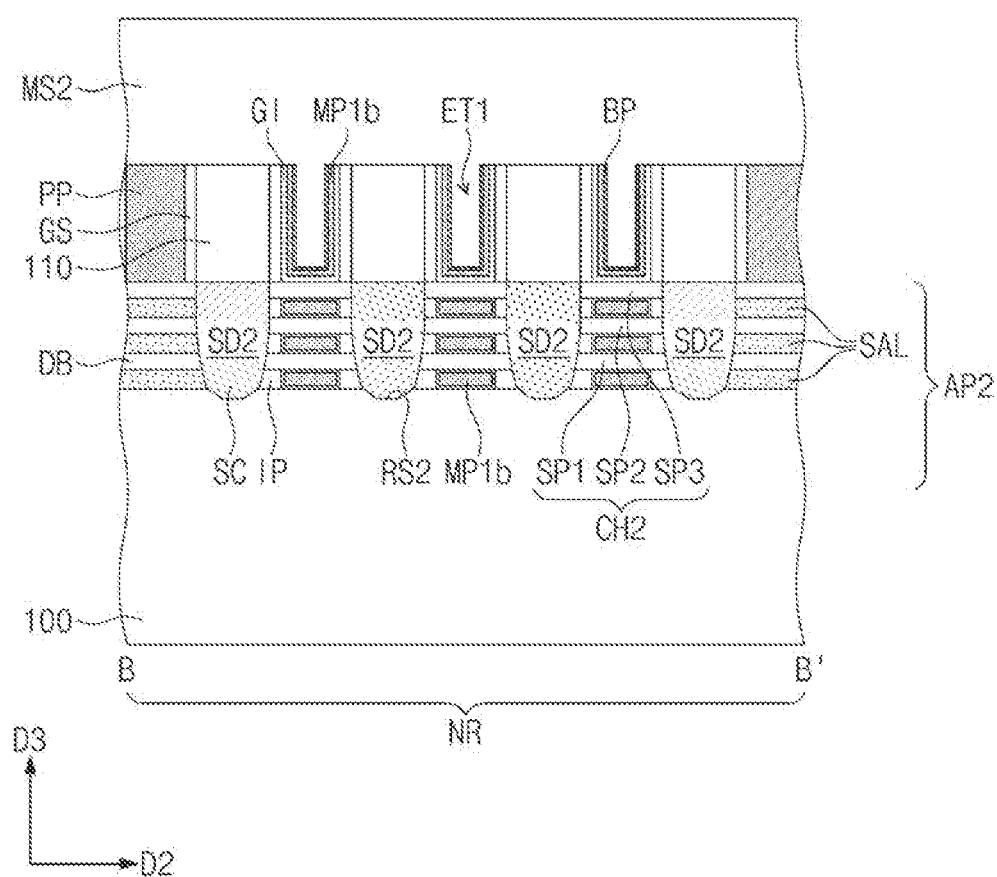
Figure 11C:
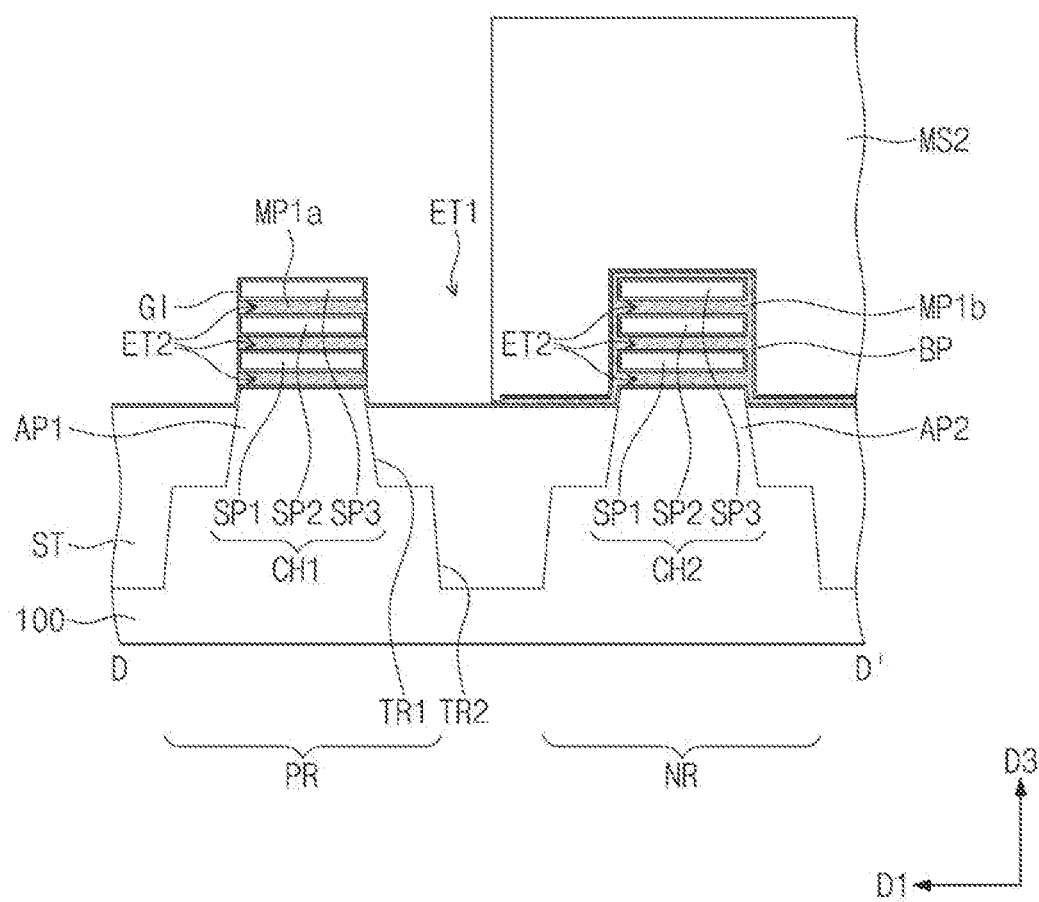

Referring to FIGS. 11A to 11C, the first mask pattern MS1 may be removed, and then the etch barrier pattern BP may be formed on the second active region NR. The formation of the etch barrier pattern BP may include conformally forming an etch barrier layer and forming a second mask pattern MS2 on the second active region NR. The etch barrier pattern BP may be formed by etching the etch barrier layer using the second mask pattern MS2. The etch barrier pattern BP may cover the end portion EG1 of the first metal pattern MP1b on the second active region NR.

In detail, the etch barrier pattern BP may cover the side surface SF of the end portion EG1 of the first metal pattern MP1b, as described with reference to FIG. 2F. As a result, the end portion EG1 of the first metal pattern MP1b may not be exposed to an etching solution, which is used in a process of forming the etch barrier pattern BP. In an embodiment, the etch barrier pattern BP may be formed of or include a material that includes at least one of titanium (Ti), tantalum (Ta), aluminum (Al), tungsten (W), or molybdenum (Mo) and nitrogen (N) but is different from that of the first metal patterns MP1a and MP1b. As a result, at least a portion of the first metal pattern MP1b on the second active region NR may not be removed during the formation of the etch barrier pattern BP.

Figure 12A:
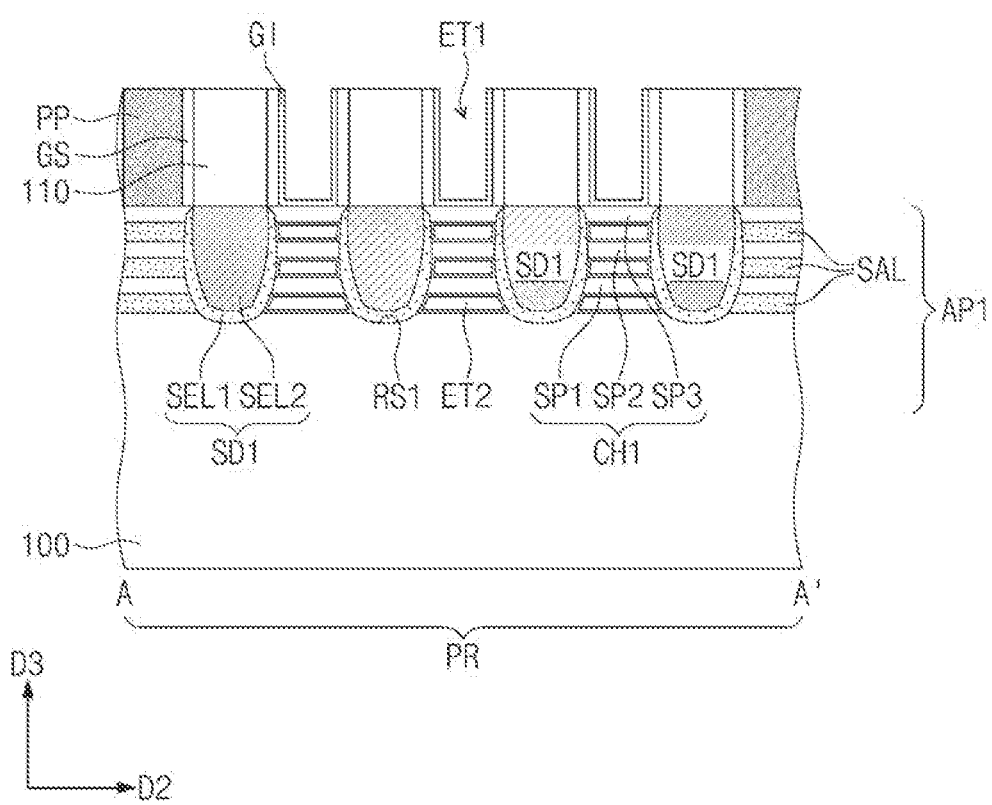
Figure 12B:
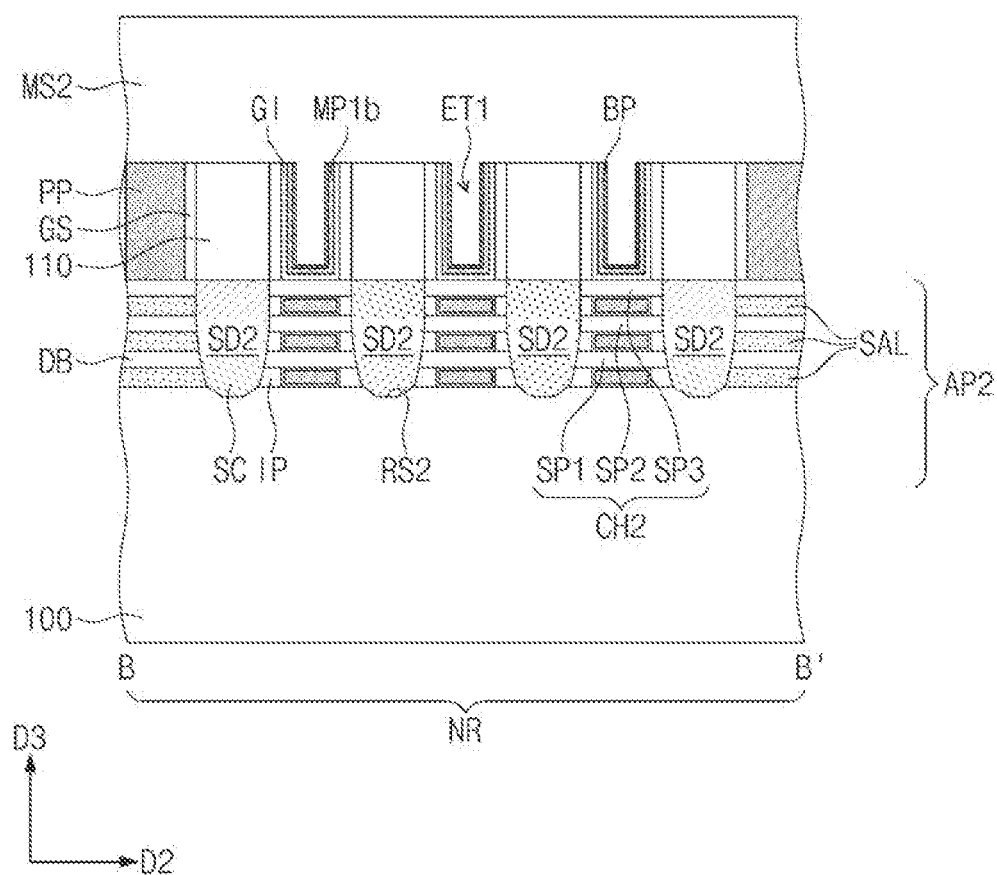
Figure 12C:
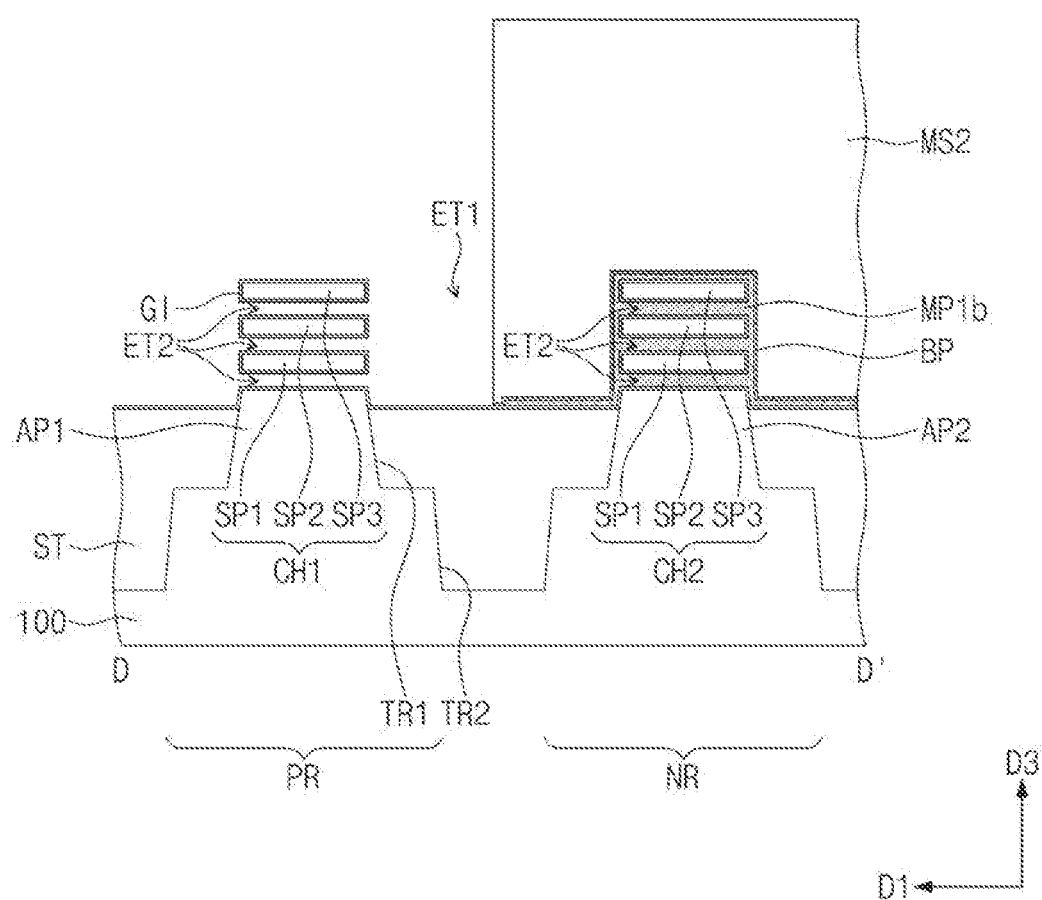

Referring to FIGS. 12A to 12C, the first metal pattern MP1a on the first active region PR may be selectively removed. This step may be performed using a recipe, which is chosen to minimize removal of the etch barrier pattern BP. As a result of the removal of the first metal pattern MP1a, the second empty spaces ET2 on the first active region PR may be re-opened.

Figure 13A:
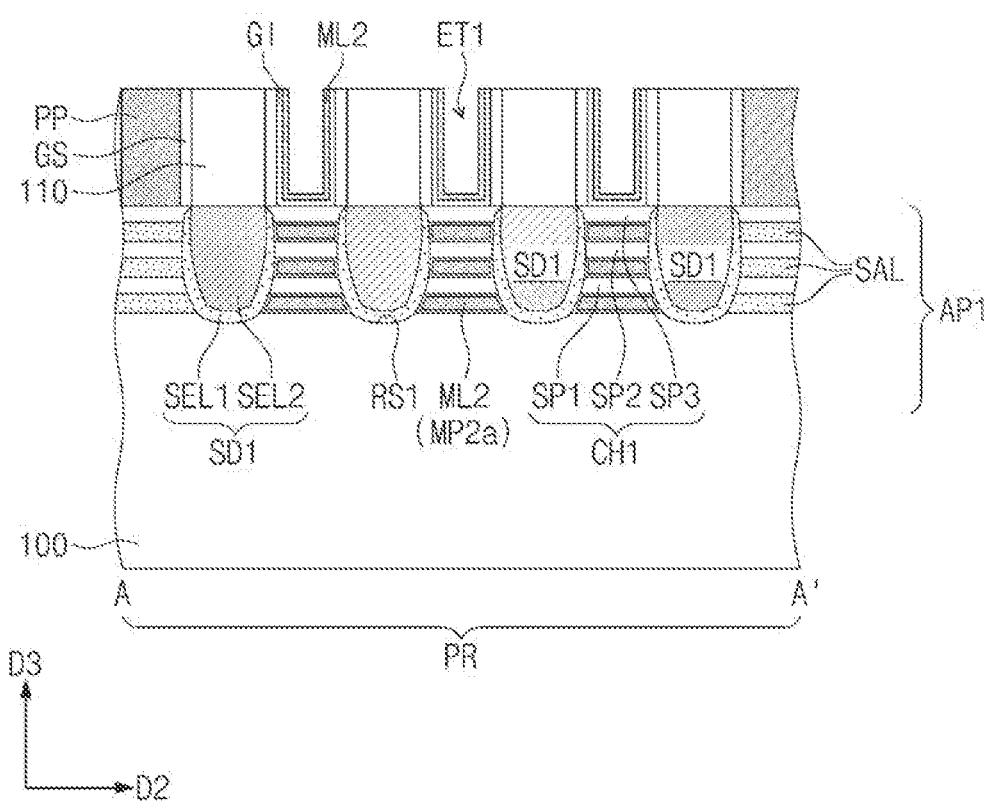
Figure 13B:
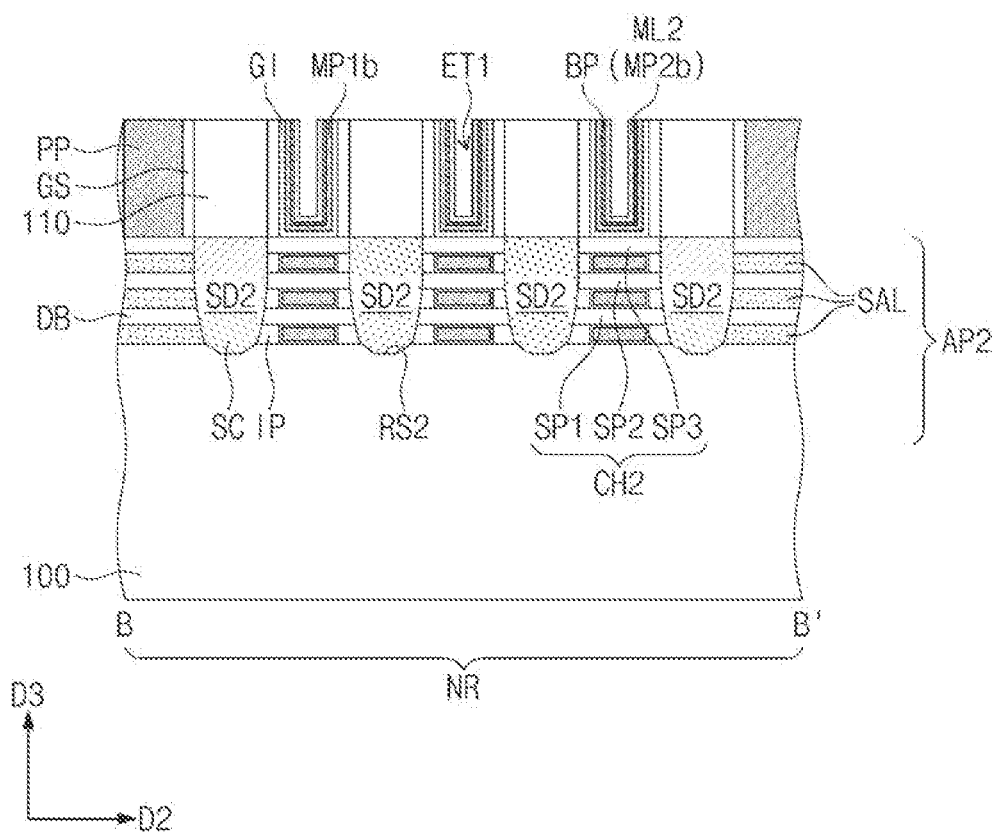
Figure 13C:
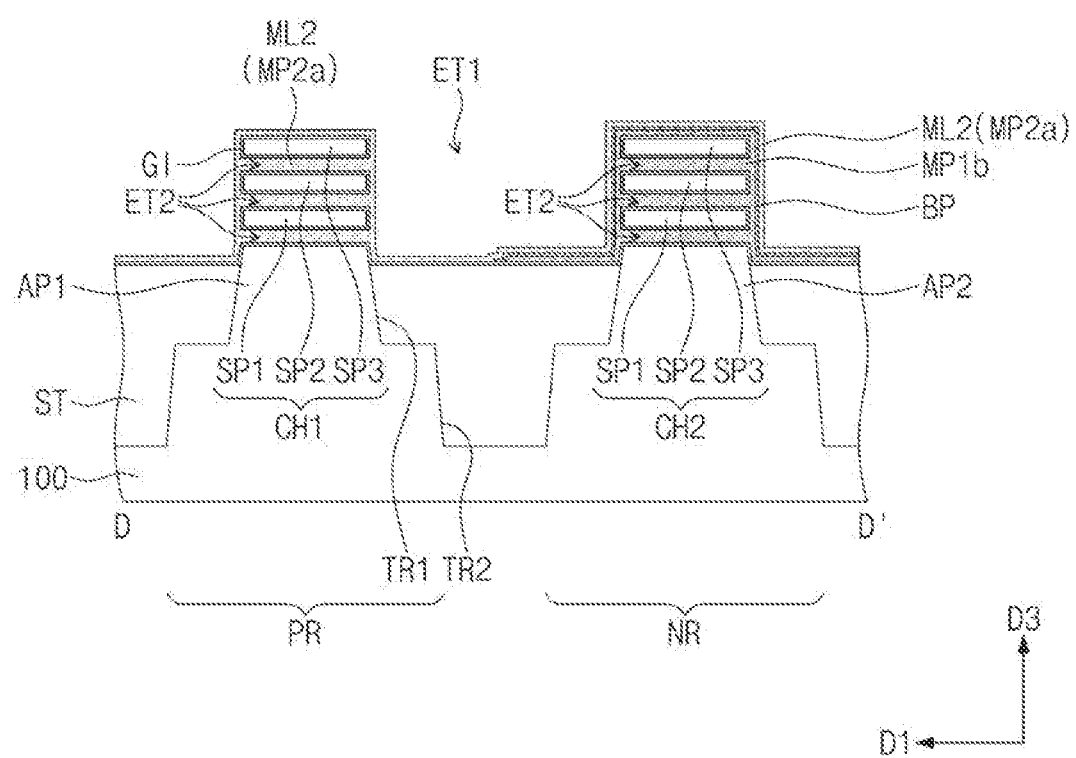

Referring to FIGS. 13A to 13C, the second mask pattern MS2 may be removed, and then, the second metal layer ML2 may be formed. The second metal pattern MP2a of the second metal layer ML2, which is formed on the first active region PR, may be formed to fill the second empty spaces ET2 and to partially fill the first empty spaces ET1. The second metal pattern MP2b of the second metal layer ML2, which is formed on the second active region NR, may be formed to cover the etch barrier pattern BP in the first empty spaces ET1.

The second metal layer ML2 may include a metal nitride layer. For example, the first metal pattern MP1b may include at least one of titanium (Ti), tantalum (Ta), aluminum (Al), tungsten (W), and molybdenum (Mo), and nitrogen (N). In an embodiment, the second metal layer ML2 may further include carbon (C). The second metal layer ML2 may include a plurality of work function metal layers, which are sequentially stacked.

Figure 14A:
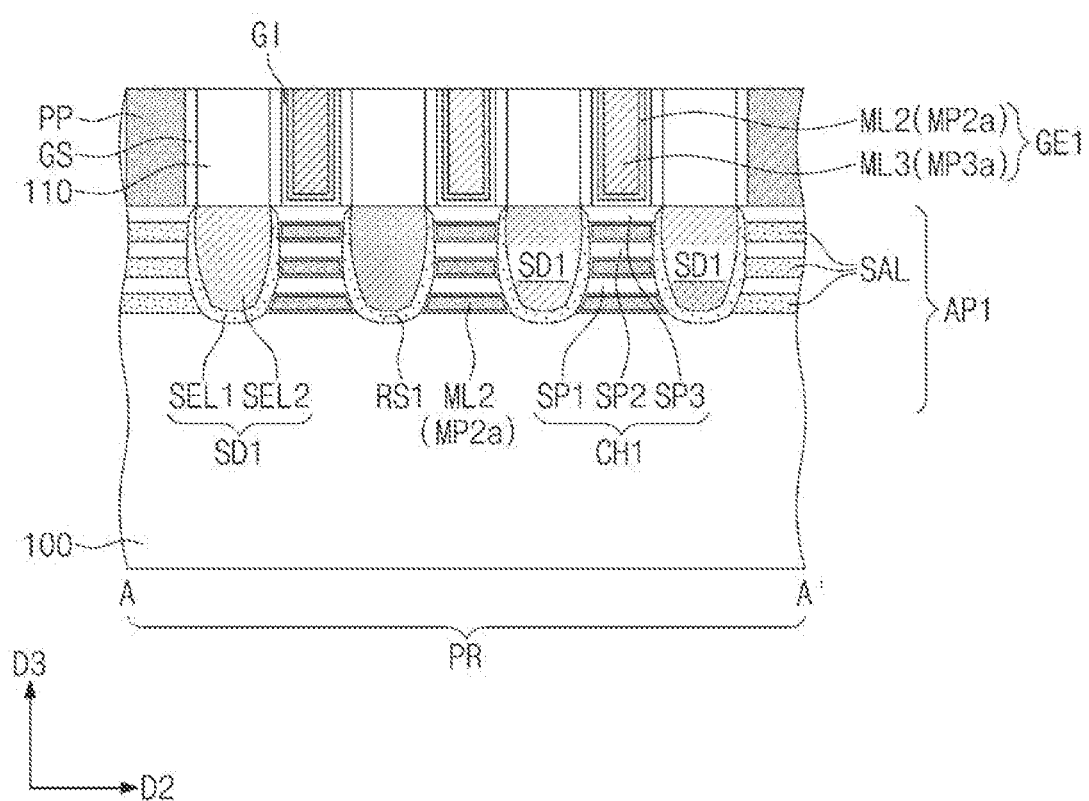
Figure 14B:
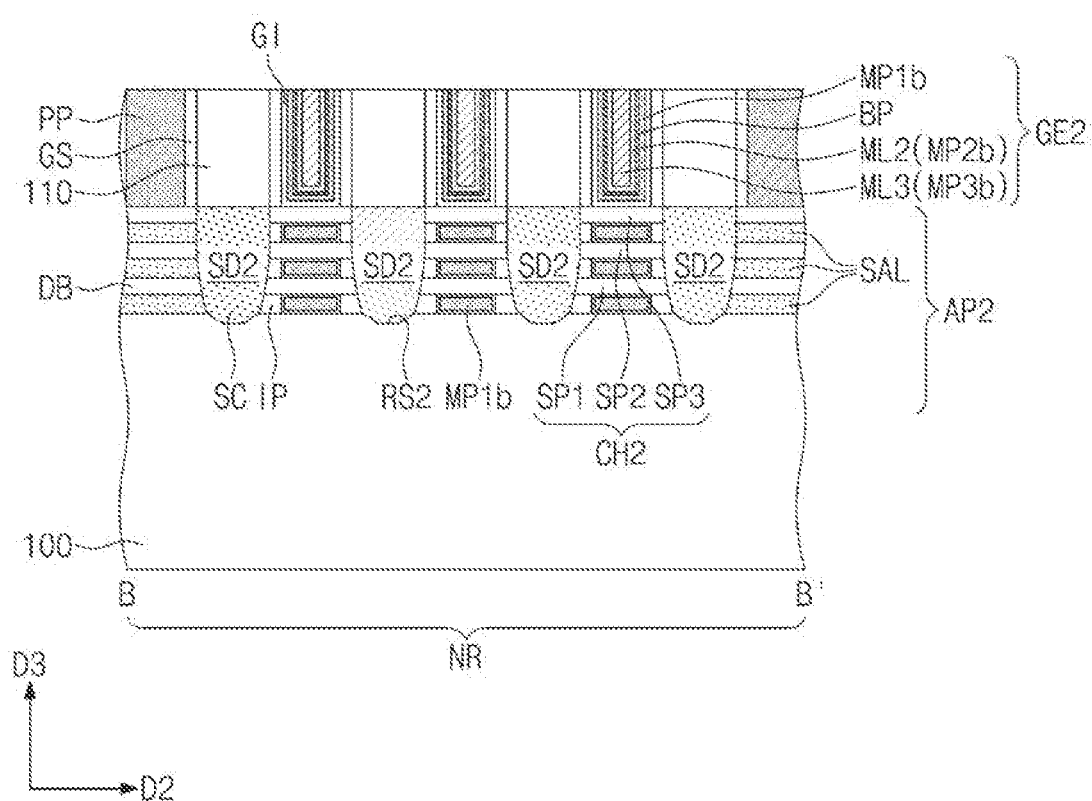
Figure 14C:
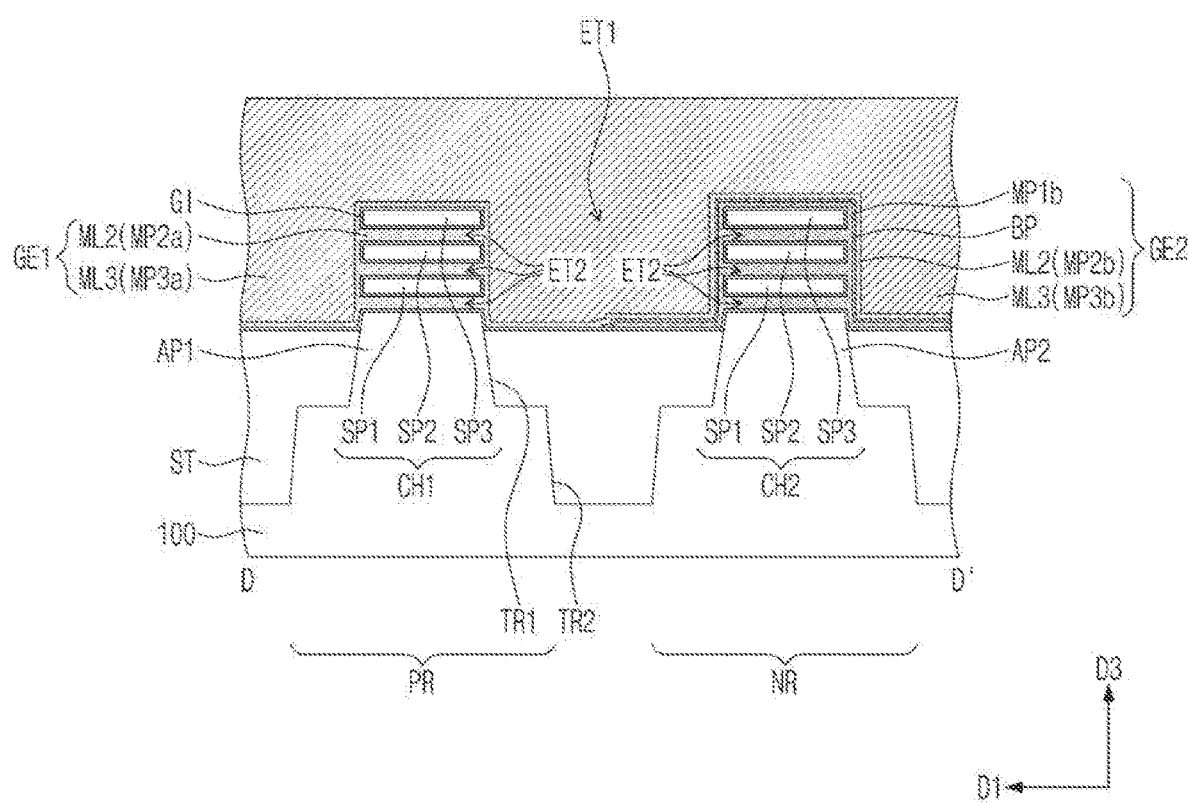

Referring to FIGS. 14A to 14C, the third metal layer ML3 may be formed on the second metal layer ML2. The third metal layer ML3 may be formed of or include a metallic material whose resistance is lower than that of the first metal pattern MP1b. For example, the third metal layer ML3 may be formed of or include at least one of tungsten (W), aluminum (Al), titanium (Ti), or tantalum (Ta). The formation of the third metal layer ML3 may include a planarization process.

Referring back to FIGS. 1 and 2A to 2F, the gate capping pattern GP may be formed on the gate electrode GE. In detail, the formation of the gate capping pattern GP may include etching an upper portion of the gate electrode GE and forming the gate capping pattern GP on the etched gate electrode GE.

The second interlayered insulating layer 120 may be formed on the first interlayered insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

A pair of the division structures DB may be formed at both sides of the logic cell. That is, a division structure DB may be formed on each side of the logic cell. The division structure DB may be formed to penetrate the second interlayer insulating layer 120, a remaining portion of the sacrificial pattern PP, and an upper portion of the active pattern AP1 or AP2 below the sacrificial pattern PP. The division structure DB may be formed of or include at least one of insulating materials (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

When a work function metal is formed on each of the first and second active regions PR and NR, a wet etching process may be performed to etch a portion of the work function metal. In the case where there is infiltration of an etching solution or a patterning failure of an etch mask in this step, the work function metal may be excessively or insufficiently etched. Accordingly, a boundary between the work function metals on the first and second active regions PR and NR may not be formed at a desired position, and in this case, it may be difficult to realize a desired threshold voltage of a transistor. That is, the electric characteristics of the semiconductor device may be deteriorated.

According to an embodiment, the etch barrier pattern BP, which has an etch selectivity with respect to the work function metals, may be used to prevent the work function metals from being damaged or misaligned, and thus, it may be possible to prevent a threshold voltage of a transistor from being changed. Accordingly, the electric characteristics of the semiconductor device may be improved.

Figure 15A:
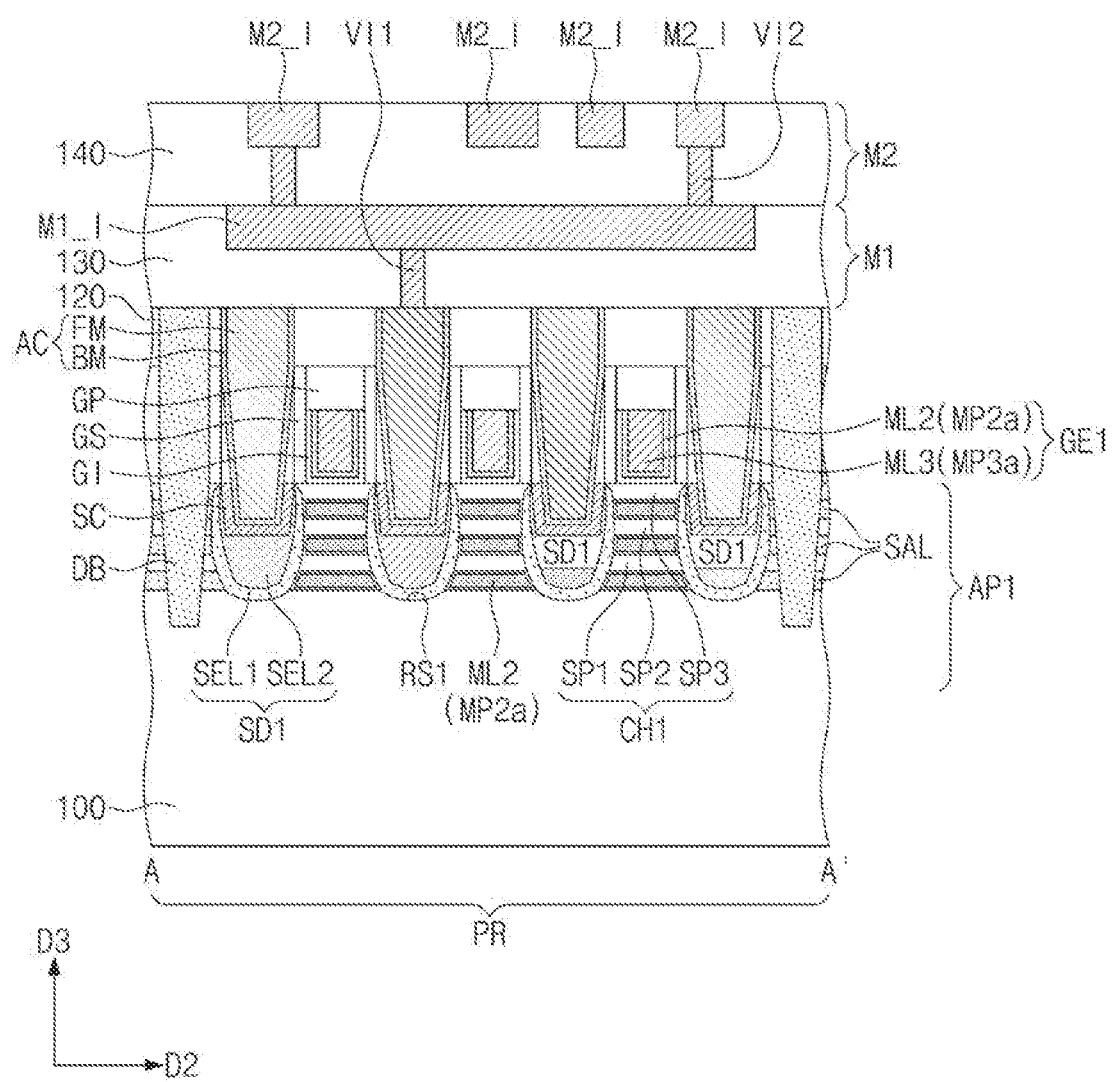
FIGS. 15A to 15C are sectional views taken along lines A-A', B-B', and D-D', respectively, of FIG. 1.
Figure 15B:
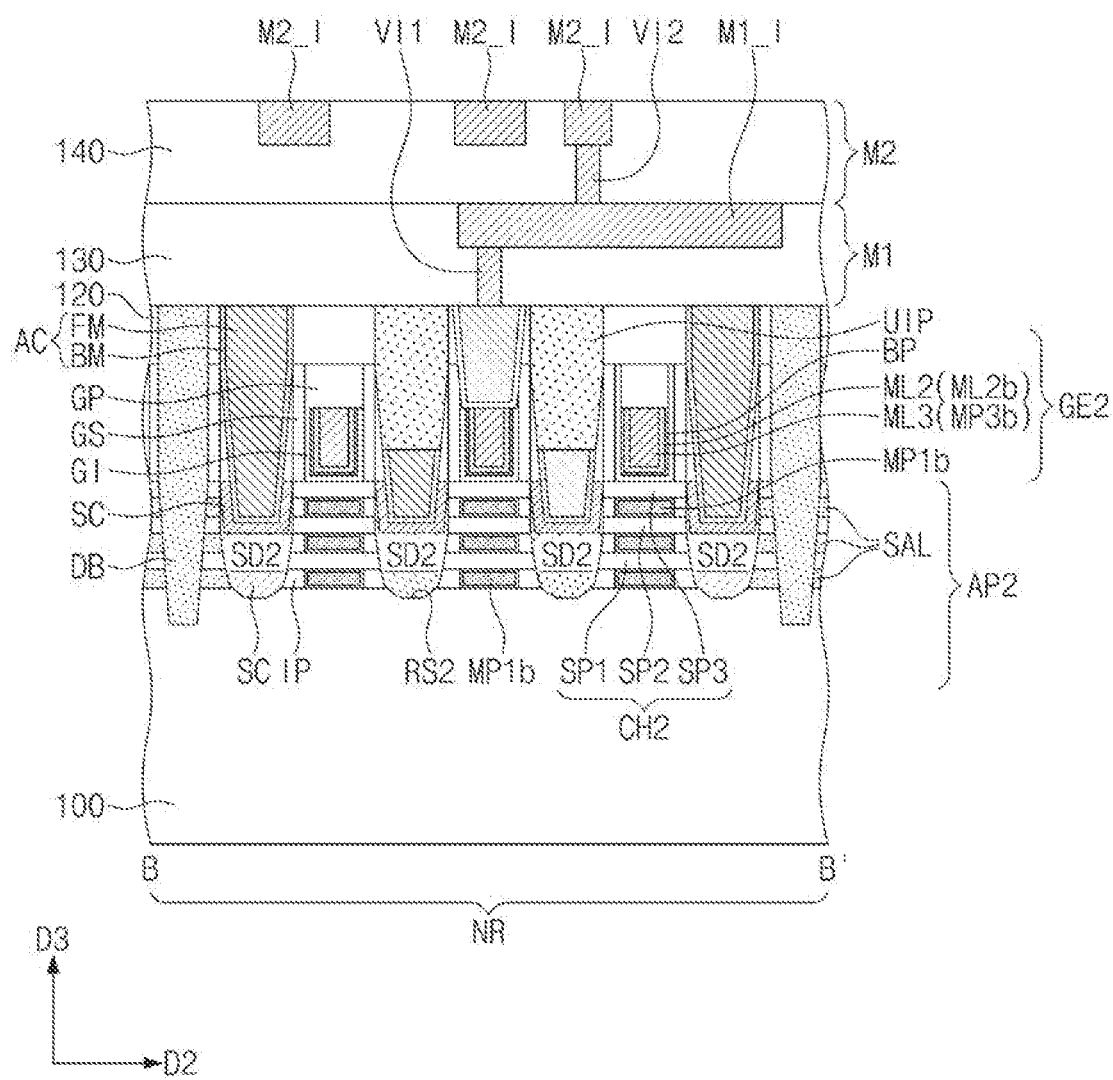
Figure 15C:
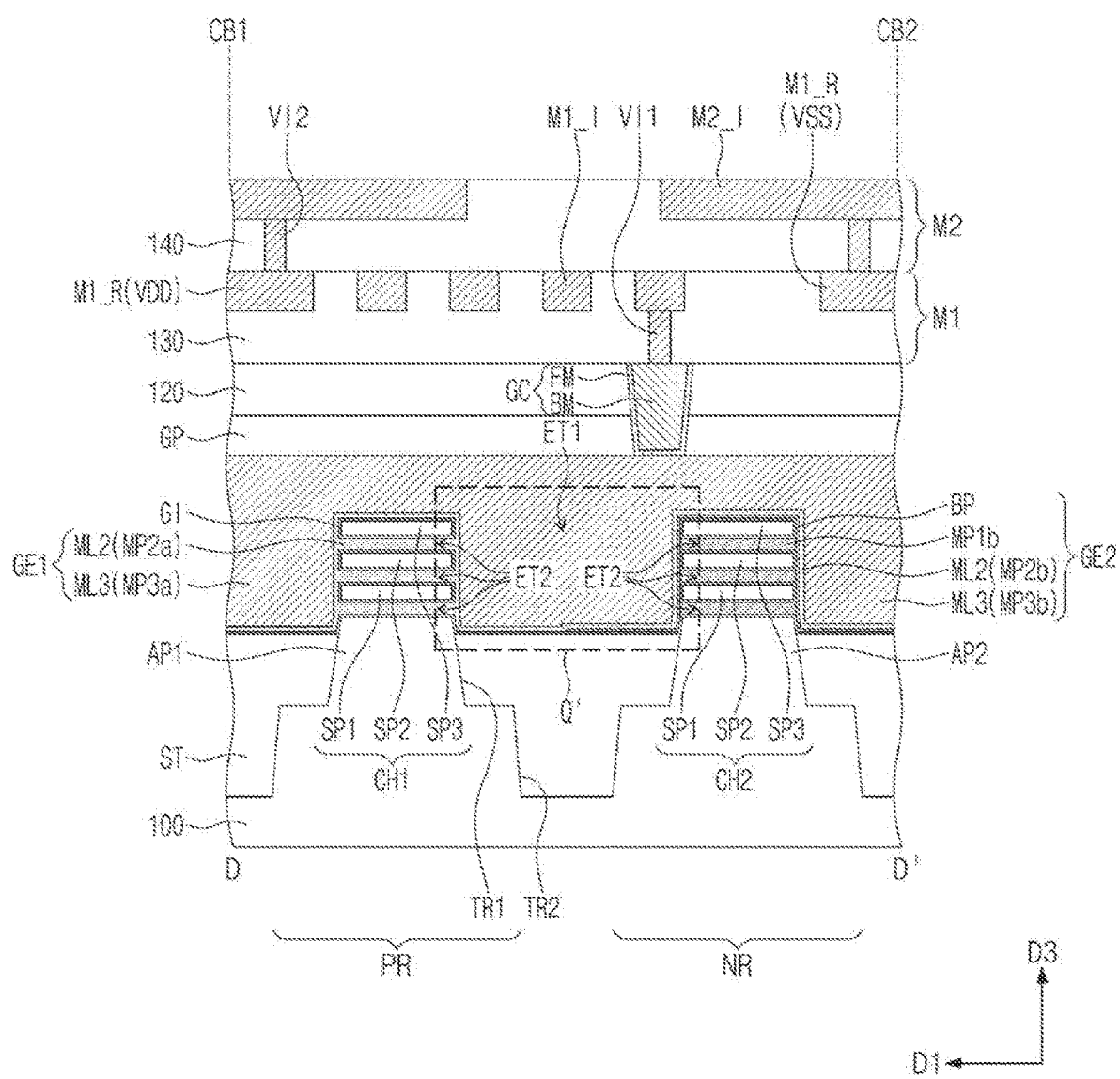
Figure 15D:
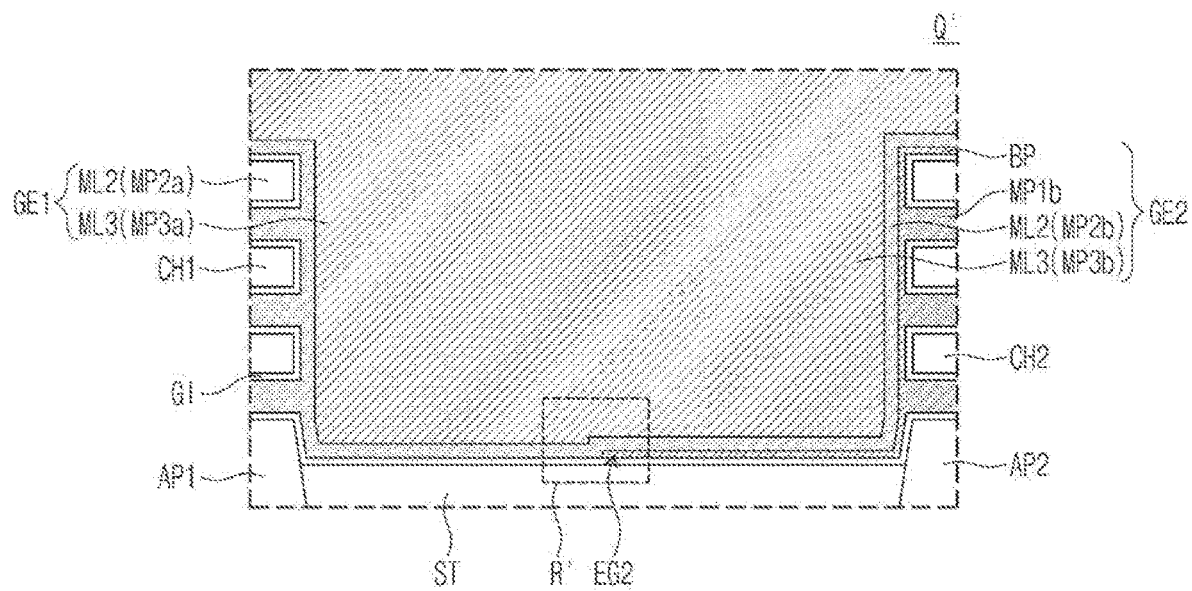
FIG. 15D is an enlarged sectional view of a portion Q' of FIG. 15C.
Figure 15E:
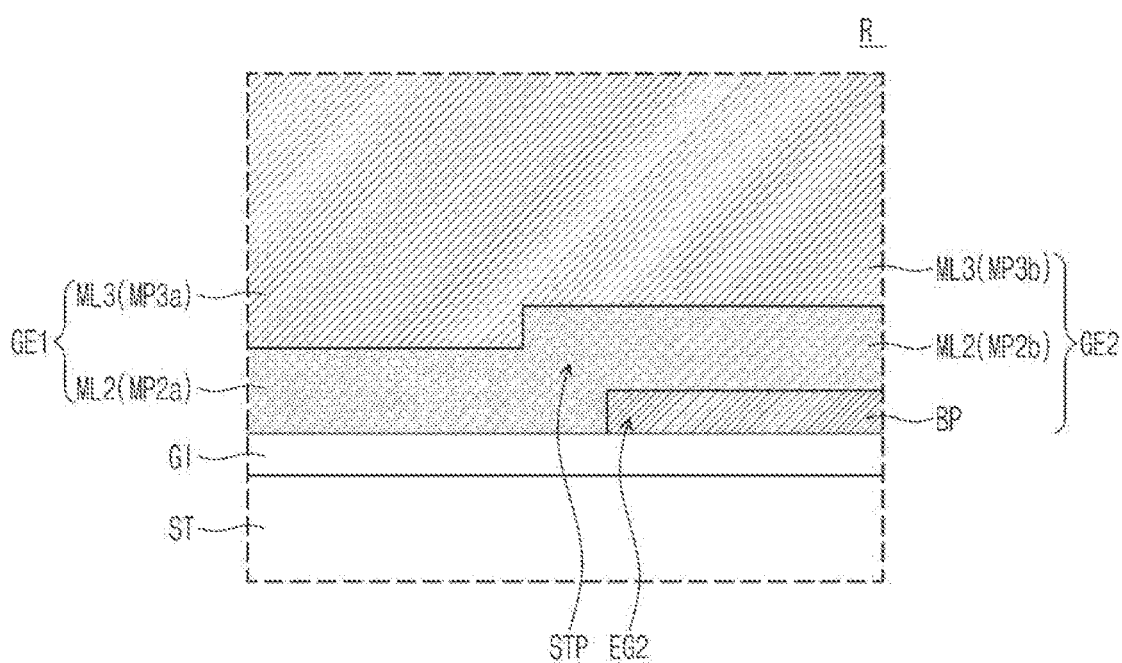
FIG. 15E is an enlarged sectional view of a portion R' of FIG. 15D.

FIGS. 15A to 15C are sectional views taken along lines A-A', B-B', and D-D', respectively, of FIG. 1. FIG. 15D is an enlarged sectional view of a portion Q' of FIG. 15C. FIG. 15E is an enlarged sectional view of a portion R' of FIG. 15D. For concise description, a previously described element may be identified by the same reference number without repeating an overlapping description thereof.

Referring to FIGS. 15A to 15E, the second electrode portion GE2 according to the embodiment illustrated in FIGS. 15A to 15E may include the first metal pattern MP1*b*, the second metal pattern MP2*b*, the etch barrier pattern BP, and the third metal pattern MP3*b*. The first metal pattern MP1*b* may be locally provided in the second empty spaces ET2 and may not be provided in the first empty spaces ET1. The first metal pattern MP1*b* may not be extended to a region on the device isolation layer ST, unlike the embodiment of FIGS. 2A to 2F. For example, the first metal pattern MP1*b* of the second electrode portion GE2 may include a plurality of patterns, which are spaced apart from each other in the third direction D3.

The etch barrier pattern BP may be in contact with the gate insulating layer GI. In an embodiment, the etch barrier pattern BP may be in contact with the top and side surfaces of the gate insulating layer GI, as shown in FIGS. 15D and 15F. The second metal layer ML2 may have a stepwise structure STP near the end portion EG2 of the etch barrier pattern BP.

FIGS. 16A to 21C are sectional views illustrating a method of fabricating a semiconductor device, according to an embodiment. FIGS. 16A, 17A, 18A, 19A, 20A, and 21A are sectional views taken along the line A-A' of FIG. 1. FIGS. 16B, 17B, 18B, 19B, 20B, and 21B are sectional views taken along the line B-B' of FIG. 1. FIGS. 16C, 17C, 18C, 19C, 20C, and 21C are sectional views taken along the line D-D' of FIG. 1. For concise description, a previously described element may be identified by the same reference number without repeating an overlapping description thereof.

Figure 16A:
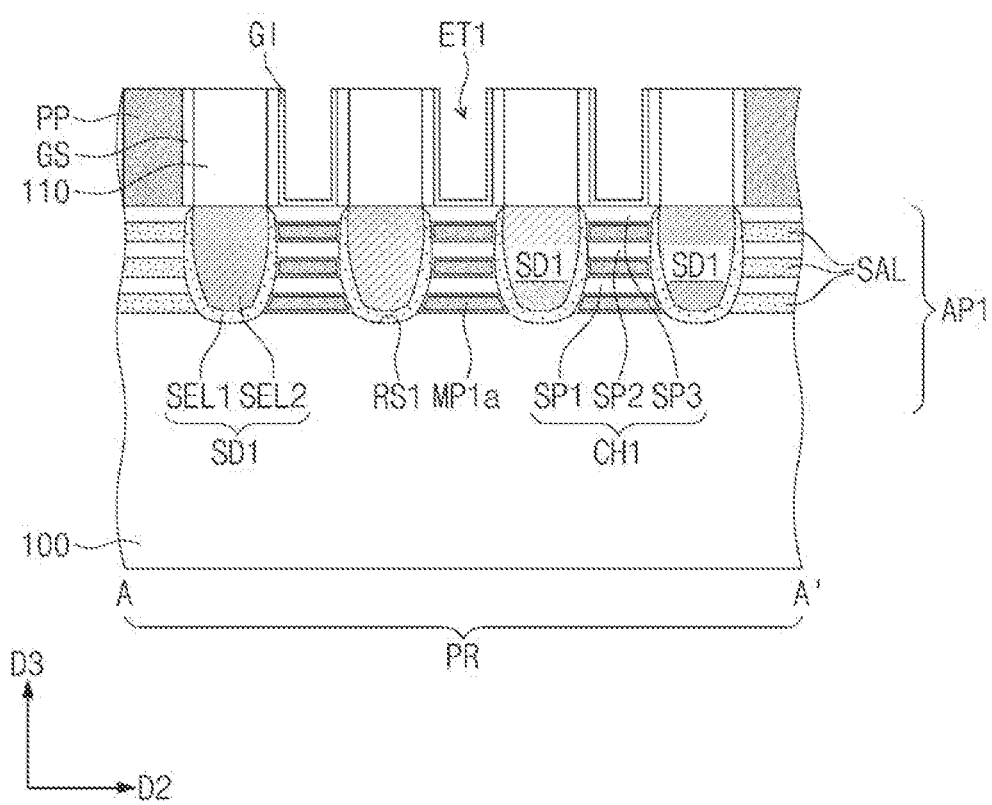
Figure 16B:
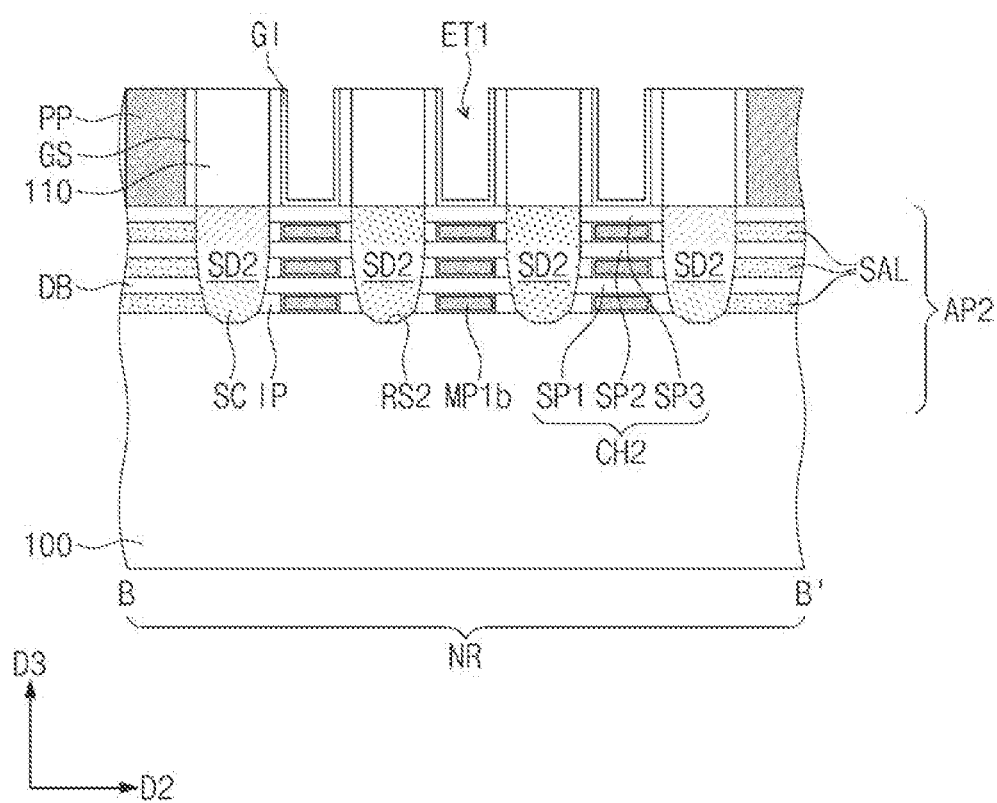
FIGS. 16B, 17B, 18B, 19B, 20B, and 21B are sectional views taken along the line B-B' of FIG. 1.
Figure 16C:
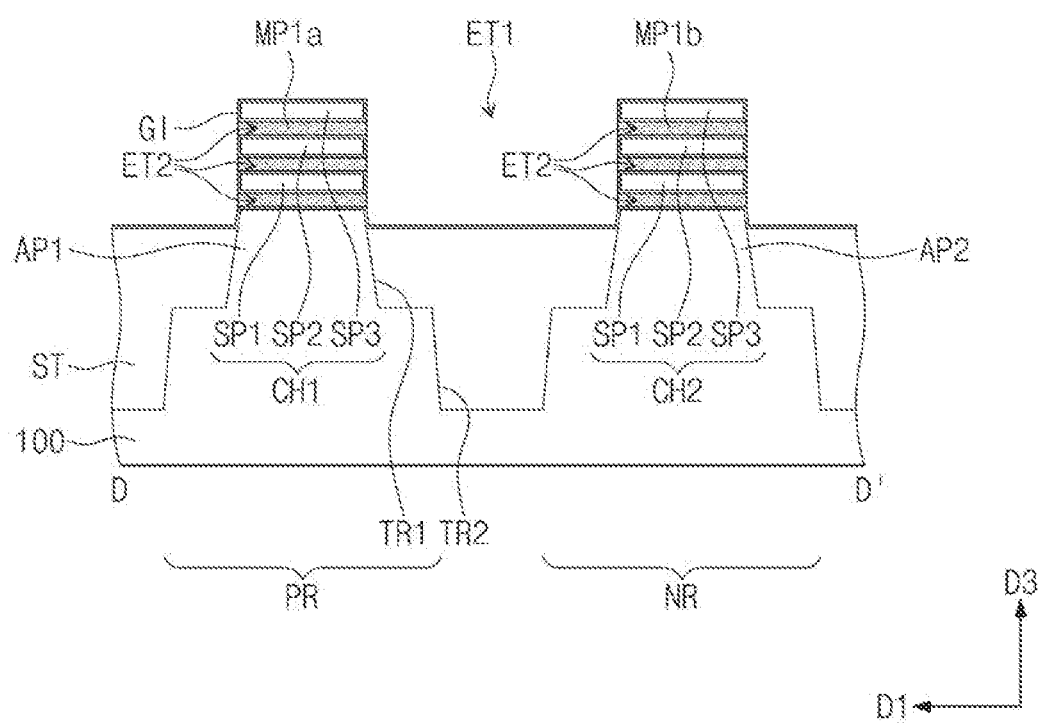

The method according to FIGS. 3A to 9C may be performed, and then, referring to FIGS. 16A to 16C, an etching process may be performed on the structure of FIGS. 9A to 9C, and as a result, the first metal pattern MP1*a* on the first active region PR and the first metal pattern MP1*b* on the second active region NR may be formed from the first metal layer ML1. The first metal pattern MP1*a* on the first active region PR may be locally left within the second empty spaces ET2 and may be removed from the first empty spaces ET1. Since, unlike the embodiment of FIG. 10C, the first metal pattern MP1*b* on the second active region NR is formed without a mask pattern, it may be removed from the first empty spaces ET1 and may be locally left in the second empty spaces ET2.

Figure 17A:
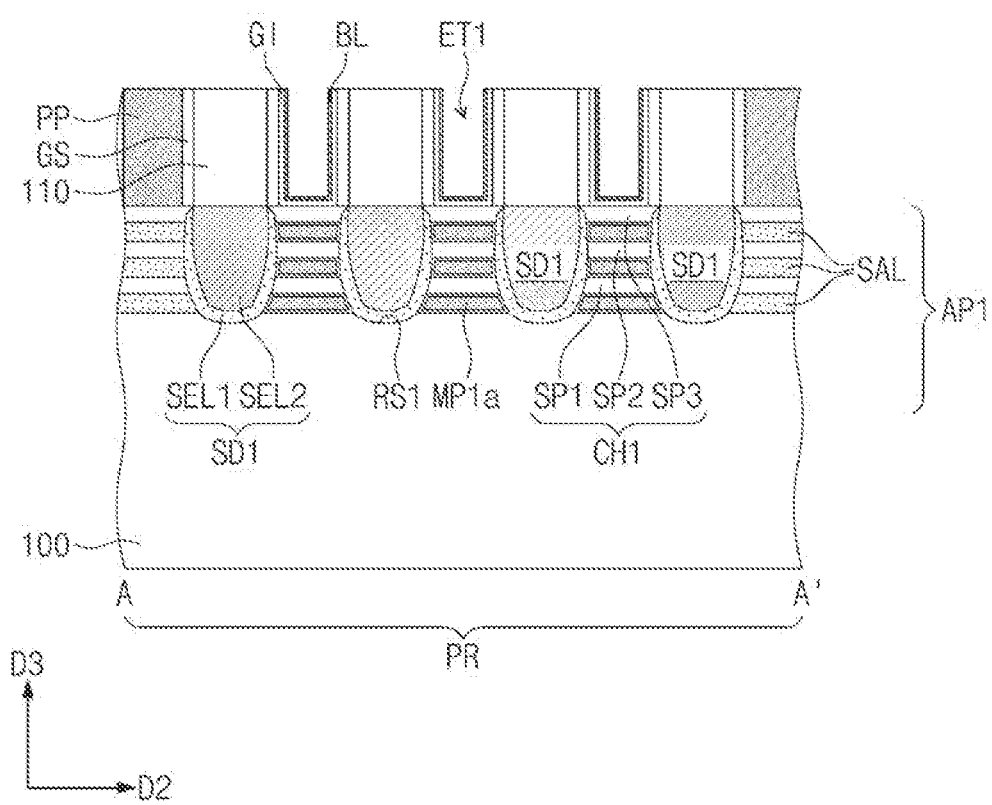
Figure 17B:
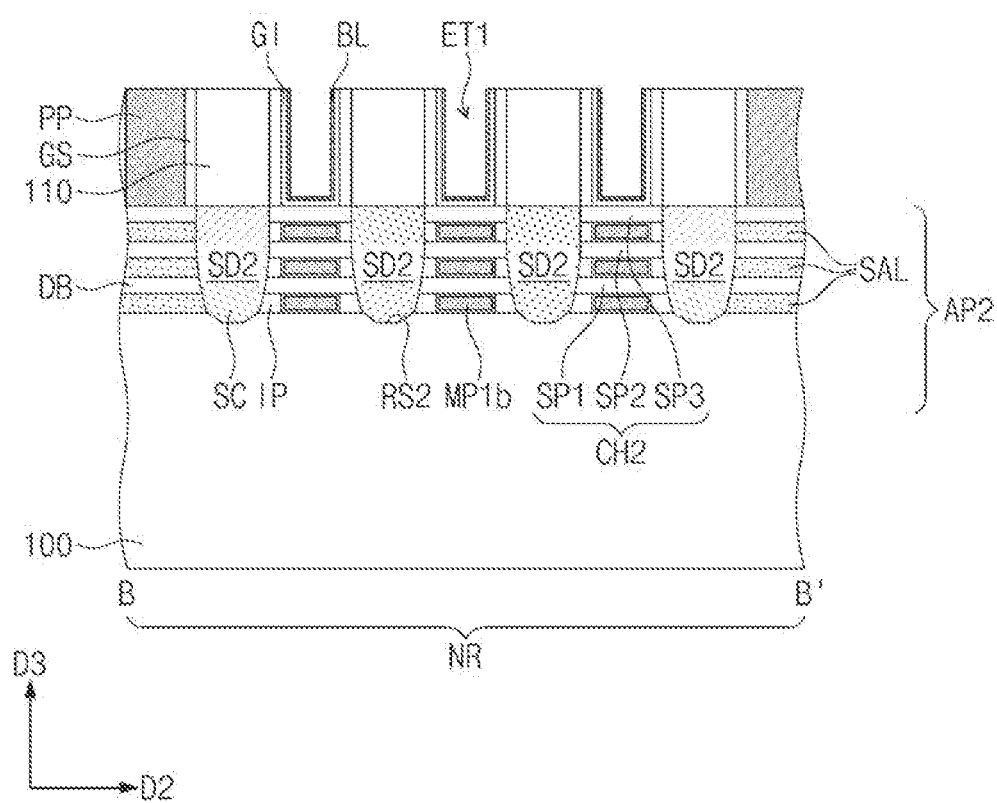
Figure 17C:
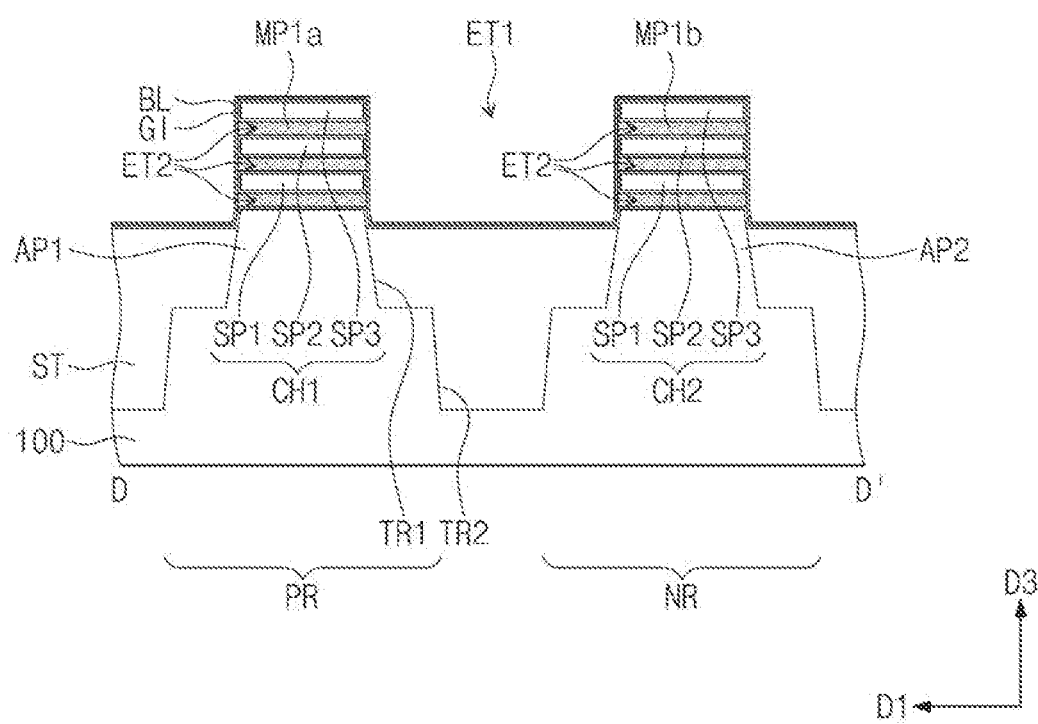

Referring to FIGS. 17A to 17C, an etch barrier layer BL may be conformally formed. The etch barrier layer BL may be formed in the first empty spaces ET1 and may be in contact with the gate insulating layer GI. The etch barrier layer BL may be in contact with side surfaces of the first metal patterns MP1*a* and MP1*b* covering the second empty spaces ET2.

Figure 18A:
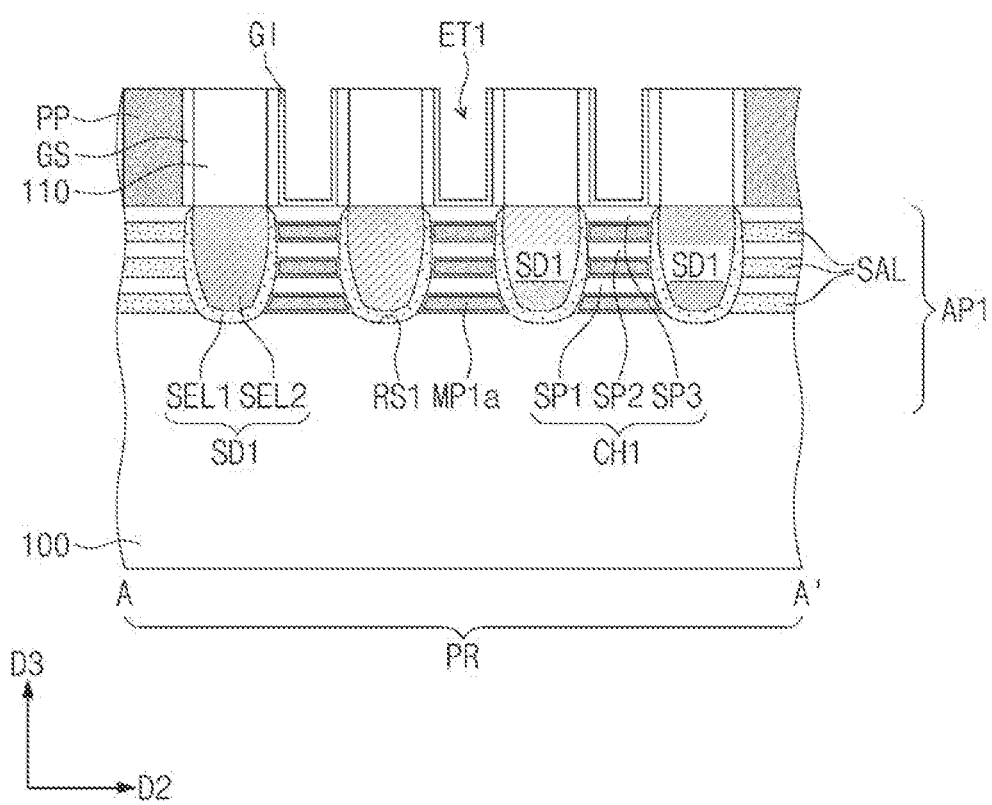
Figure 18B:
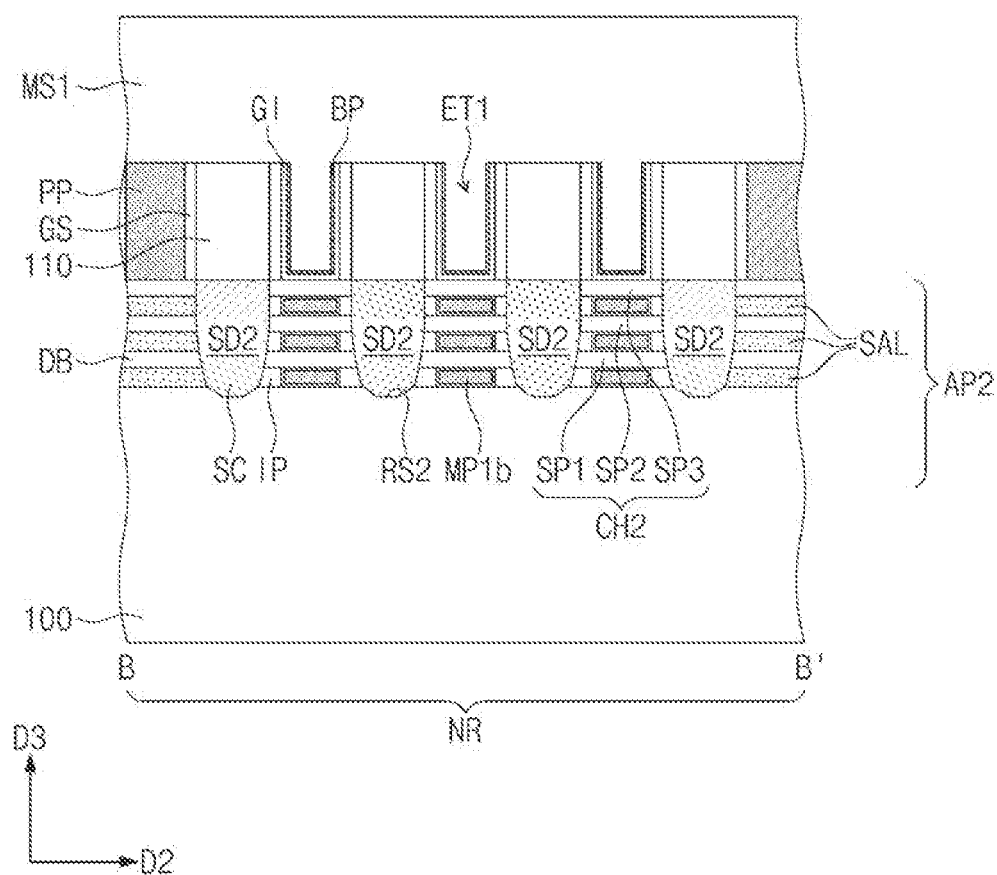
Figure 18C:
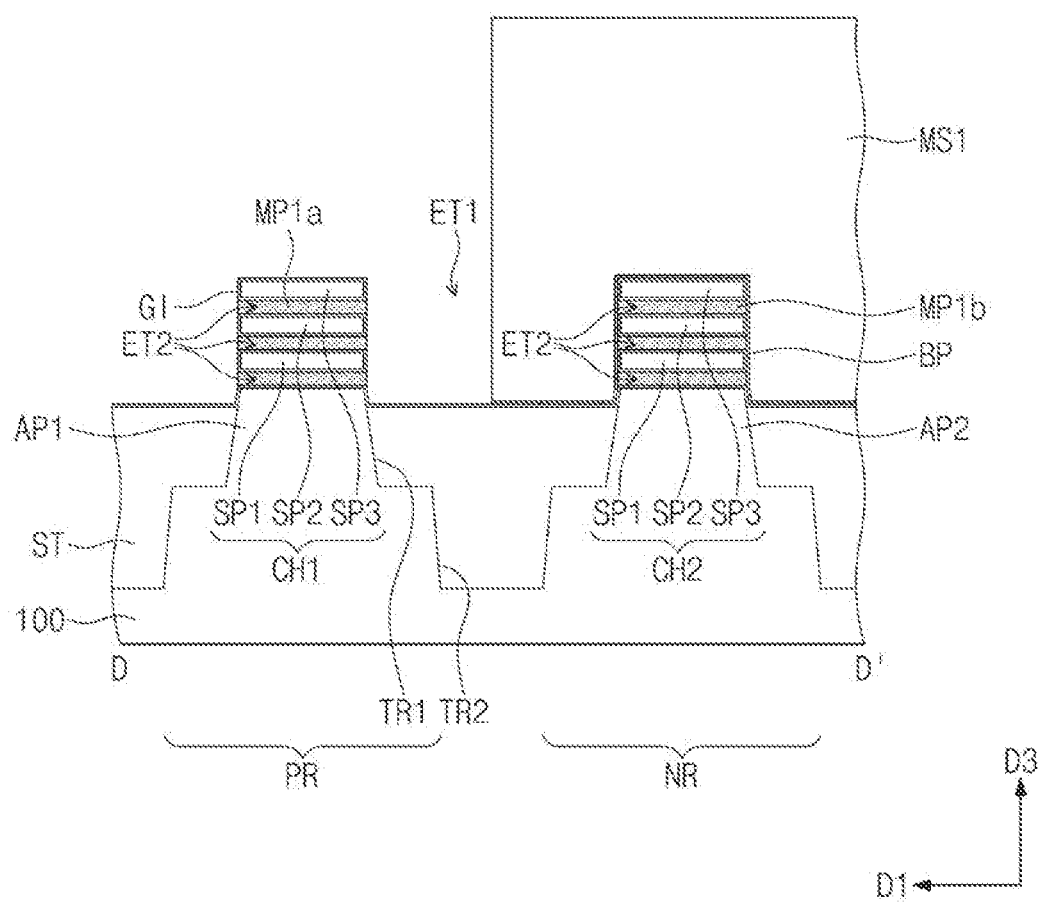

Referring to FIGS. 18A to 18C, the first mask pattern MS1 may be formed to cover the second active region NR, and the etch barrier pattern BP may be formed on the second active region NR by removing the etch barrier layer BL on the first active region PR. An end portion of the etch barrier pattern BP is illustrated to be aligned to the side surface of the first mask pattern MS1, but in an embodiment, an exposed portion thereof may be partially removed to form a recess region.

Figure 19A:
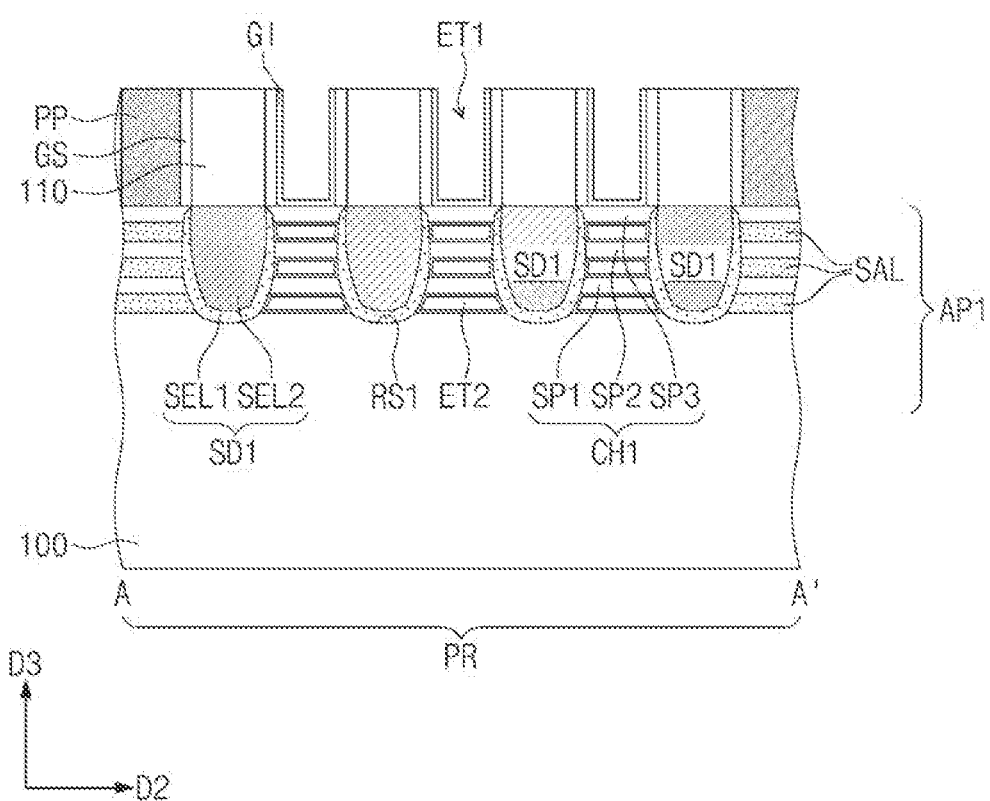
Figure 19B:
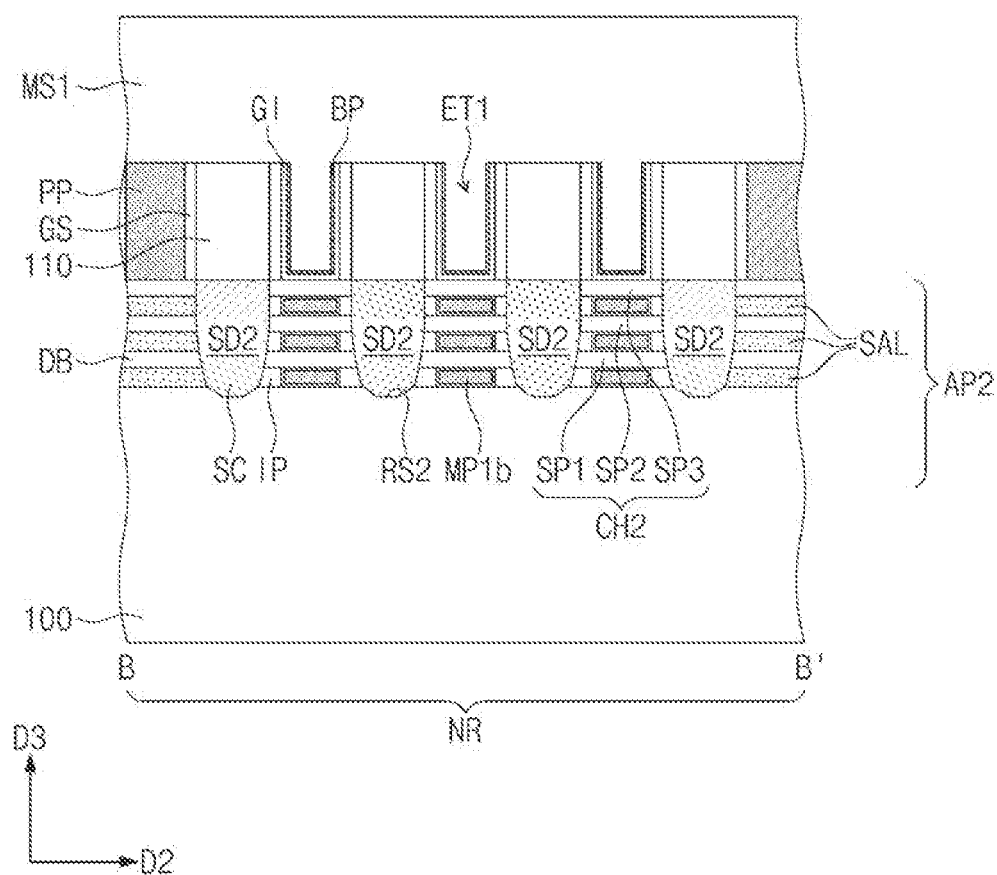
Figure 19C:
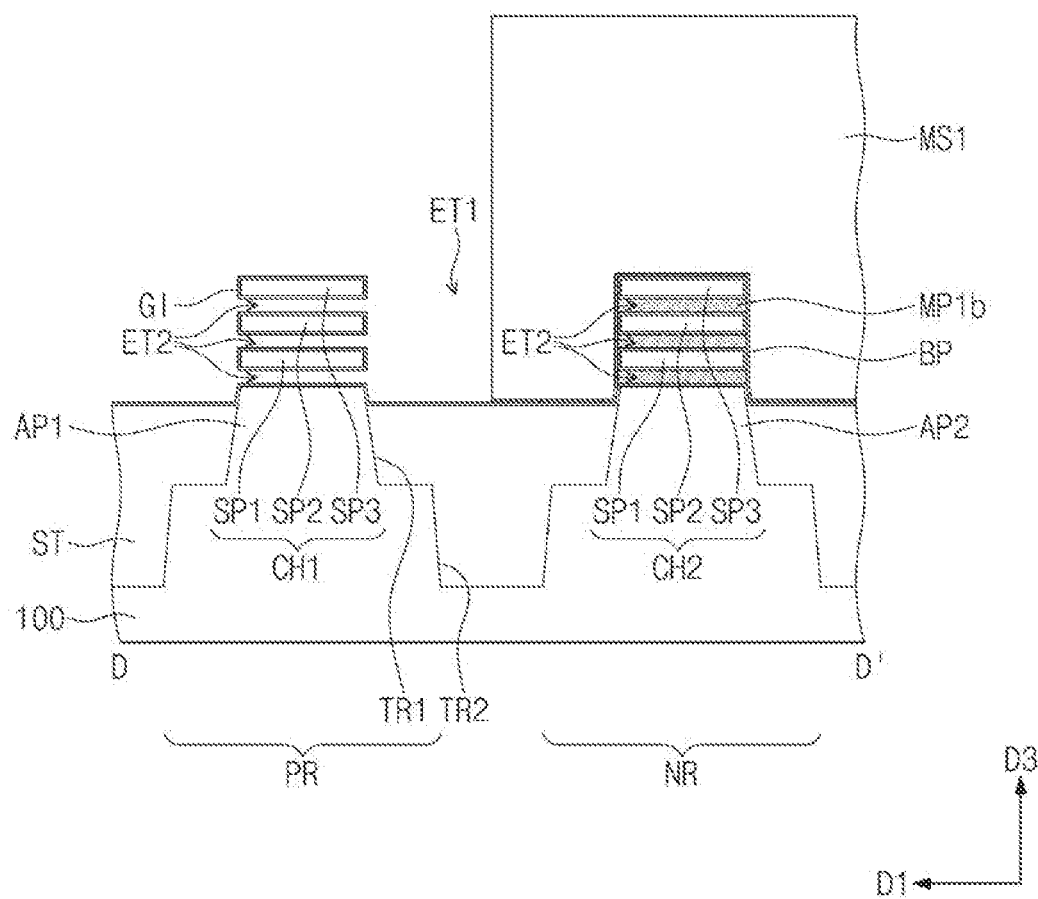

Referring to FIGS. 19A to 19C, the first metal pattern MP1*a* on the first active region PR may be selectively removed. This step may be performed using a recipe, which is chosen to minimize removal of the etch barrier pattern BP. As a result of the removal of the first metal pattern MP1*a*, the second empty spaces ET2 on the first active region PR may be re-opened.

Figure 20A:
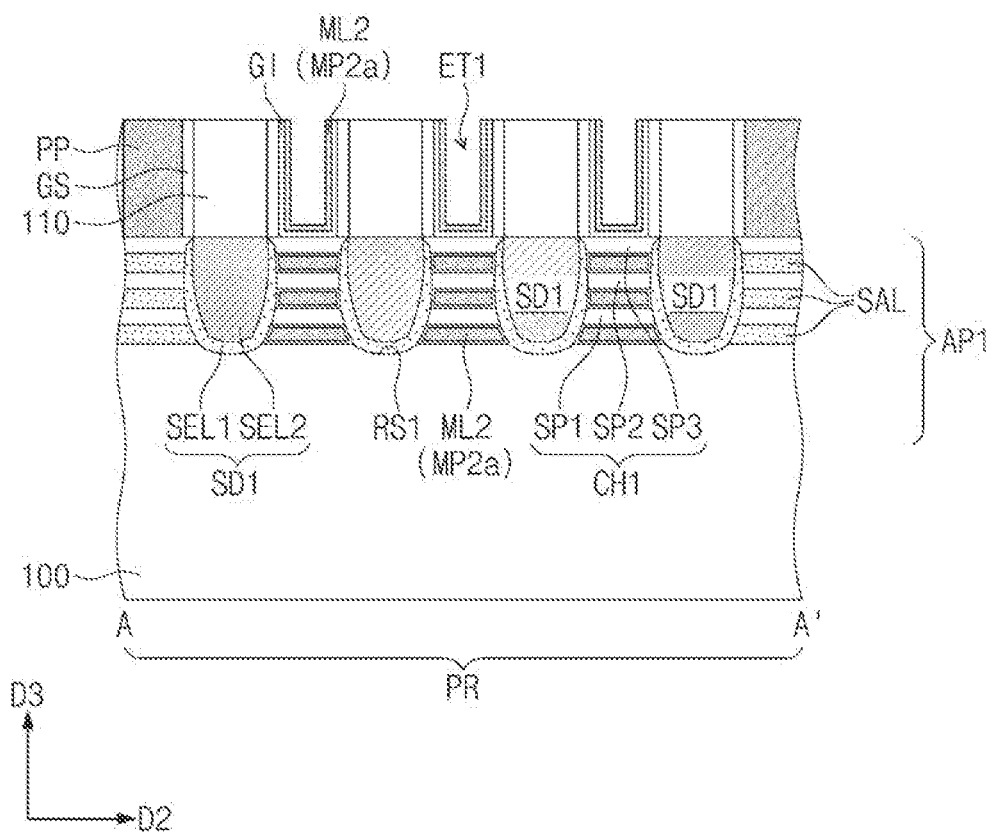
Figure 20B:
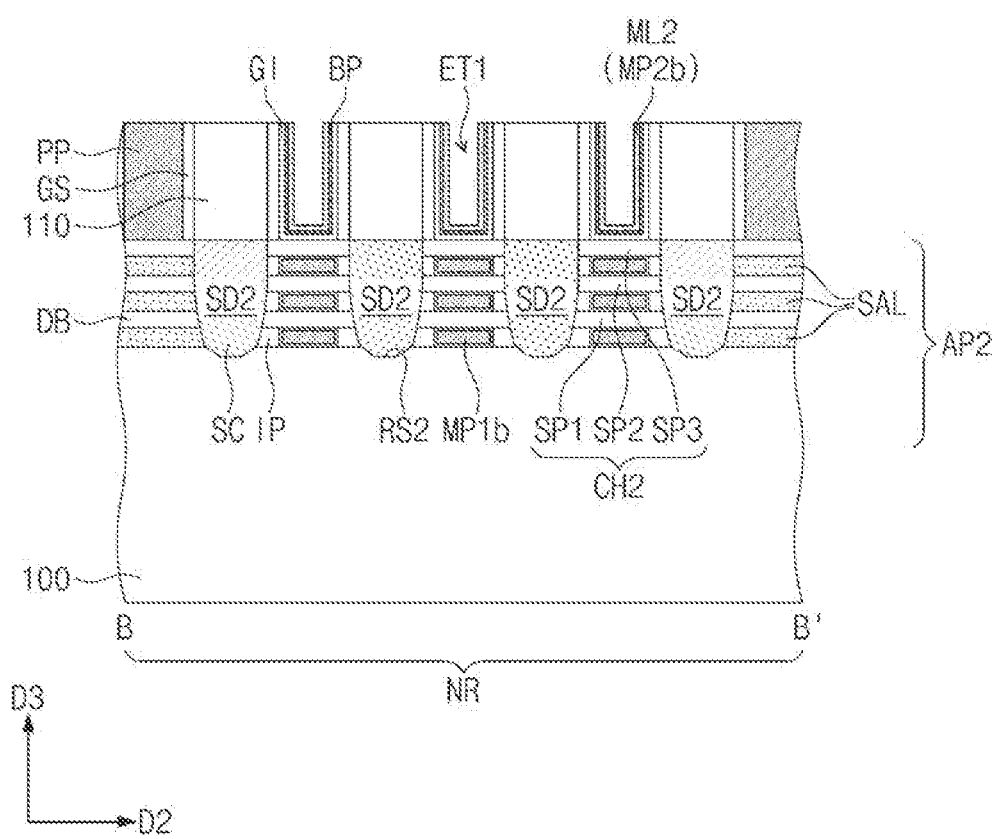
Figure 20C:
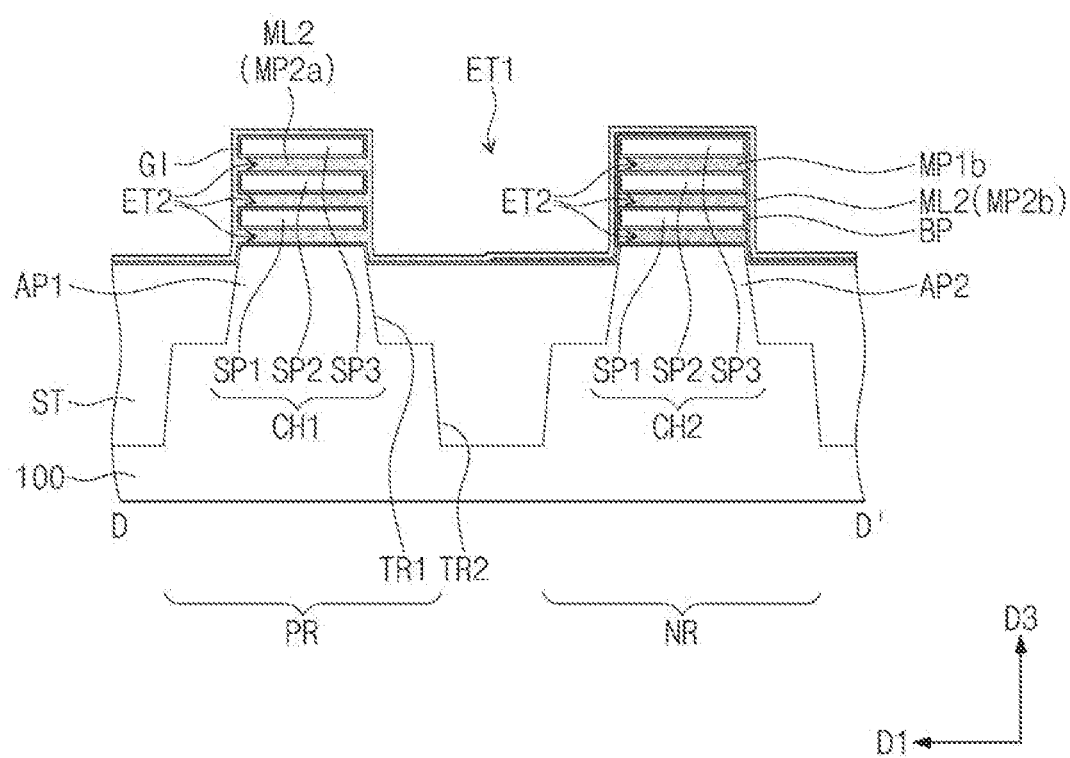

Referring to FIGS. 20A to 20C, the second mask pattern MS2 may be removed, and then, the second metal layer ML2 may be formed. The second metal pattern MP2*a* of the second metal layer ML2, which is formed on the first active region PR, may be formed to fill the second empty spaces ET2 and to partially fill the first empty spaces ET1. The second metal pattern MP2*b* of the second metal layer ML2, which is formed on the second active region NR, may be formed to cover the etch barrier pattern BP in the first empty spaces ET1.

Figure 21A:
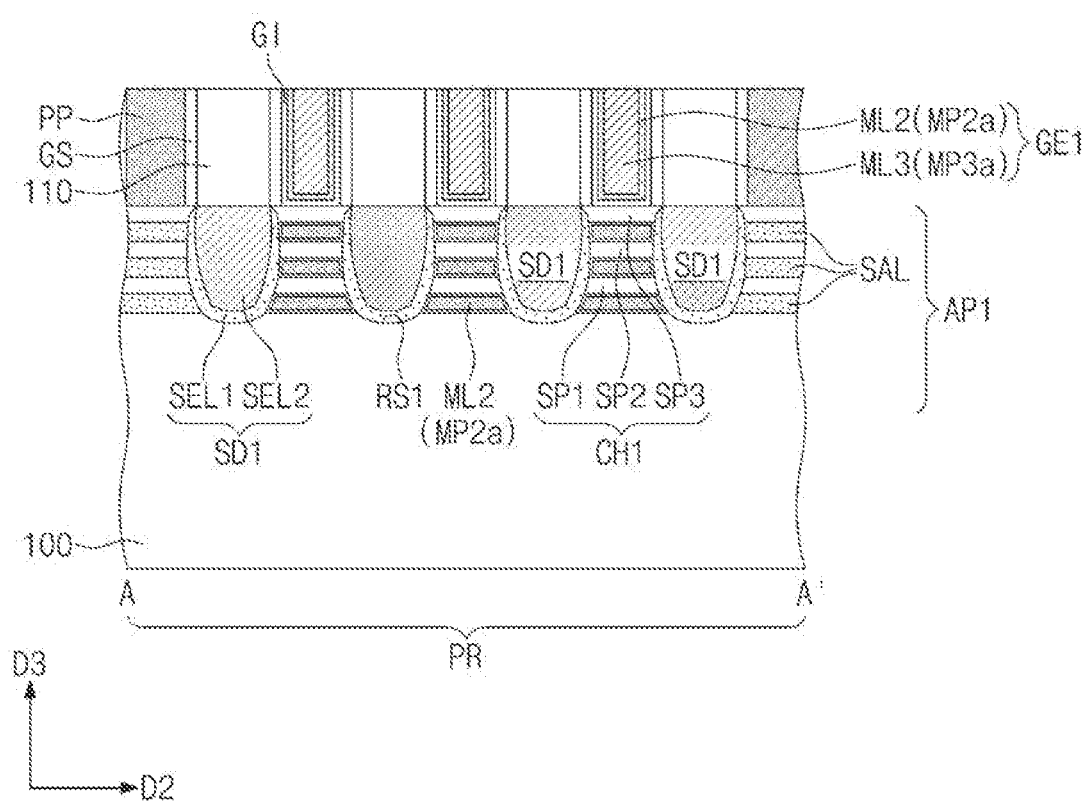
Figure 21B:
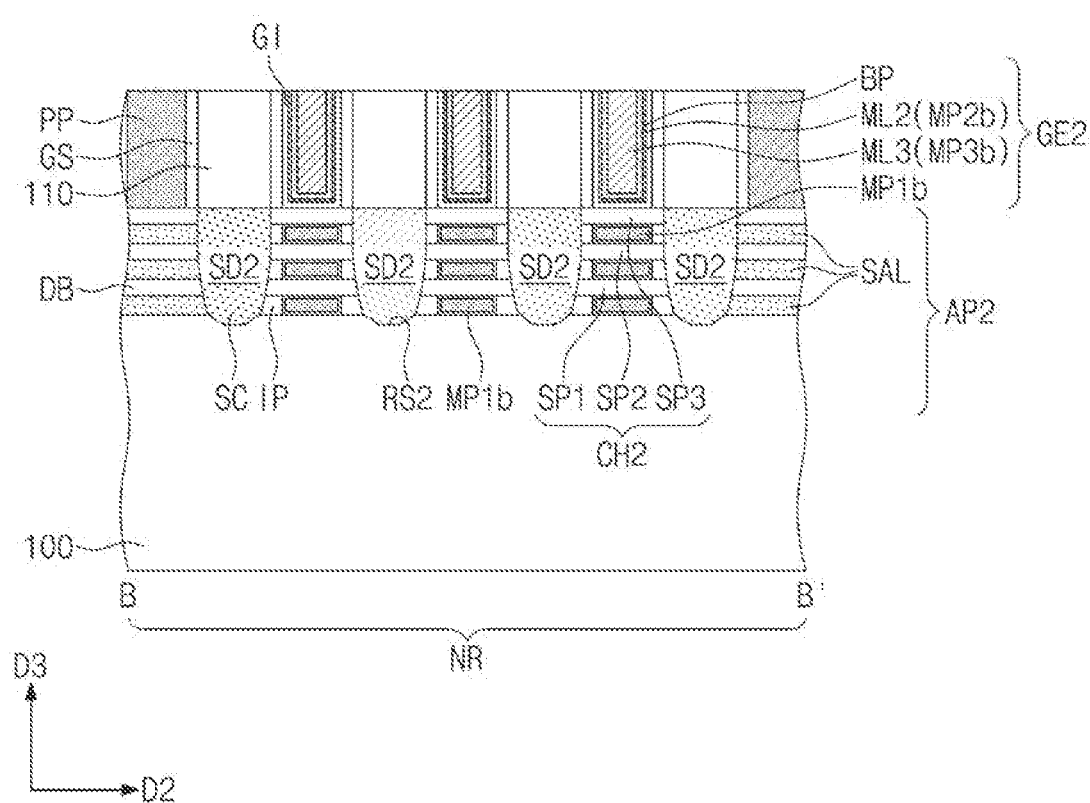
Figure 21C:
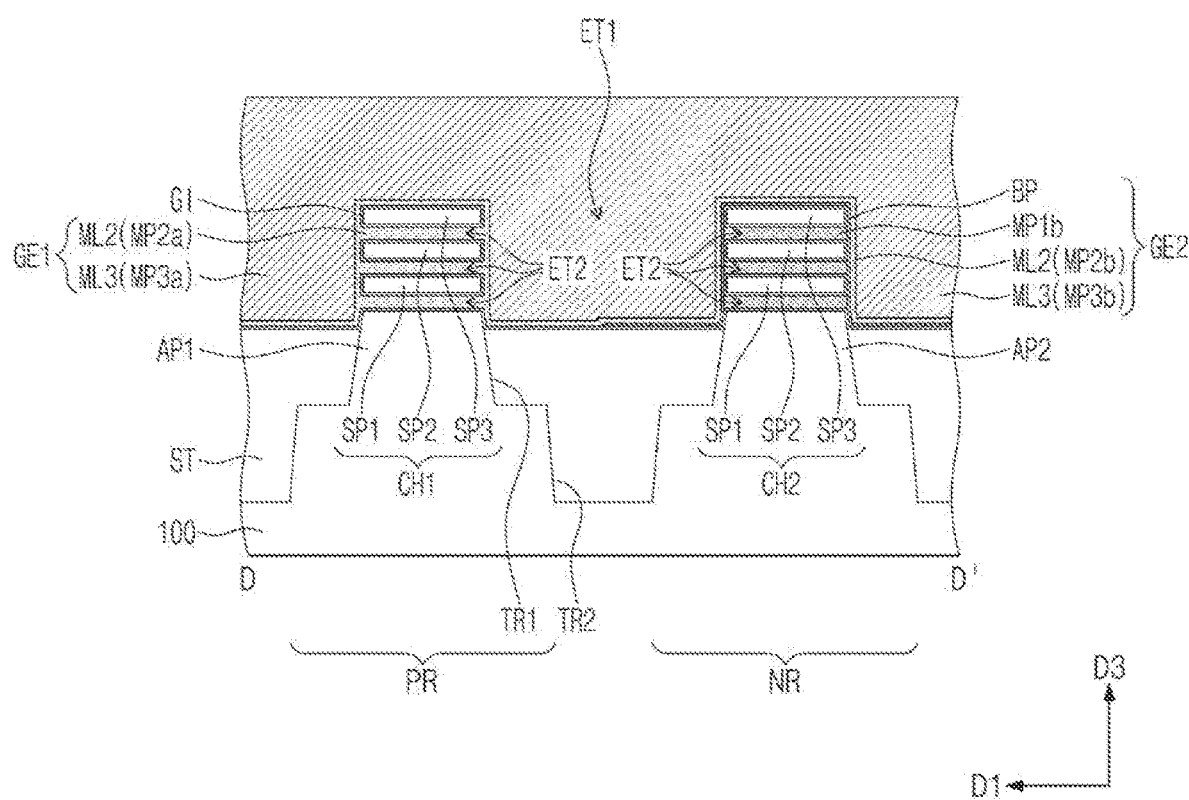

Referring to FIGS. 21A to 21C, the third metal layer ML3 may be formed on the second metal layer ML2. Thereafter, the process described with reference to FIGS. 2A to 2D may be performed to form the semiconductor device according to the embodiment of FIGS. 15A to 15E.

FIGS. 22A to 29C are sectional views illustrating a method of fabricating a semiconductor device, according to an embodiment. FIGS. 22A, 23A, 24A, 25A, 26A, 27A, 28A, and 29A are sectional views taken along the line A-A' of FIG. 1. FIGS. 22B, 23B, 24B, 25B, 26B, 27B, 28B, and 29B are sectional views taken along the line B-B' of FIG. 1. FIGS. 22C, 23C, 24C, 25C, 26C, 27C, 28C, and 29C are sectional views taken along the line D-D' of FIG. 1. For concise description, a previously described element may be identified by the same reference number without repeating an overlapping description thereof.

Figure 8A:
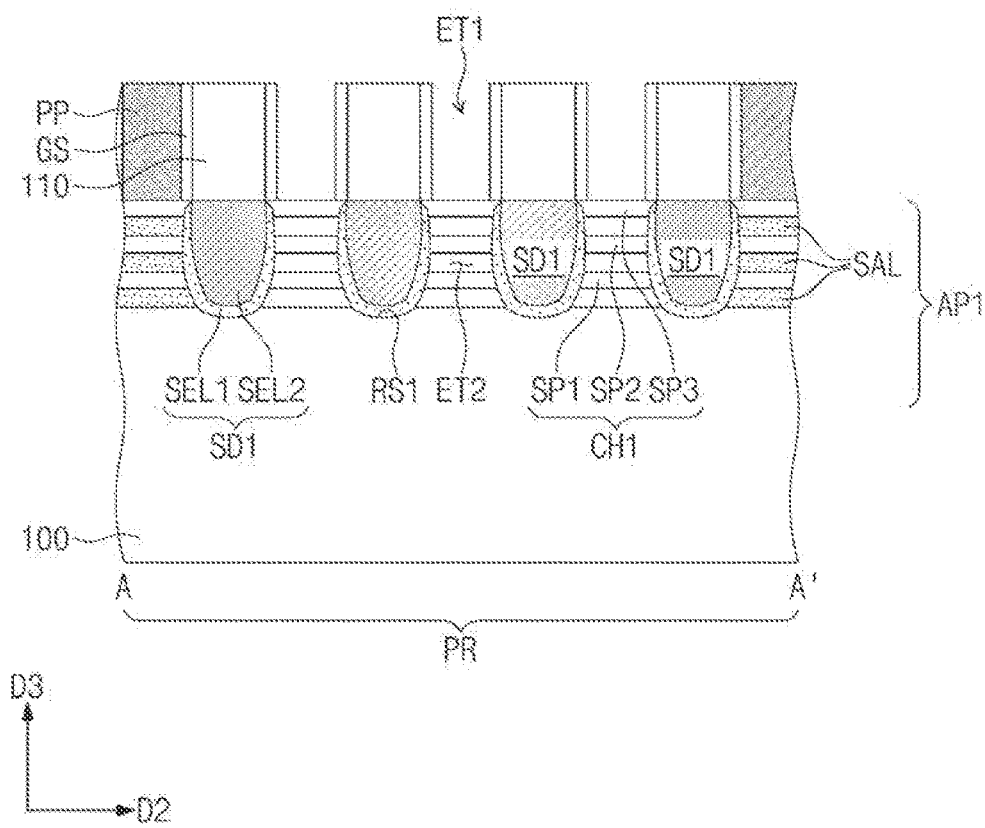
Figure 8B:
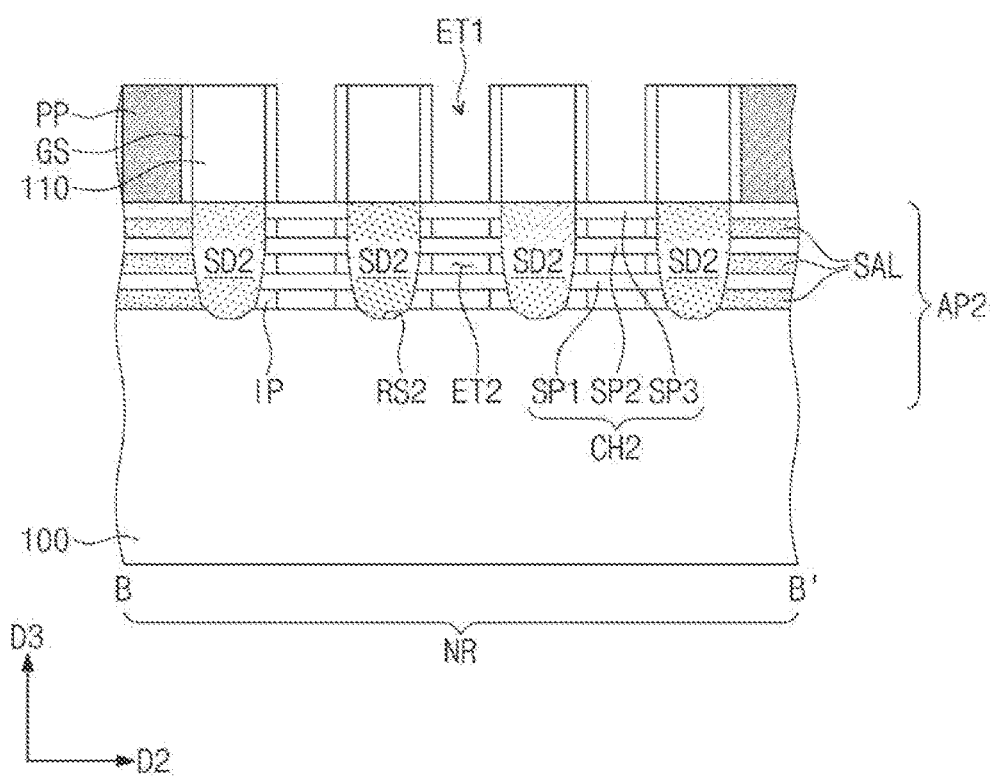
Figure 8C:
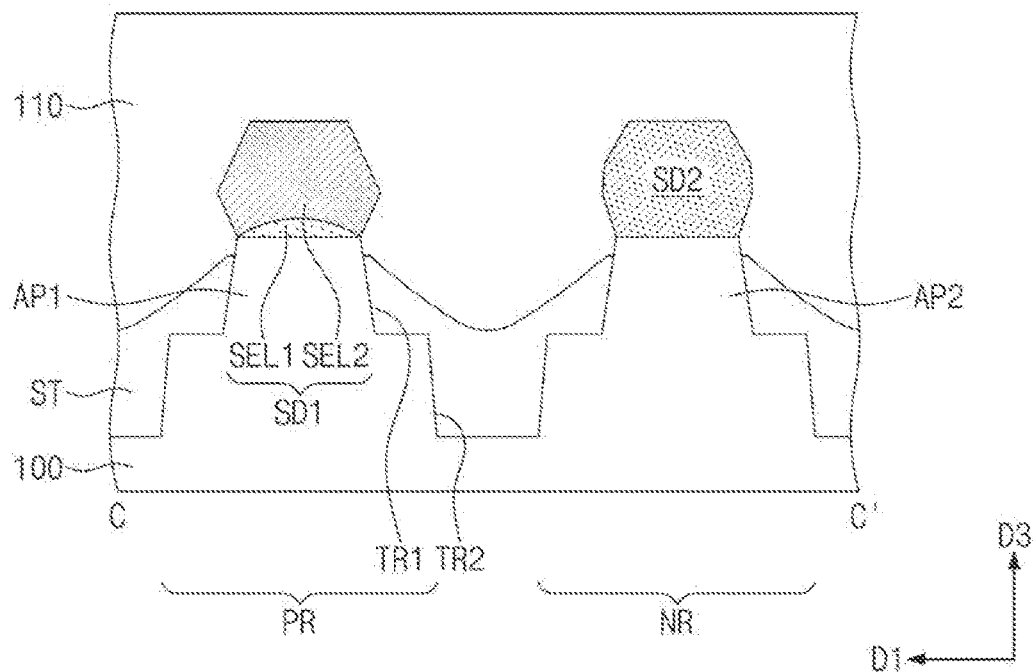
Figure 8D:
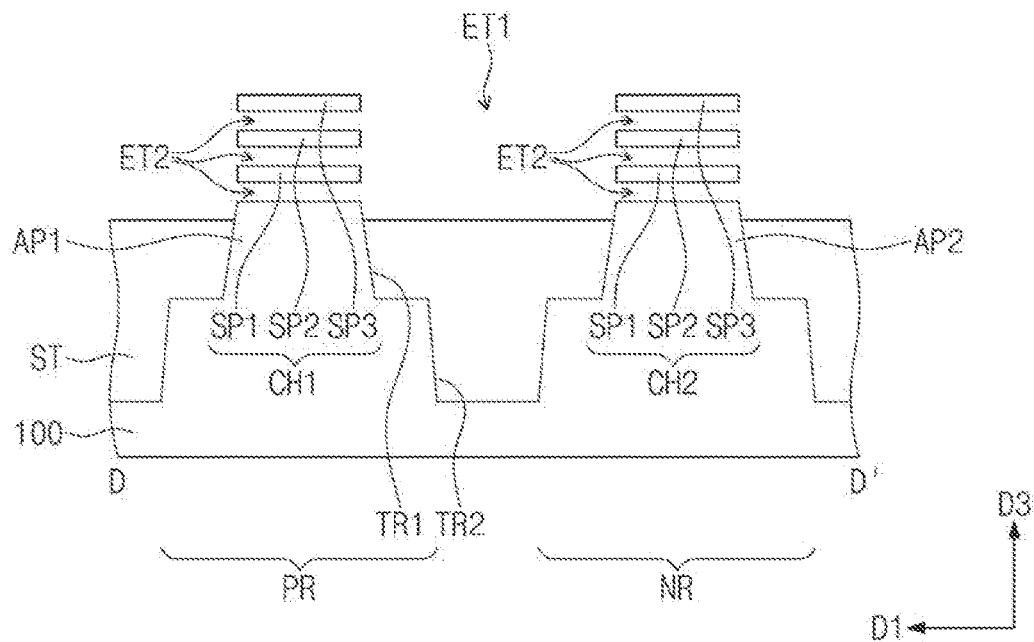
Figure 22A:
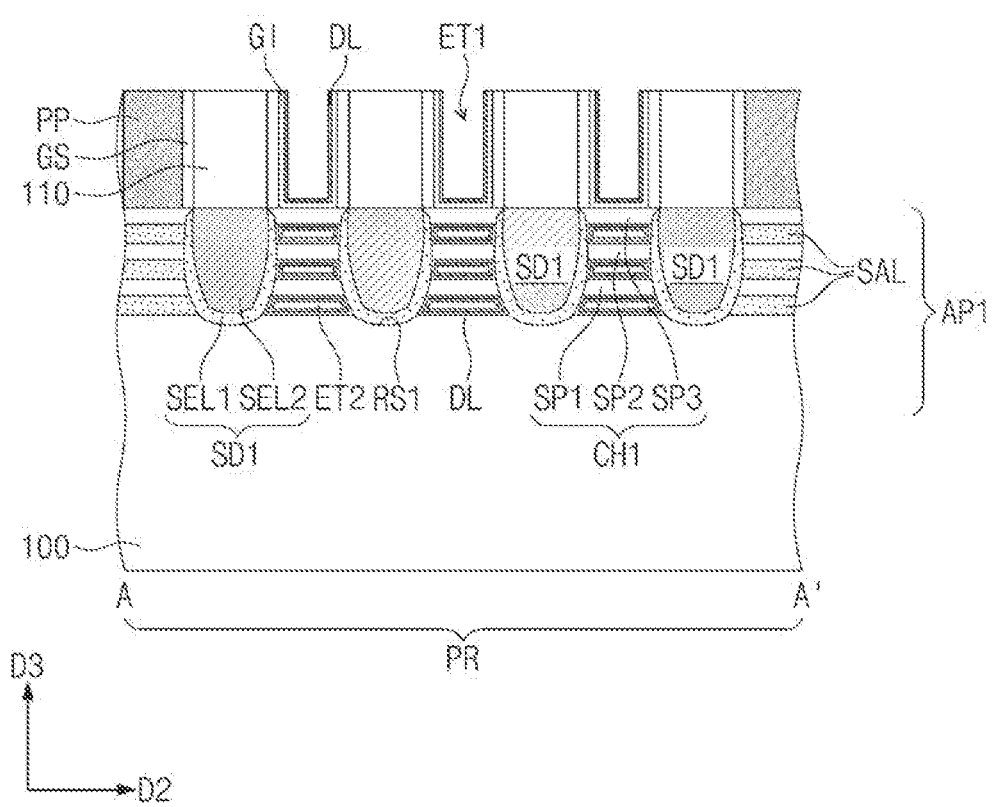
Figure 22B:
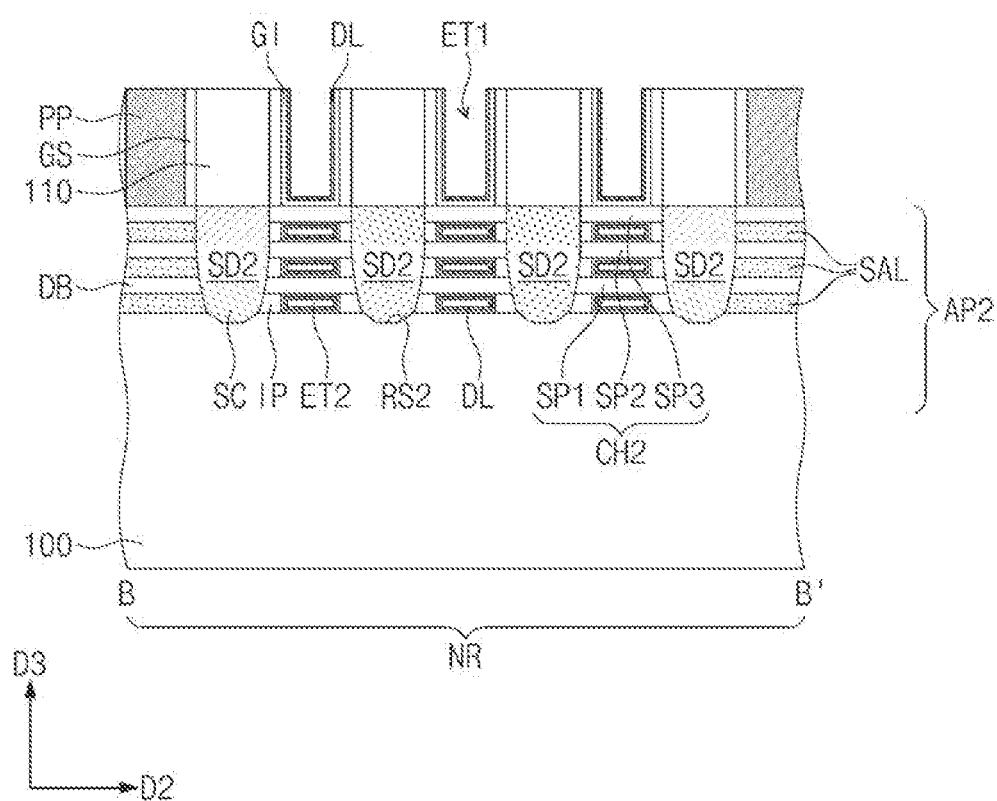
FIGS. 22B, 23B, 24B, 25B, 26B, 27B, 28B, and 29B are sectional views taken along the line B-B' of FIG. 1.
Figure 22C:
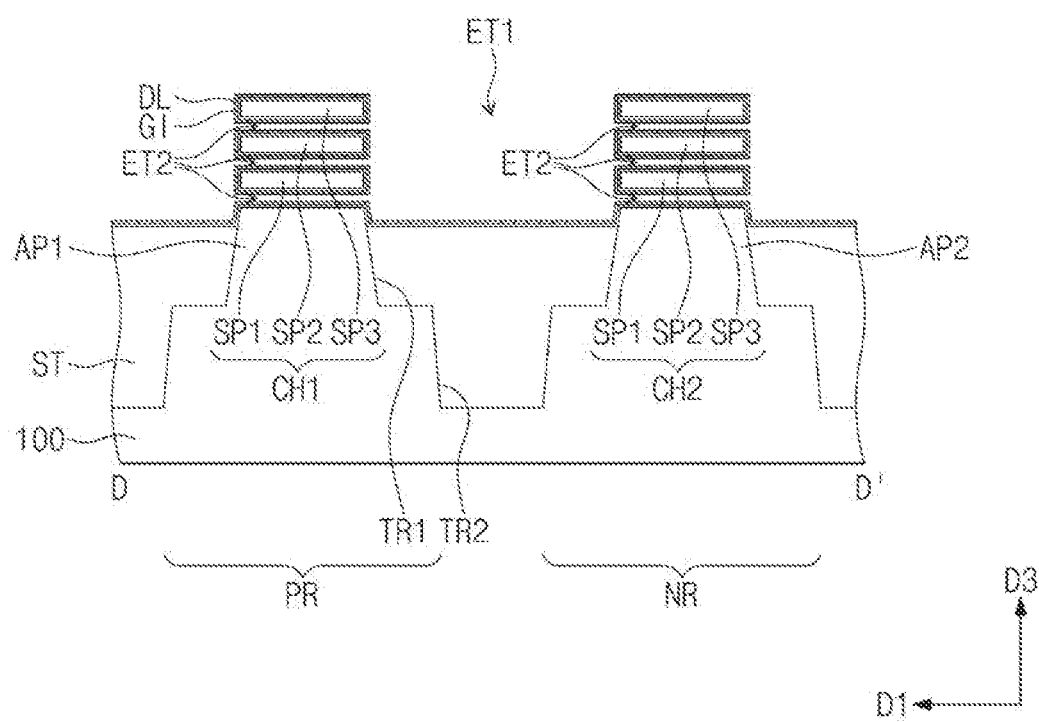

The method according to FIGS. 3A to 8C may be performed, and then, referring to FIGS. 22A to 22C, an adjusting layer DL may be formed on the structure of FIGS. 8A to 8C. The adjusting layer DL may be formed to be in contact with the gate insulating layer GI and to cover the first and second empty spaces ET1 and ET2. In an embodiment, the adjusting layer DL may include a lanthanum oxide layer or an aluminum oxide layer. In an embodiment, the adjusting layer DL may be used to precisely adjust the threshold voltage of the transistors.

Figure 23A:
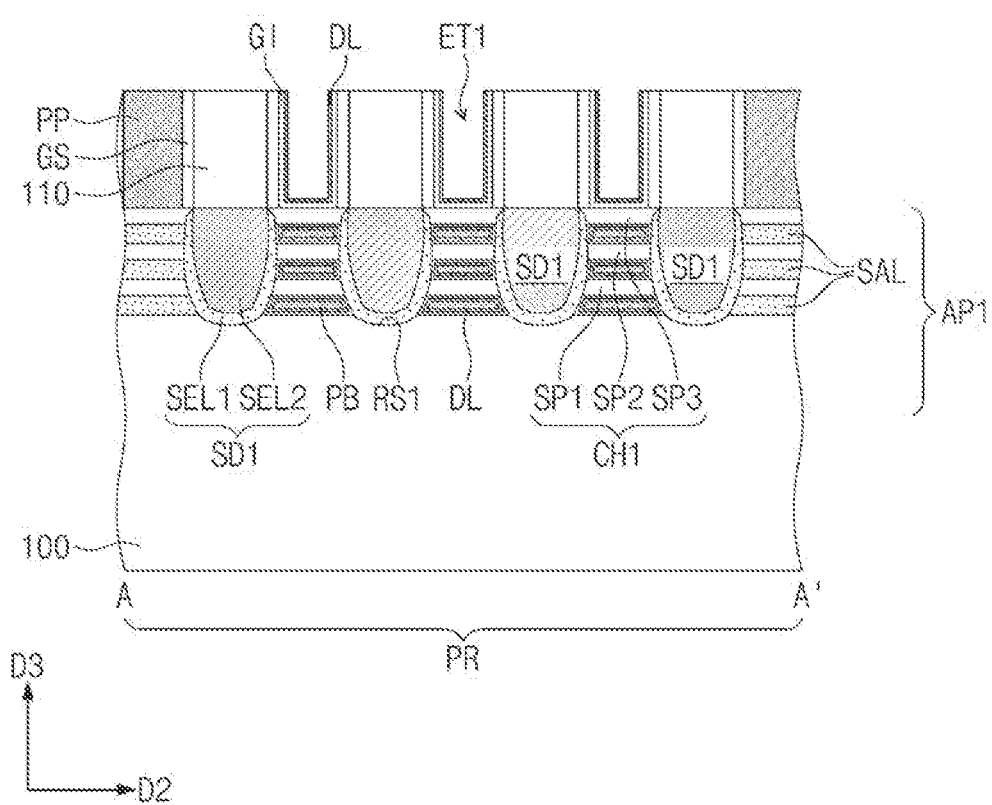
Figure 23B:
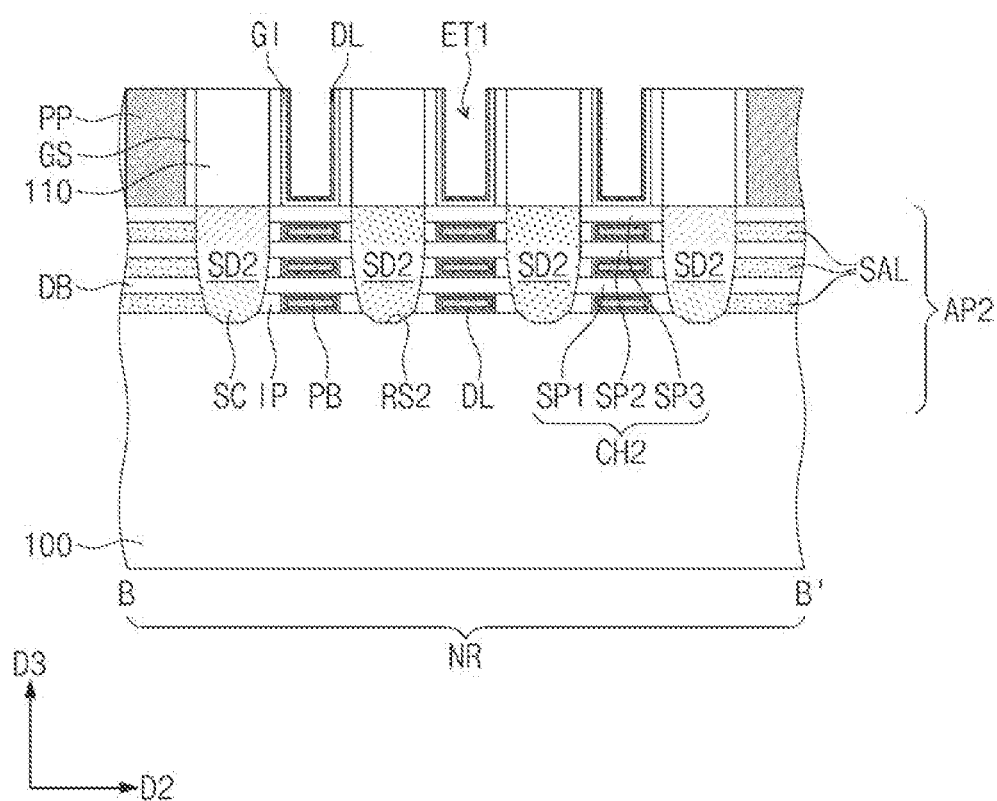
Figure 23C:
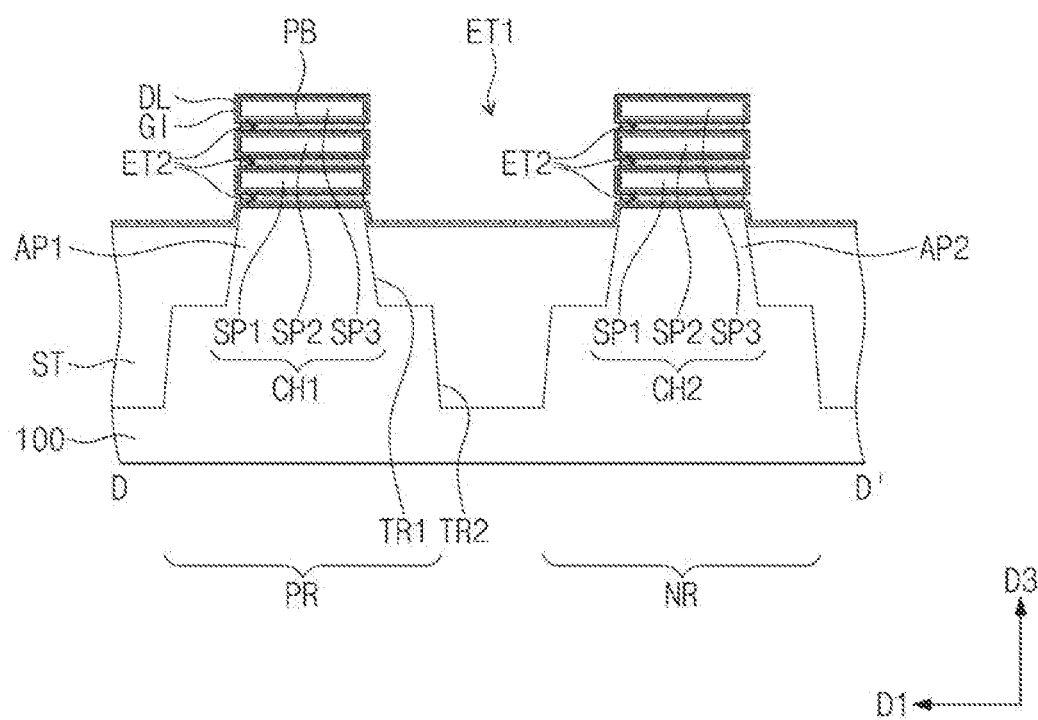

Referring to FIGS. 23A to 23C, etch auxiliary patterns PB may be formed. The etch auxiliary patterns PB may be formed by forming and patterning a metal nitride layer. In an embodiment, the etch auxiliary patterns PB may be formed of or include at least one of metal nitride materials (e.g., TiN or TaN). The etch auxiliary patterns PB may be formed in the second empty spaces ET2 and may not be left in the first empty space ET1.

Figure 24A:
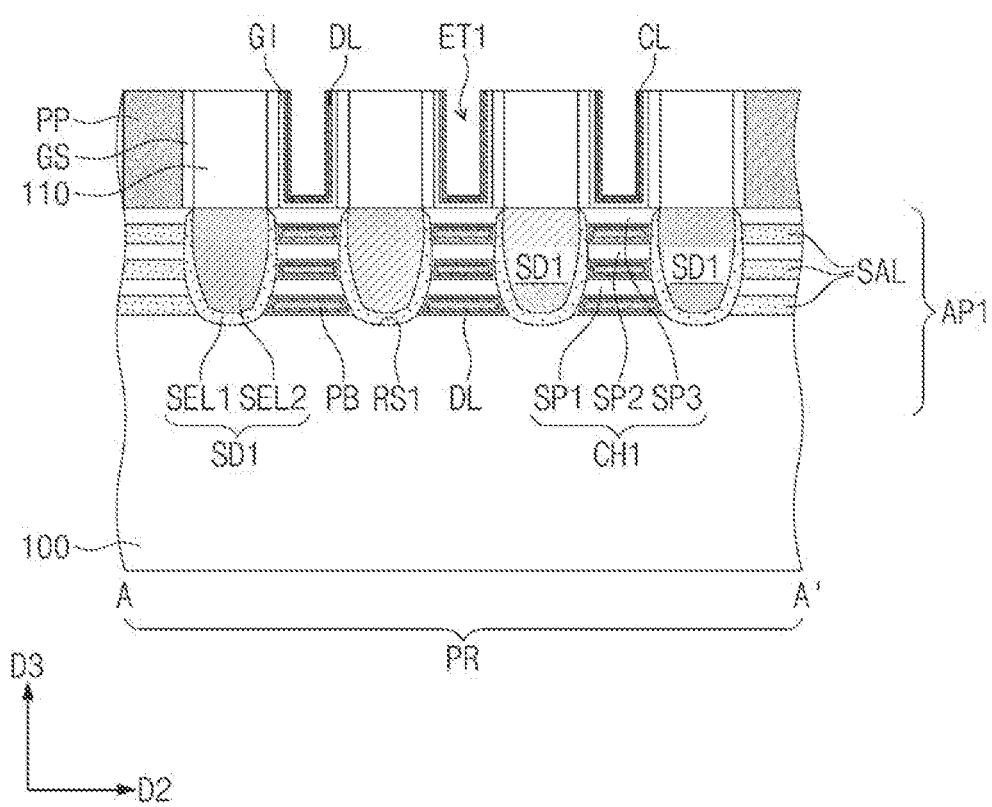
Figure 24B:
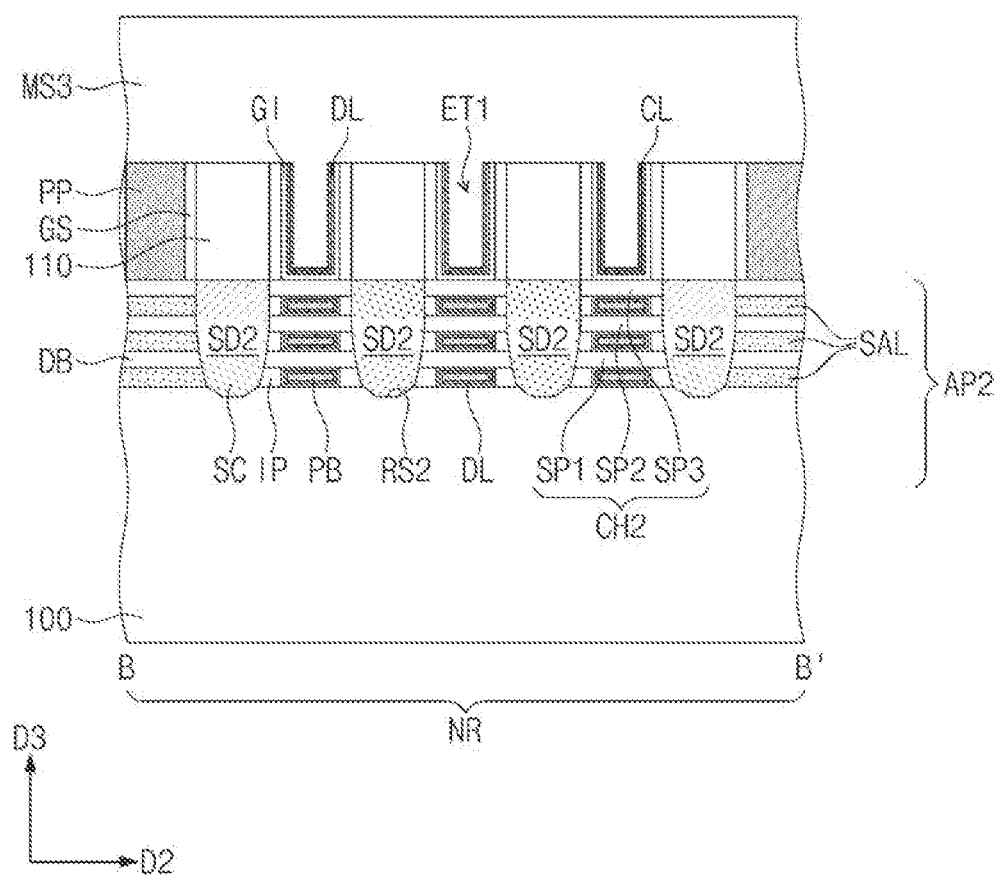
Figure 24C:
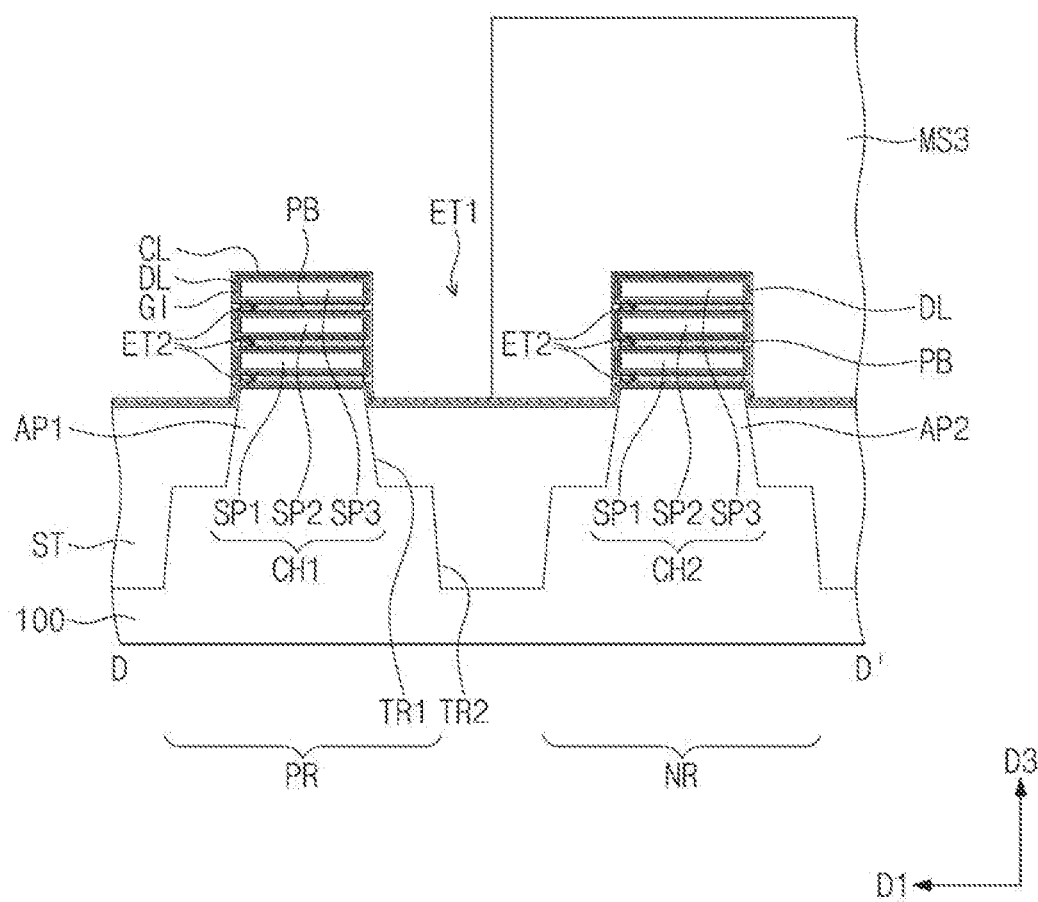

Referring to FIGS. 24A to 24C, an etch barrier layer CL may be formed to cover the adjusting layer DL and side surfaces of the etch auxiliary patterns PB. The etch barrier layer CL may be formed of or include the same material as the etch barrier pattern BP described with reference to FIGS. 2A to 2F. In an embodiment, the etch barrier layer CL may be formed of or include at least one of TiAlN, TaAlC, TiN, or TaN. The etch barrier layer CL may be thicker than the adjusting layer DL. Thereafter, a third mask pattern MS3 may be formed to cover the second active region NR.

Figure 25A:
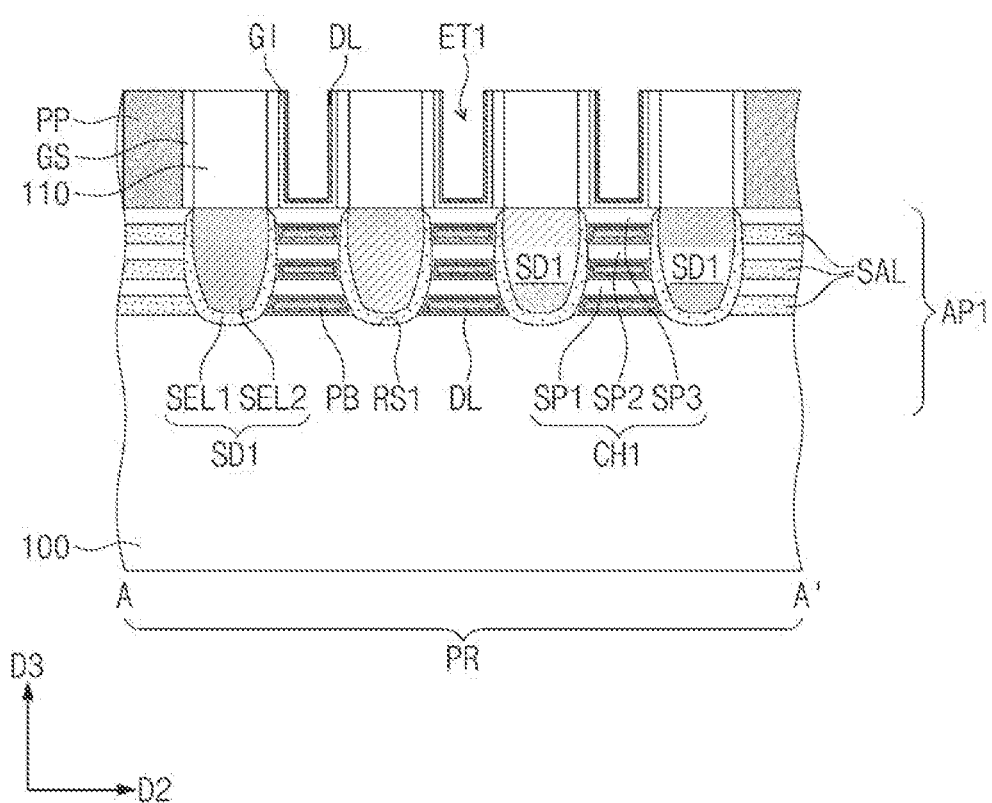
Figure 25B:
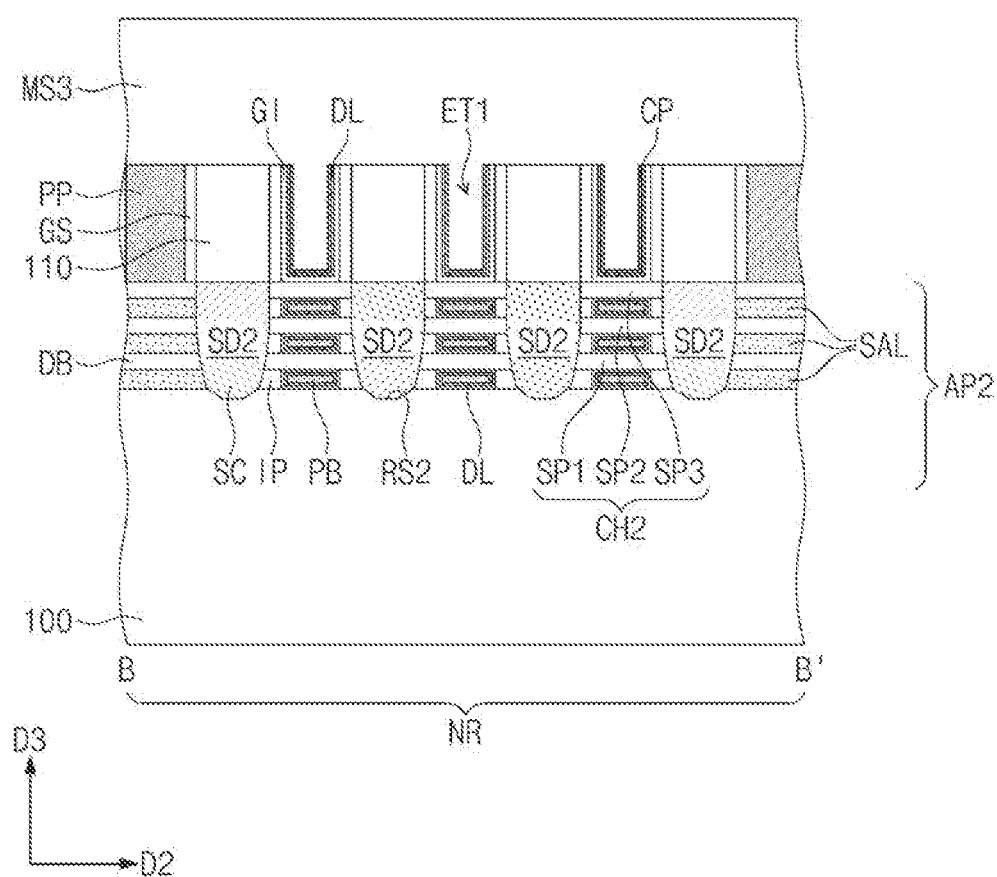
Figure 25C:
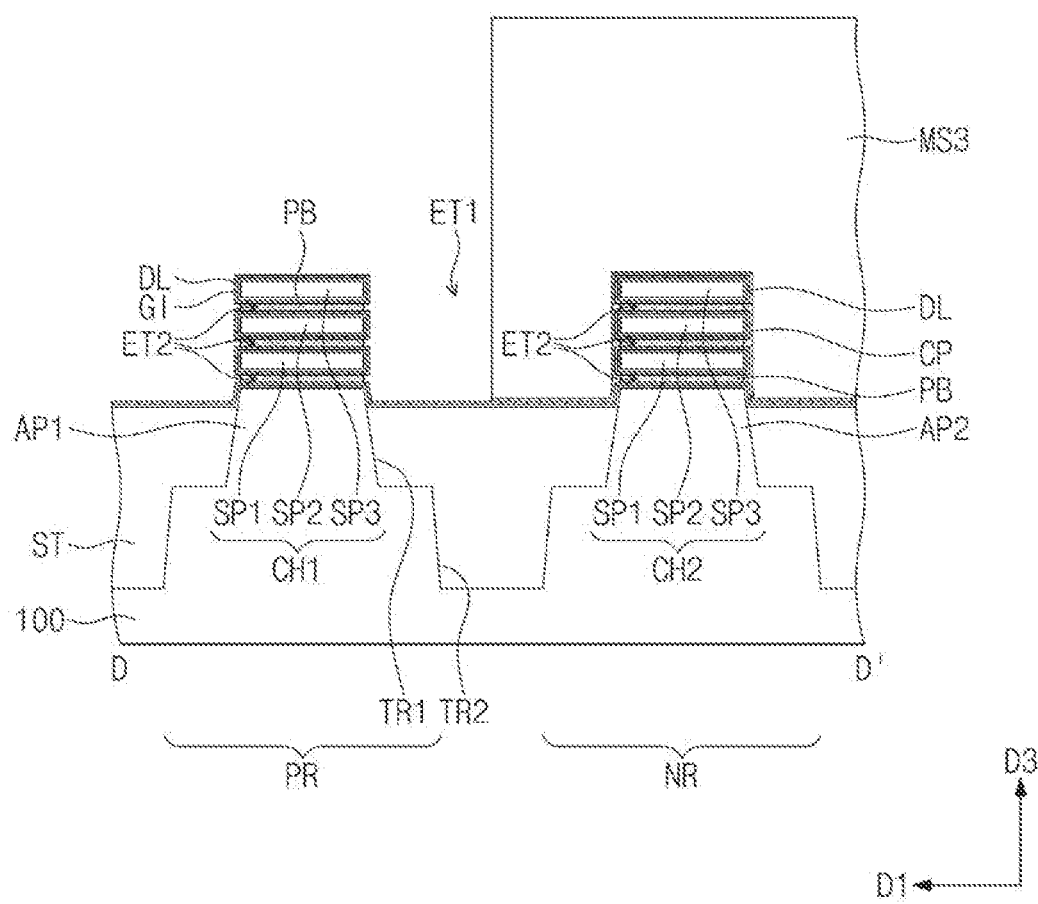

Referring to FIGS. 25A to 25C, an etch barrier pattern CP may be formed on the second active region NR by pattering the etch barrier layer CL using the third mask pattern MS3 as an etch mask. The adjusting layer DL and the etch auxiliary patterns PB on the first active region PR may be exposed to the outside.

Figure 26A:
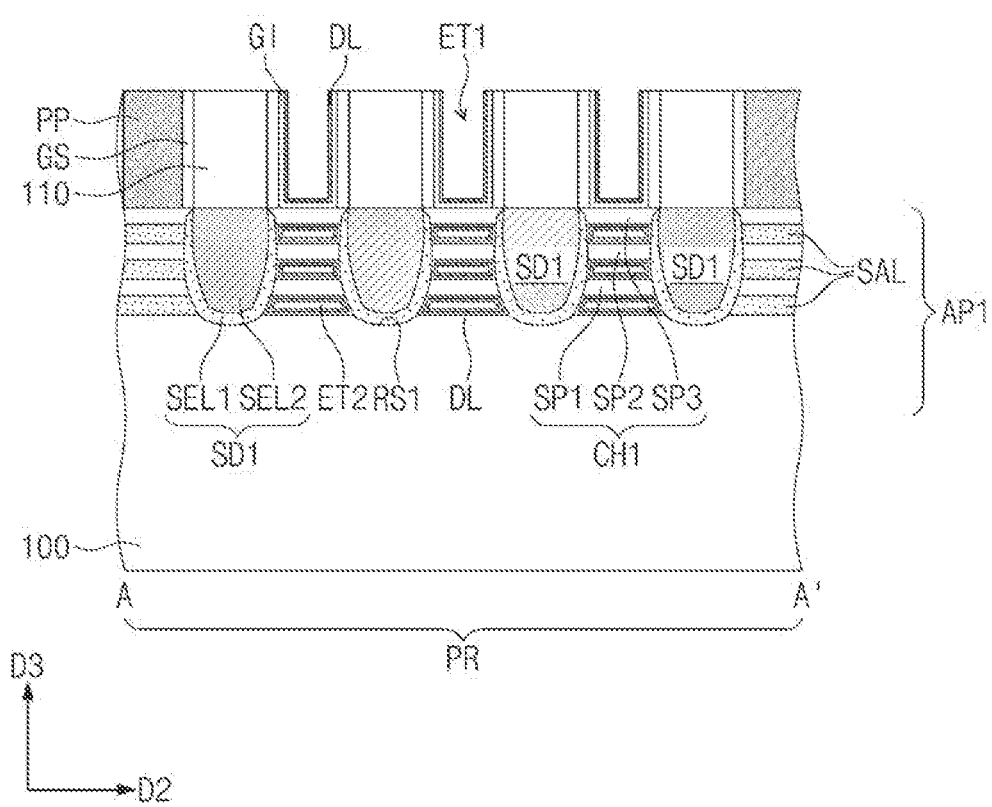
Figure 26B:
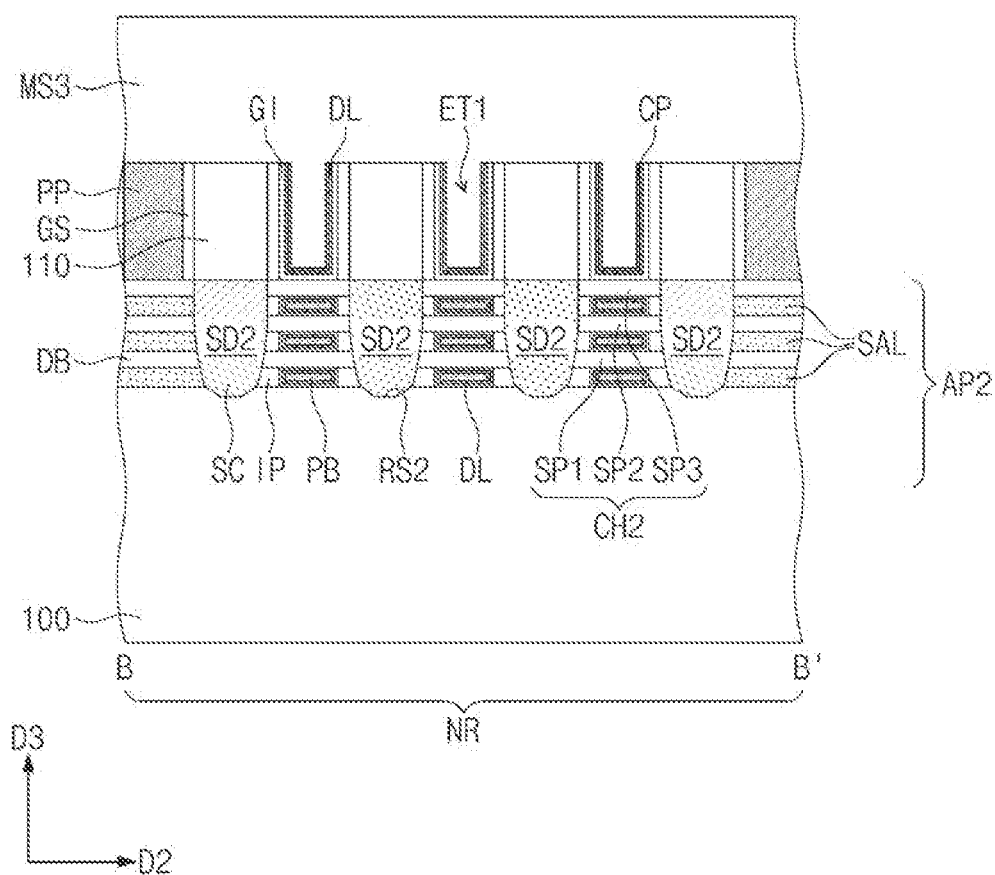
Figure 26C:
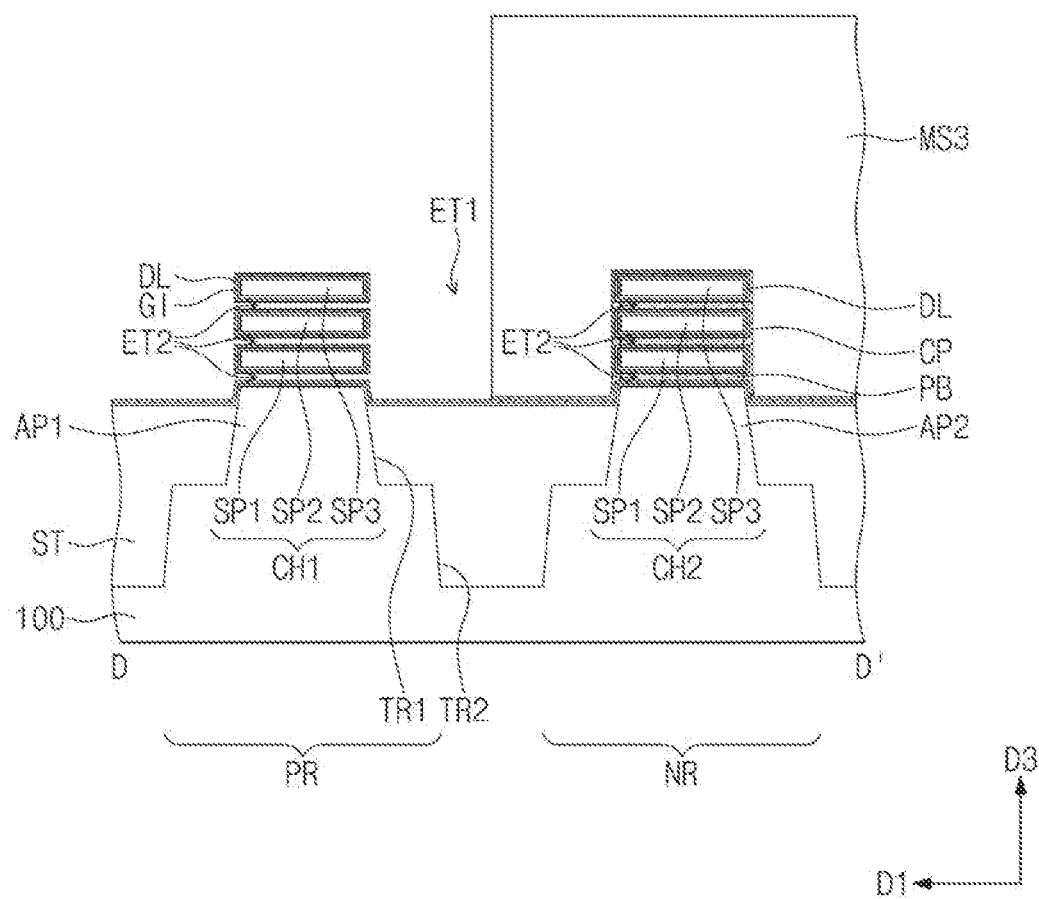

Referring to FIGS. 26A to 26C, the etch auxiliary patterns PB on the first active region PR may be selectively removed to expose the adjusting layer DL. The adjusting layer DL may be left on the first active region PR.

Figure 27A:
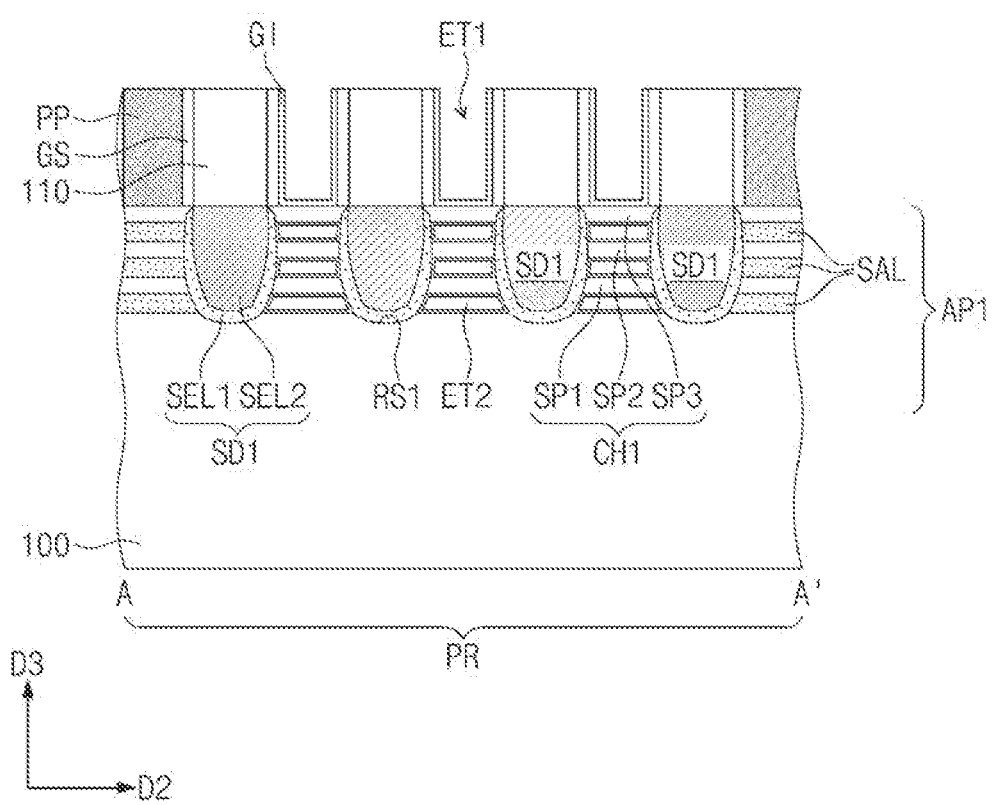
Figure 27B:
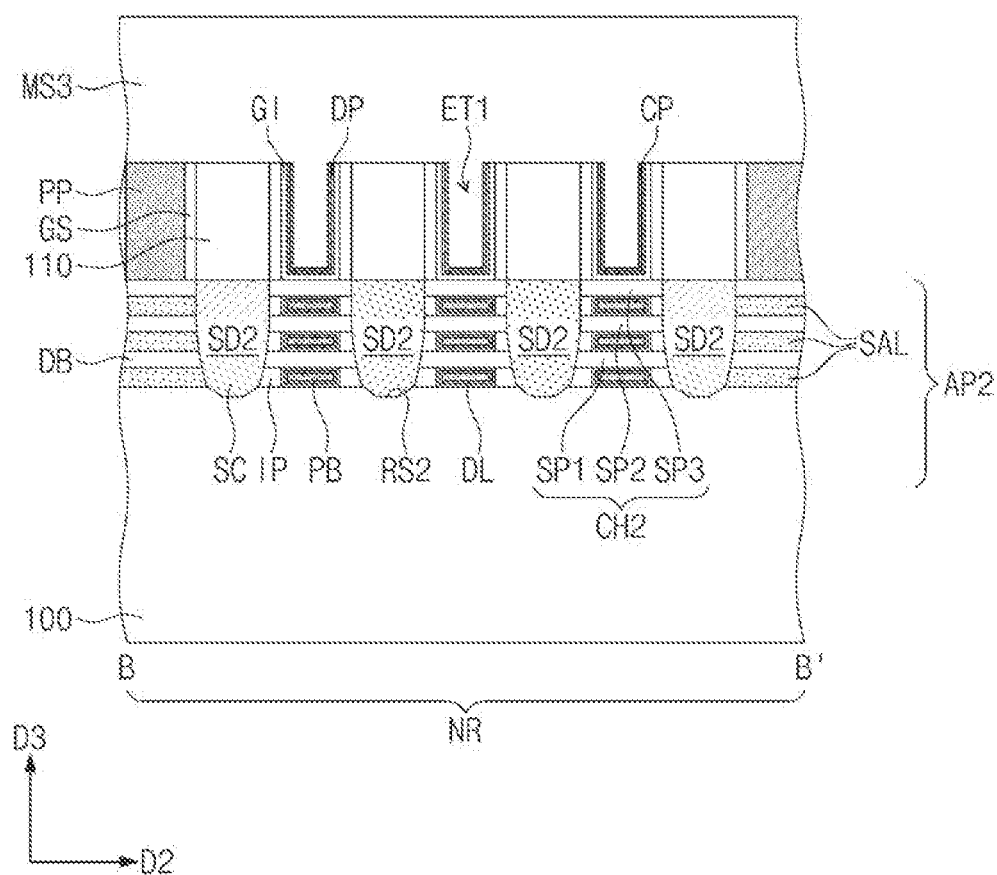
Figure 27C:
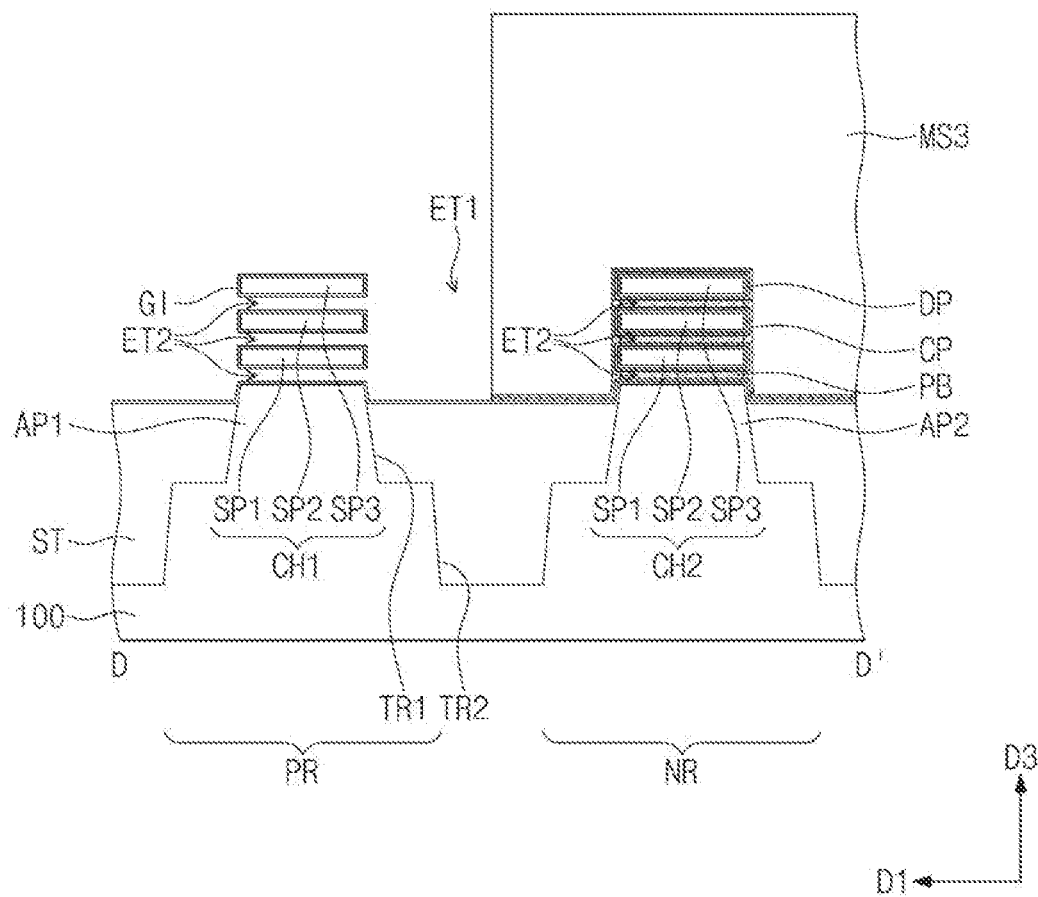

Referring to FIGS. 27A to 27C, a process of patterning the adjusting layer DL using the third mask pattern MS3 as an etch mask may be performed to expose the second empty spaces ET2 of the first active region PR. As a result, an adjusting pattern DP may be formed on the second active region NR. The etch barrier pattern CP on the second active region NR may not be removed.

Figure 28A:
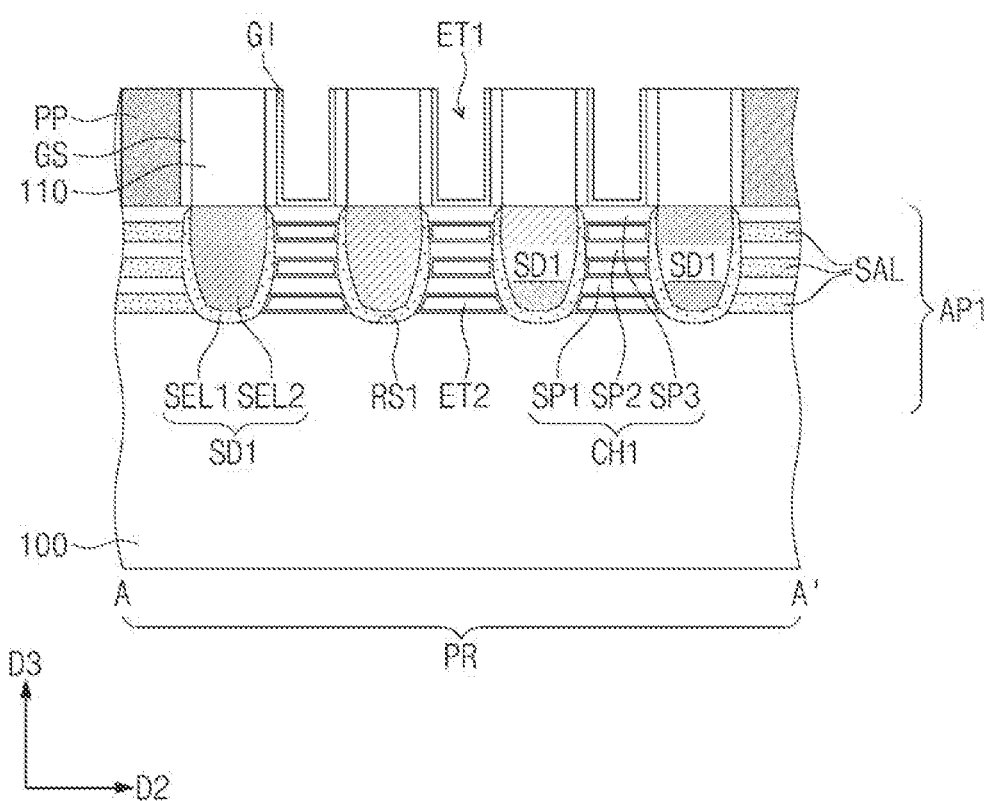
Figure 28B:
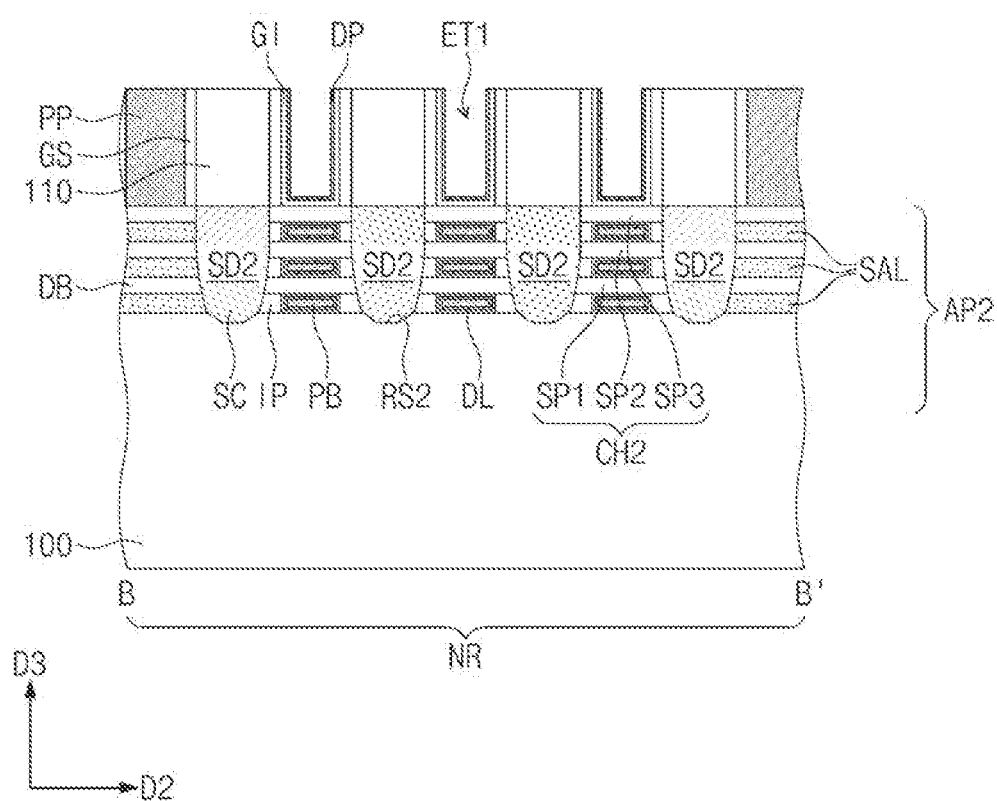
Figure 28C:
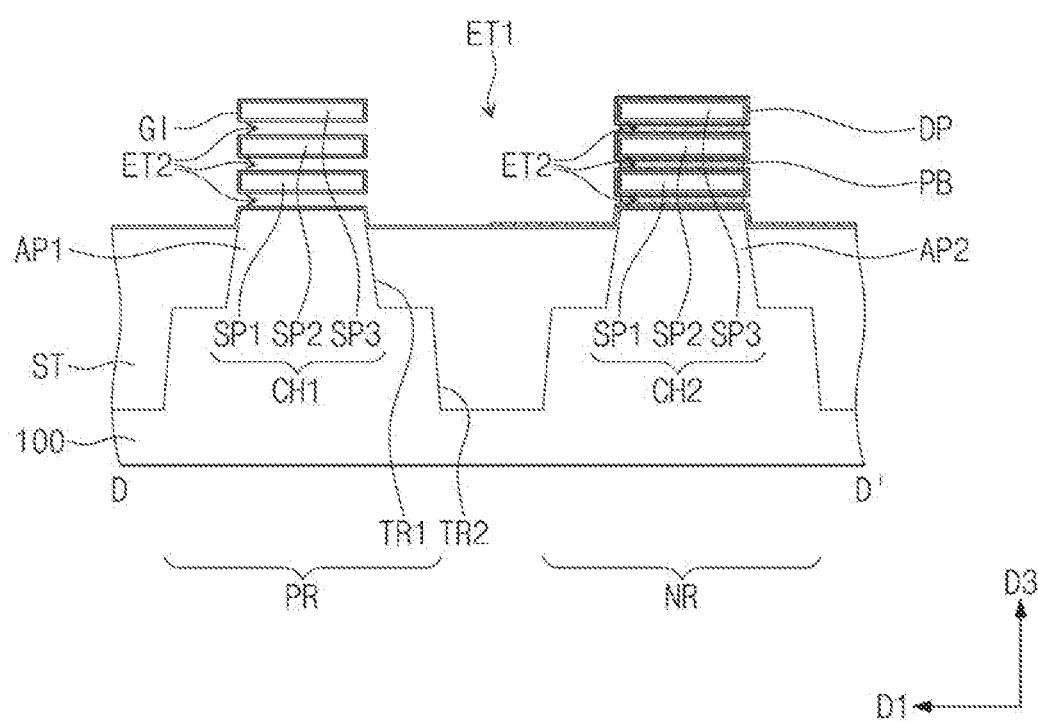

Referring to FIGS. 28A to 28C, the third mask pattern MS3 may be removed, and then, the etch barrier pattern CP may be selectively removed. As a result, the side surfaces of the etch auxiliary patterns PB on the second active region NR may be exposed.

Figure 29A:
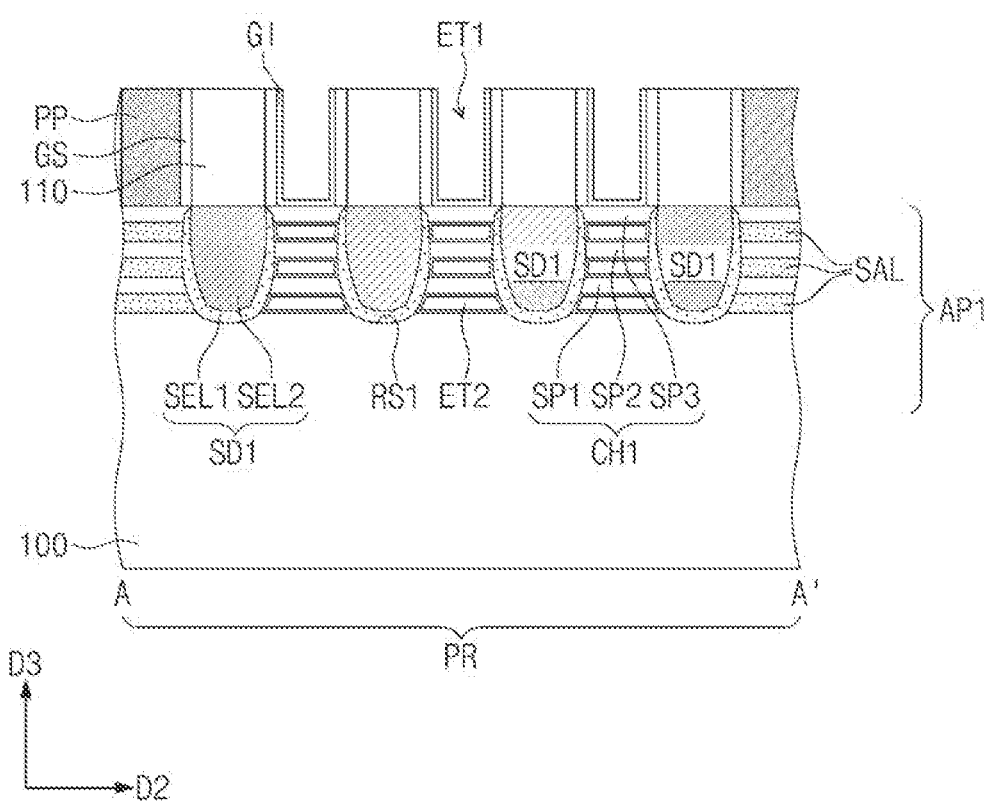
Figure 29B:
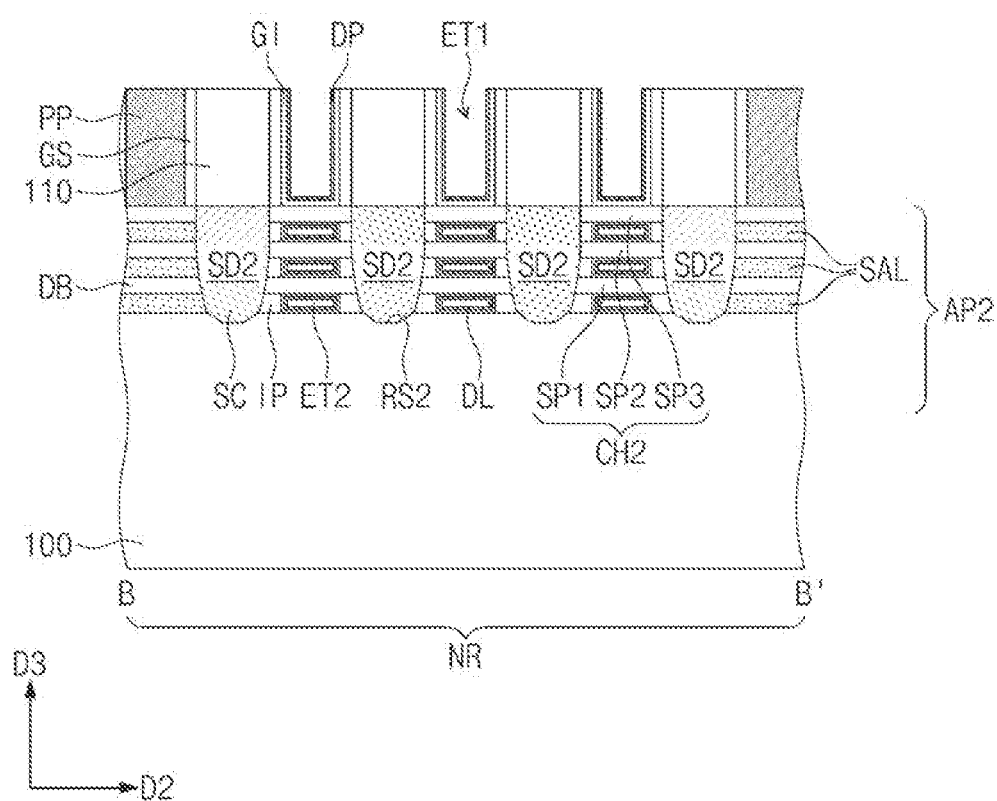
Figure 29C:
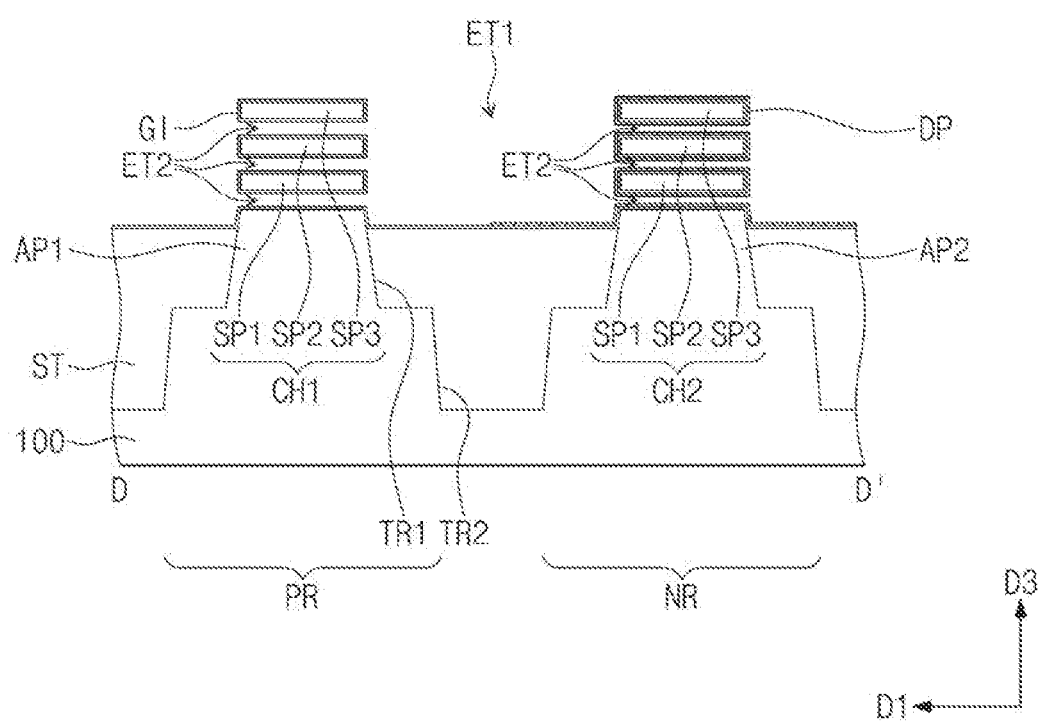

Referring to FIGS. 29A to 29C, the etch auxiliary patterns PB on the second active region NR may be selectively removed. As a result, the adjusting pattern DP on the second active region NR may be exposed.

Thereafter, a thermal treatment process may be performed. As a result of the thermal treatment process, elements of the adjusting pattern DP may be diffused into the gate insulating layer GI or toward the surfaces of the first to third semiconductor patterns SP1, SP2, and SP3. Next, the process described with reference to FIGS. 9A to 21C may be performed.

Figure 30:
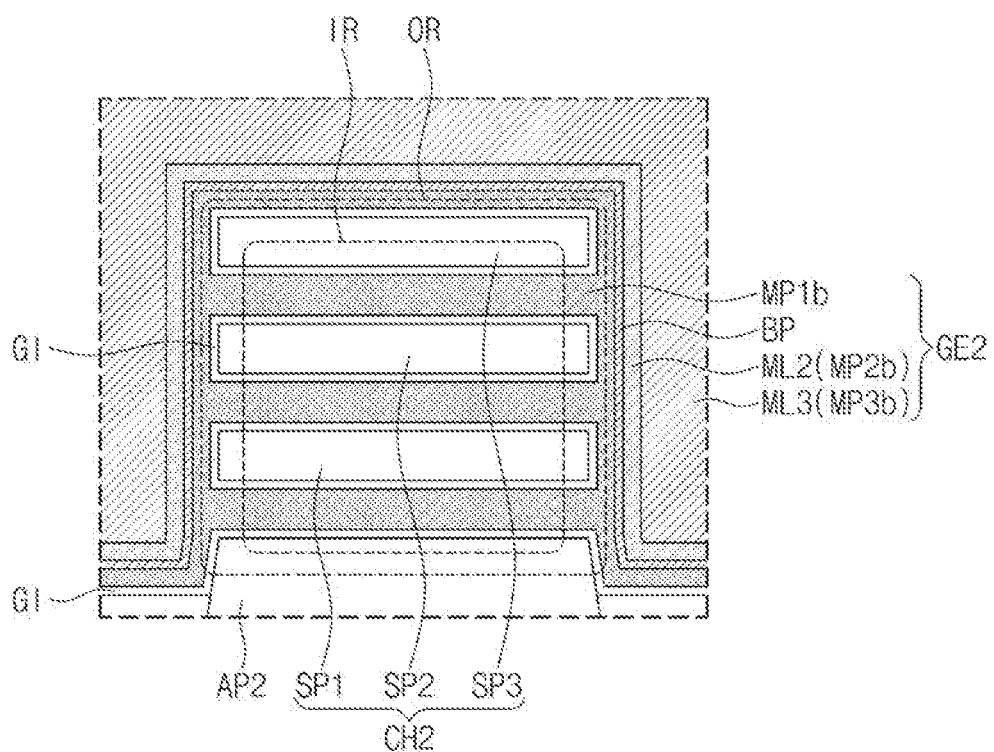
FIG. 30 is an enlarged sectional view of a portion of FIG. 2D.

FIG. 30 is an enlarged sectional view illustrating a portion of the structure of FIG. 2D and, in particular, illustrating a portion of the structure which is formed by performing the process of FIGS. 9A to 21C after the thermal treatment process. The adjusting pattern DP may be fully removed, as shown in FIG. 30, but the elements diffused from the adjusting pattern DP may be left in the gate insulating layer GI or on the surfaces of the first to third semiconductor patterns SP1, SP2, and SP3.

A concentration of the adjusting elements, which are diffused from the adjusting pattern DP, may vary depending on position. This variation may result in a difference in etching method between the etching process performed to form the adjusting pattern DP. In an embodiment, the processes of removing the etch barrier pattern CP (e.g., in FIGS. 28A to 28C) and the etch auxiliary patterns PB (e.g., in FIGS. 29A to 29C) may be performed using different etchant materials from each other, and thus, the concentration of the adjusting element in an inner region IR, which is covered with the etch auxiliary patterns PB, may be different from that in an outer region OR, which is not covered with the etch auxiliary patterns PB. In an embodiment, the inner region IR may have a higher aluminum concentration than the outer region OR. In another embodiment, the outer region OR may have a higher lanthanum concentration than the inner region IR.

According to various embodiments as described herein, a semiconductor device with improved electric characteristics may be provided.

While example embodiments have been particularly shown and described, it will be understood by one of ordinary skill in the art that variations in form and detail may be made therein without departing from the spirit and scope of the attached claims.

What is claimed is:

1. A semiconductor device comprising:
a substrate including a first active region and a second active region, which are adjacent to each other;
a first active pattern and a second active pattern provided on the first active region and the second active region, respectively; and
a gate electrode extended to cross the first active pattern and the second active pattern,
wherein the gate electrode comprises a first electrode portion on the first active region and a second electrode portion on the second active region, the second electrode portion comprises a first metal pattern, an etch barrier pattern, a second metal layer, and a third metal pattern sequentially covering the second active pattern, the first electrode portion comprises the second metal layer covering the first active pattern, the etch barrier pattern is in contact with the first metal pattern and the second metal layer, and the etch barrier pattern is thinner than the first metal pattern and thinner than the second metal layer.

2. The semiconductor device of claim 1, wherein the substrate further comprises a device isolation layer between the first active region and the second active region, and
an end portion of the etch barrier pattern is provided on the device isolation layer.

3. The semiconductor device of claim 1, wherein the second metal layer of the first electrode portion and the second metal layer of the second electrode portion have a same thickness and comprise a same material.

4. The semiconductor device of claim 3, wherein the substrate further comprises a device isolation layer between the first active region and the second active region, and
the second metal layer of the first electrode portion and the second metal layer of the second electrode portion are connected to each other on the device isolation layer.

5. The semiconductor device of claim 1, wherein the etch barrier pattern comprises a material having an etch selectivity with respect to the first metal pattern of the second electrode portion.

6. The semiconductor device of claim 5, wherein the etch barrier pattern comprises at least one of TiAlN, TiAlC, TiN, or TaN.

7. The semiconductor device of claim 1, wherein the substrate further comprises a device isolation layer between the first active region and the second active region,
an end portion of the first metal pattern of the second electrode portion is provided on the device isolation layer, and
the etch barrier pattern covers a side surface of the end portion.

8. The semiconductor device of claim 7, wherein the etch barrier pattern is extended from the end portion to a region on the device isolation layer.

9. The semiconductor device of claim 7, wherein the second active pattern comprises semiconductor patterns sequentially stacked, and
the first metal pattern of the second electrode portion is extended to a region between the semiconductor patterns.

10. The semiconductor device of claim 1, further comprising a gate insulating layer between the second active pattern and the second electrode portion,
wherein the second active pattern comprises semiconductor patterns sequentially stacked,
the first metal pattern of the second electrode portion is provided between the semiconductor patterns, and
the etch barrier pattern is in contact with the gate insulating layer.

11. The semiconductor device of claim 10, wherein the first metal pattern of the second electrode portion comprises a plurality of electrode portions, which are spaced apart from each other with the semiconductor patterns interposed therebetween.

12. The semiconductor device of claim 1, wherein the first electrode portion further comprises a third metal pattern covering the second metal layer, and the second electrode portion further comprises a third metal pattern covering the second metal layer of the second electrode portion.

13. The semiconductor device of claim 1, wherein the third metal pattern of the first electrode portion is connected to the third metal pattern of the second electrode portion.

14. A semiconductor device comprising:
a substrate including a first active region and a second active region, which are adjacent to each other;
a first active pattern and a second active pattern provided on the first active region and the second active region, respectively;
a gate electrode extended to cross the first active pattern and the second active pattern; and
a gate insulating layer provided between the gate electrode and the first active region and between the gate electrode and the second active region,
wherein the gate electrode comprises a first electrode portion on the first active region and a second electrode portion on the second active region,
the second electrode portion comprises a first metal pattern, an etch barrier pattern, and a second metal layer sequentially covering the second active pattern,
the first electrode portion comprises the second metal layer covering the first active pattern,
the etch barrier pattern is in contact with the first metal pattern and the second metal layer, and
the etch barrier pattern is in contact with the gate insulating layer.

15. The semiconductor device of claim 14, wherein the second active pattern comprises semiconductor patterns sequentially stacked, and
the first metal pattern of the second active pattern comprises a plurality of electrode portions, which are spaced apart from each other with the semiconductor patterns interposed therebetween.

16. The semiconductor device of claim 15, wherein the first metal pattern extends to side surfaces of the semiconductor patterns and the first metal pattern is in contact with the gate insulating layer.

17. The semiconductor device of claim 14, wherein the substrate further comprises a device isolation layer between the first active region and the second active region, and
the second metal layer of the first electrode portion and the second metal layer of the second electrode portion are connected to each other on the device isolation layer.

18. The semiconductor device of claim 14, wherein the etch barrier pattern comprises a material having an etch selectivity with respect to the first metal pattern of the second electrode portion.

19. The semiconductor device of claim 18, wherein the etch barrier pattern comprises at least one of TiAlN, TiAlC, TiN, or TaN.

20. A semiconductor device comprising:
a substrate including a first active region and a second active region, which are adjacent to each other in a first direction;
a device isolation layer filling a trench, which is formed to define the first active region and the second active region;
a first active pattern and a second active pattern provided on the first active region and the second active region, respectively;
a first source/drain pattern and a second source/drain pattern provided on the first active pattern and the second active pattern, respectively;
a first channel pattern and a second channel pattern, which are connected to the first source/drain pattern and the second source/drain pattern, respectively, each of the first channel pattern and the second channel pattern comprising a first semiconductor pattern, a second semiconductor pattern, and a third semiconductor pattern stacked to be spaced apart from each other;
a gate electrode extended in the first direction to cross the first channel pattern and the second channel pattern;
a gate insulating layer interposed between the gate electrode and the first channel pattern and between the gate electrode and the second channel pattern;
a gate spacer provided on side surfaces of the gate electrode;
a gate capping pattern provided on a top surface of the gate electrode;
a first interlayer insulating layer on the gate capping pattern;
active contacts, which penetrate the first interlayer insulating layer and are coupled to the first source/drain pattern and the second source/drain pattern, respectively;
a gate contact, which penetrates the first interlayer insulating layer and is coupled to the gate electrode;
a second interlayer insulating layer on the first interlayer insulating layer;
a first metal layer provided in the second interlayer insulating layer, the first metal layer comprising lower interconnection lines, which are electrically connected to the active contacts and the gate contact, respectively;
a third interlayer insulating layer on the second interlayer insulating layer; and
a second metal layer provided in the third interlayer insulating layer,
wherein the second metal layer comprises upper interconnection lines, which are electrically and respectively connected to the lower interconnection lines,
the gate electrode comprises a first electrode portion on the first active region and a second electrode portion on the second active region,
the second electrode portion comprises a first metal pattern, an etch barrier pattern, and a second metal pattern sequentially covering the second active pattern,
the first electrode portion comprises the second metal pattern covering the first active pattern,
the etch barrier pattern is in contact with the first metal pattern and the second metal pattern of the second electrode portion, and
the etch barrier pattern is thinner than the first metal pattern and thinner than the second metal pattern of the second electrode portion.

* * * * *